United States Patent
Yang et al.

(12)

(10) Patent No.: US 12,176,394 B2
(45) Date of Patent: *Dec. 24, 2024

(54) DIFFERENT HEIGHT CELL SUBREGIONS, AND SEMICONDUCTOR DEVICE HAVING THE SAME

(71) Applicant: TAIWAN SEMICONDUCTOR MANUFACTURING COMPANY, LTD., Hsinchu (TW)

(72) Inventors: Jung-Chan Yang, Hsinchu (TW); Hui-Zhong Zhuang, Hsinchu (TW); Lee-Chung Lu, Hsinchu (TW); Ting-Wei Chiang, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/358,694

(22) Filed: Jul. 25, 2023

(65) Prior Publication Data

US 2023/0378267 A1 Nov. 23, 2023

Related U.S. Application Data

(60) Continuation of application No. 17/205,670, filed on Mar. 18, 2021, now Pat. No. 11,756,999, which is a
(Continued)

(51) Int. Cl.
*H01L 29/06* (2006.01)
*G06F 30/392* (2020.01)
(Continued)

(52) U.S. Cl.
CPC ........ *H01L 29/0696* (2013.01); *G06F 30/392* (2020.01); *H01L 21/0337* (2013.01);
(Continued)

(58) Field of Classification Search
CPC ............ H01L 29/0696; H01L 21/0337; H01L 21/823821; H01L 27/0207; H01L 27/0924;
(Continued)

(56) References Cited

U.S. PATENT DOCUMENTS 7,260,442 B2   8/2007   Hwang et al.
8,786,019 B2   7/2014   Wu et al.
(Continued)

FOREIGN PATENT DOCUMENTS

DE   102013022270 A1   8/2015
KR   20150031249 A    3/2015
(Continued)

OTHER PUBLICATIONS

Office Action dated Dec. 12, 2019 from corresponding application No. TW 108120272.
(Continued)

*Primary Examiner* — Victor A Mandala
(74) *Attorney, Agent, or Firm* — Hauptman Ham, LLP

(57) ABSTRACT

A semiconductor device includes: fins configured to include: first active fins having a first conductivity type; and second active fins having a second conductivity type; and at least one gate structure formed over corresponding ones of the fins; and wherein the fins and the at least one gate structure are located in at least one cell region; and each cell region, relative to the second direction, including: a first active region which includes a sequence of three or more consecutive first active fins located in a central portion of the cell region; a second active region which includes one or more second active fins located between the first active region and a first edge of the cell region; and a third active region which includes one or more second active fins located between the first active region and a second edge of the cell region.

20 Claims, 36 Drawing Sheets

Related U.S. Application Data division of application No. 16/204,474, filed on Nov. 29, 2018, now Pat. No. 10,971,586.

(60) Provisional application No. 62/691,600, filed on Jun. 28, 2018.

(51) Int. Cl.
| | |
|---|---|
| *H01L 21/033* | (2006.01) |
| *H01L 21/8238* | (2006.01) |
| *H01L 27/02* | (2006.01) |
| *H01L 27/092* | (2006.01) |
| *H01L 29/66* | (2006.01) |
| *H01L 29/78* | (2006.01) |

(52) U.S. Cl.
CPC .. *H01L 21/823821* (2013.01); *H01L 27/0207* (2013.01); *H01L 27/0924* (2013.01); *H01L 29/66545* (2013.01); *H01L 29/6681* (2013.01); *H01L 29/7851* (2013.01)

(58) Field of Classification Search
CPC .......... H01L 29/66545; H01L 29/6681; H01L 29/7851; H01L 27/11807; H01L 2027/11874; H01L 27/0886; H01L 29/7831; H01L 21/027; H01L 21/823437; H01L 21/82345; H01L 27/0611; H01L 29/4232; G06F 30/392

See application file for complete search history.

(56) References Cited

U.S. PATENT DOCUMENTS

| | | | |
|---|---|---|---|
| 9,256,709 B2 | 2/2016 | Yu et al. | |
| 9,576,978 B2 | 2/2017 | Baek et al. | |
| 10,276,554 B1* | 4/2019 | Chen | ................ H01L 27/11807 |
| 10,720,429 B2* | 7/2020 | Sharma | ............... H01L 27/0207 |
| 10,971,586 B2* | 4/2021 | Yang | ............... H01L 21/823821 |
| 11,756,999 B2* | 9/2023 | Yang | ................... H01L 27/0924 |
| | | | 257/369 |
| 2002/0157063 A1* | 10/2002 | Besson | .................. G06F 30/30 |
| | | | 716/102 |
| 2009/0050975 A1* | 2/2009 | Bryant | ............. H01L 29/66795 |
| | | | 257/E29.345 |
| 2013/0263077 A1 | 10/2013 | Baek et al. | |
| 2013/0292777 A1 | 11/2013 | Liaw | |
| 2014/0040838 A1 | 2/2014 | Liu et al. | |
| 2014/0097493 A1* | 4/2014 | Baek | .................. H01L 27/0207 |
| | | | 257/347 |
| 2014/0239412 A1* | 8/2014 | Yang | .................. H01L 27/0705 |
| | | | 257/401 |
| 2015/0278429 A1 | 10/2015 | Chang | |
| 2016/0027769 A1* | 1/2016 | Baek | .................. H01L 27/0207 |
| | | | 257/369 |
| 2017/0255735 A1* | 9/2017 | Kim | .................... H01L 27/0924 |
| 2017/0317089 A1 | 11/2017 | Chen et al. | |
| 2017/0365522 A1 | 12/2017 | Jeong | |
| 2018/0150592 A1 | 5/2018 | Chang et al. | |
| 2018/0151551 A1* | 5/2018 | Chen | ............. H01L 21/823475 |
| 2018/0182756 A1 | 6/2018 | Lee | |
| 2018/0374858 A1 | 12/2018 | Hsieh | |
| 2019/0164971 A1* | 5/2019 | Liaw | .............. H01L 21/823864 |

FOREIGN PATENT DOCUMENTS

| | | |
|---|---|---|
| KR | 20180061058 A | 6/2018 |
| WO | 2013188416 A1 | 12/2013 |

OTHER PUBLICATIONS

Office Action dated Sep. 21, 2020 from corresponding application No. KR 10-2019-0077208, pp. 1-7.

Office Action dated Jan. 25, 2021 for corresponding case No. DE 102019116893.7 (pp. 1-10).

* cited by examiner

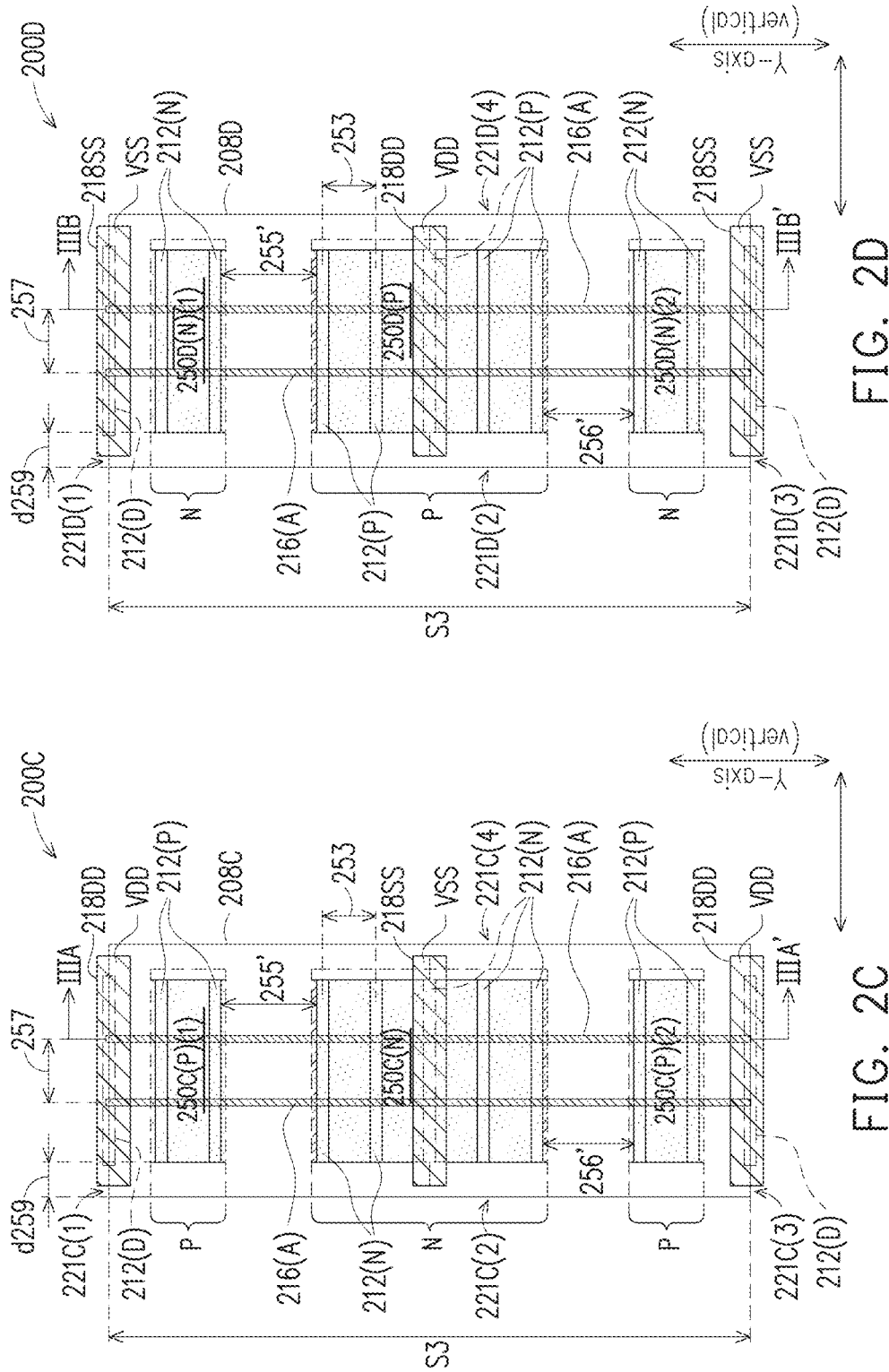

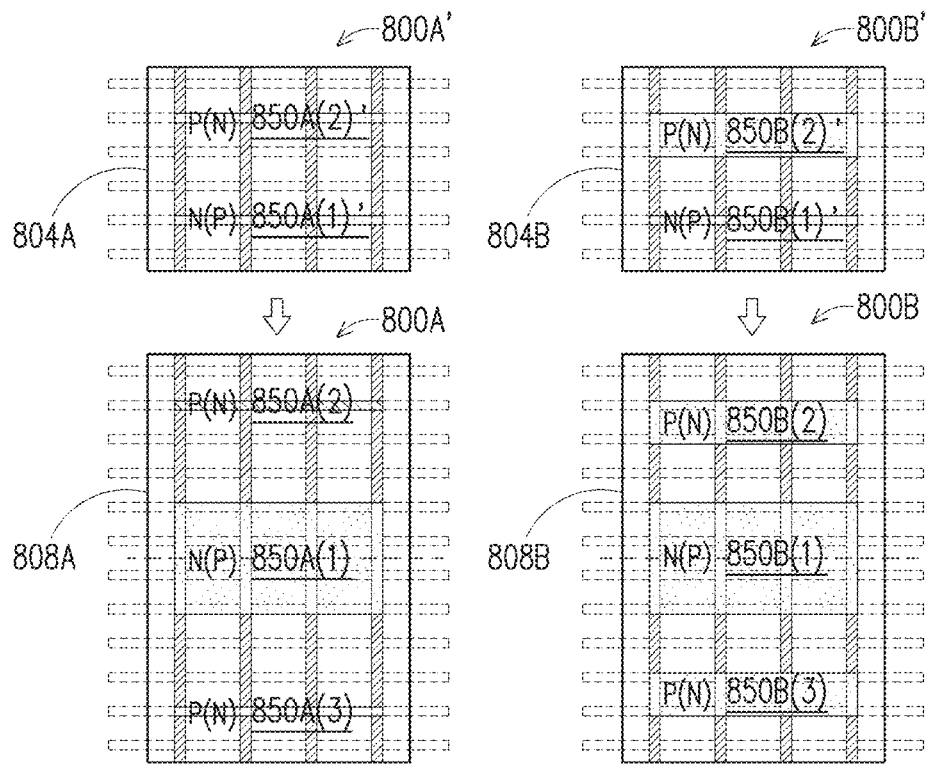
FIG. 8A 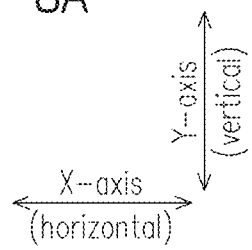 FIG. 8B 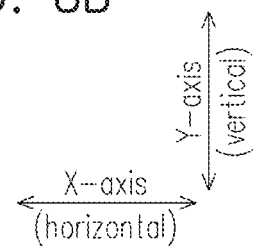

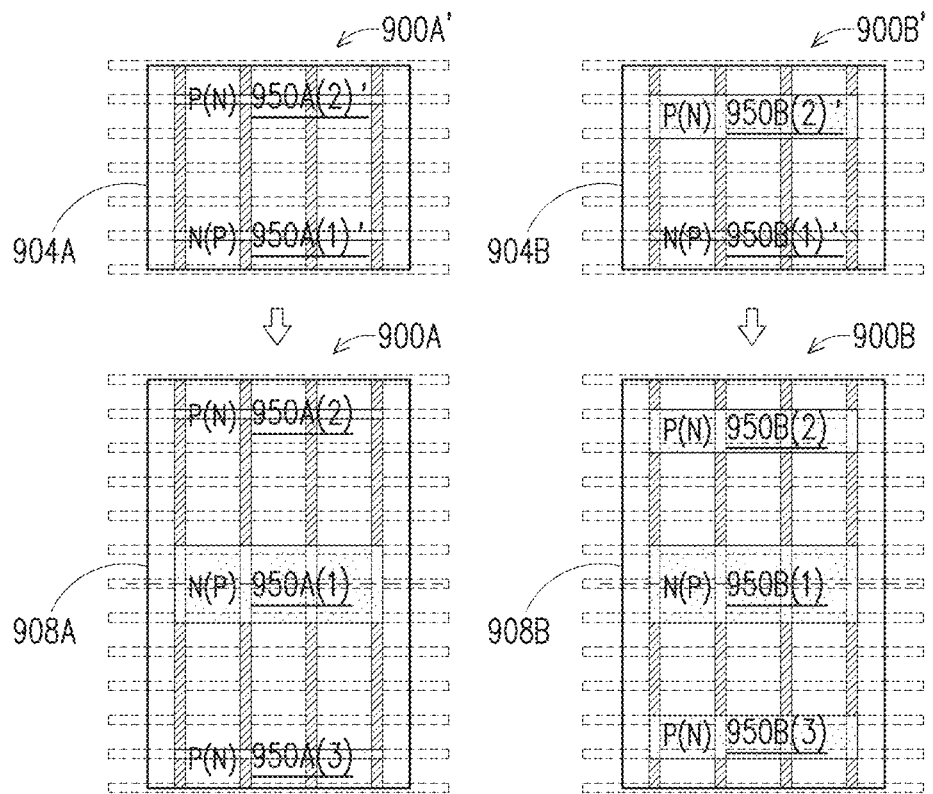
FIG. 9A 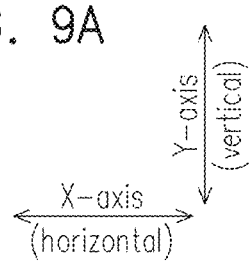   FIG. 9B 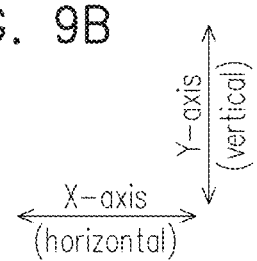

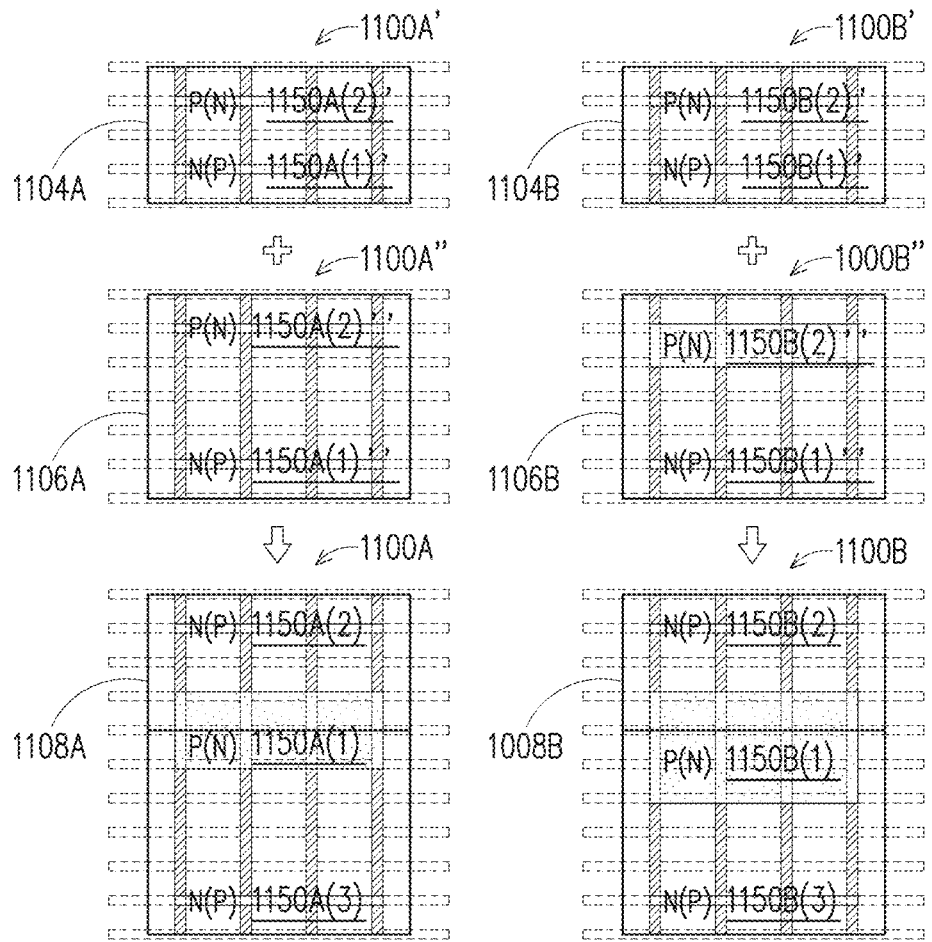

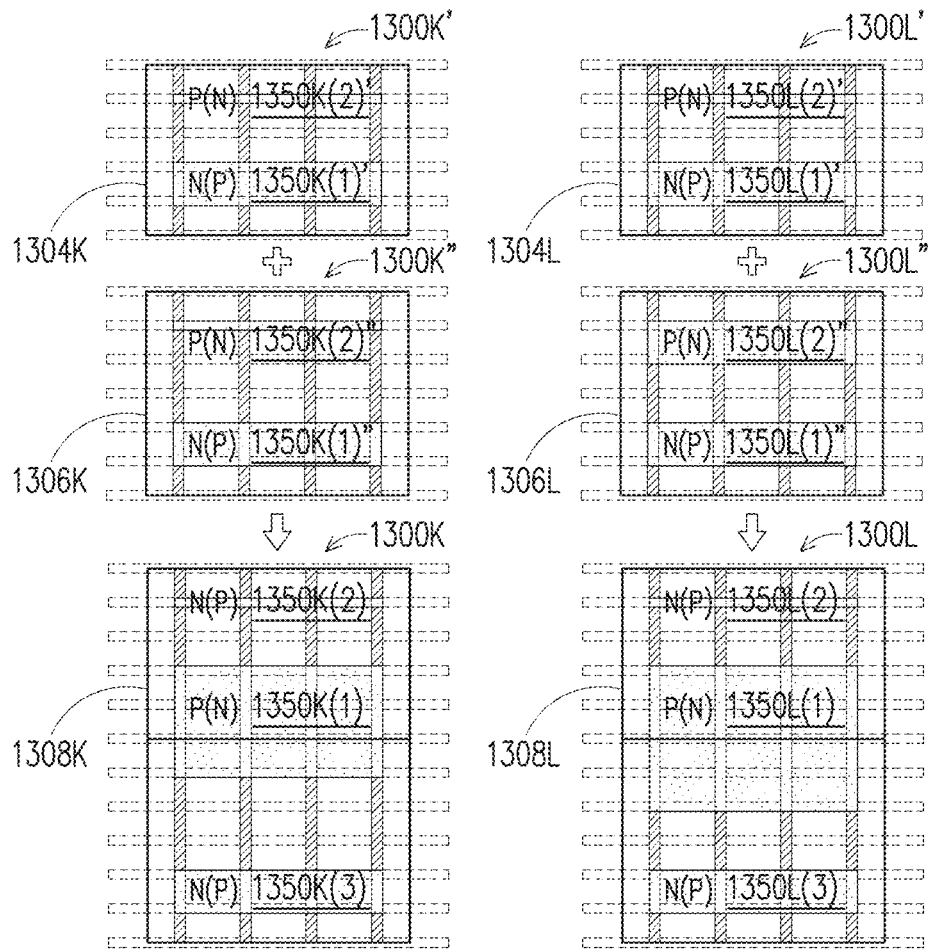
FIG. 13K  FIG. 13L
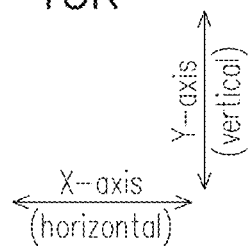 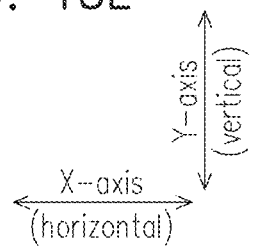

DIFFERENT HEIGHT CELL SUBREGIONS, AND SEMICONDUCTOR DEVICE HAVING THE SAME

PRIORITY CLAIM

This application is a continuation of U.S. application Ser. No. 17/205,670, filed Mar. 18, 2021, now U.S. Pat. No. 11,756,999, issued Sep. 12, 2023, which is a divisional of U.S. application Ser. No. 16/204,474, filed Nov. 29, 2018, now U.S. Pat. No. 10,971,586, issued Apr. 6, 2021, which claims the priority of U.S. Provisional Application No. 62/691,600, filed Jun. 28, 2018, which are incorporated herein by reference in their entireties.

BACKGROUND

A semiconductor device, one or more of which are included in an integrated circuit (IC), includes a number of electronic devices. One way in which to represent a semiconductor device is with a plan view diagram referred to as a layout diagram. A layout diagram is hierarchical and is decomposed into modules which carry out higher-level functions as indicated by the semiconductor device's design specifications.

For a given semi-custom design (SCD) project, a custom cell is designed with an arrangement that is specific to the given SCD project in order to provide (in operation) a higher-level logic function that is specific to the SCD project. By contrast, a library of standard cells is designed with no particular project in mind and includes standard cells which provide (in operation) common, lower-level logic functions. In terms of a footprint within a layout diagram (from the perspective of a plan view), custom cells are larger (typically much larger) than standard cells. Moreover, for a given library, all of the standard cells have at least one dimension which is the same size (typically, the size being a multiple of a library-specific fixed dimension) in order to facilitate placement of the standard cells into a layout diagram. Typically, the direction of the fixed dimension is parallel to the vertical direction or Y-axis such that the fixed dimension is referred to as the height of the standard cell. As such, standard cells are described as being predefined with respect to a given SCD project. Custom cells may or may not have at least one dimension that is the same size as the corresponding dimension of the standard cells.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 2A-2D are corresponding layout diagrams, in accordance with some embodiments.

FIGS. 8A-8D are combination diagrams showing how first layout diagrams relate to corresponding 'building blocks' in the form of corresponding second layout diagrams, in accordance with some embodiments.

FIGS. 9A-9D are combination diagrams showing how first layout diagrams relate to corresponding 'building blocks' in the form of corresponding second layout diagrams, in accordance with some embodiments.

FIGS. 13A-13L are combination diagrams showing how first layout diagrams relate to corresponding 'building blocks' in the form of corresponding second layout diagrams, in accordance with some embodiments.

DETAILED DESCRIPTION

Figure 1:
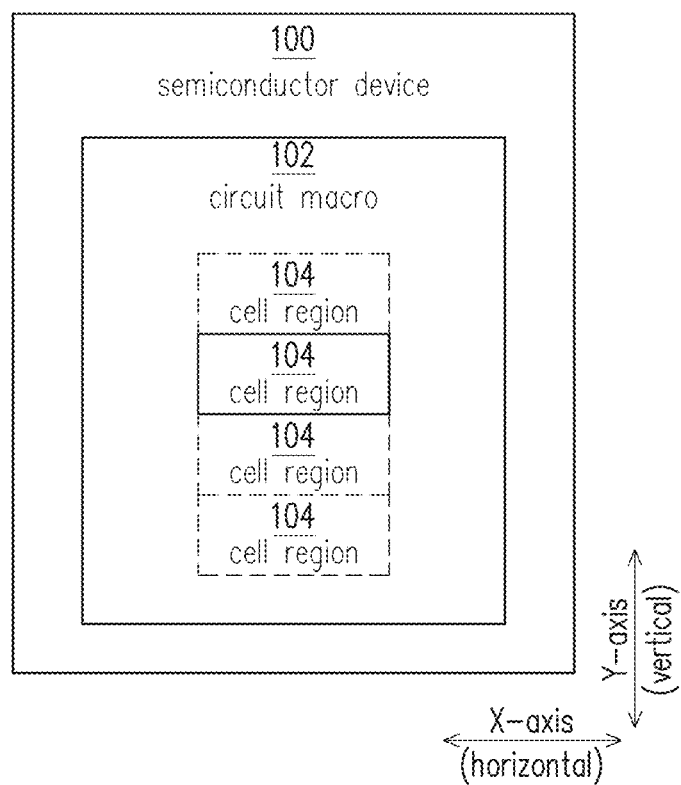
FIG. 1 is a block diagram of a semiconductor device, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein in phrases such as "substantially parallel," "substantially the same," "substantially twice as," "substantially collinear," or the like, the adverb "substantially" should be understood as broadening the phrase of which "substantially" is a part so that the phrase denotes a scope which is inclusive of variations which result from manufacturing process-tolerances, e.g., the phrase "substantially parallel" includes not only parallel per se but also variances from parallel which result from manufacturing process-tolerances. Similarly, the phrase "substantially different" should be understood as describing differences which are greater in magnitude, at the least, than mere variations which result from manufacturing process-tolerances. In some embodiments, the term "standard cell structure" refers to a standardized building block included in a library of various standard cell structures. In some embodiments, various standard cell structures are selected from a library thereof and are used as components in a layout diagram representing a circuit.

In some embodiments, in at least one double height cell region, a semiconductor device includes fins and at least one overlying gate structure. The fins (dummy and active) are substantially parallel to a first direction. Each gate structure is substantially parallel to a second direction (which is substantially perpendicular to the first direction). First and second active fins have corresponding first and second conductivity types. Each double height cell region, relative to the second direction, includes: a first active region which includes a sequence of three or more consecutive first active fins located in a central portion of the double height cell region; a second active region which includes one or more second active fins located between the first active region and a first edge of the double height cell region; and a third active region which includes one or more second active fins located between the first active region and a second edge of the double height cell region. As compared to a stack of two corresponding first and second single height cell regions, one or more of the first active fins in the sequence of three or more consecutive first active fins in the first active region of the double height cell region represent bonus fins. By contrast, relative to the second direction, the stack of the first and second single height cell regions is separated by at least one dummy fin; each of the single height cell regions includes at least one active fin having the first conductivity type; neither, however, of the first and second single height cell regions would include a sequence of three or more consecutive first active fins; and a sum of active fins in the first and second single height cell regions would equal a difference between a sum of the active fins in the first active region minus a subtotal of the at least one bonus active fin in the first active region of the double height cell region.

FIG. 1 is a block diagram of a semiconductor device 100, in accordance with some embodiments.

In FIG. 1, semiconductor device 100 includes, among other things, a circuit macro (hereinafter, macro) 102. In some embodiments, macro 102 is an SRAM macro. In some embodiments, macro 102 is a macro other than an SRAM macro. Macro 102 includes, among other things, one or more double height cell regions 104. In some embodiments, each cell region 104 is implemented based on a corresponding one or more of the cells shown in FIGS. 2A-2D, 6, 7A-7D, 8A-8C, 9A-9D, 10A-10C, 11A-11D, 12A-12C and 13A-13L, discussed below. In some embodiments, some or all of the instances of cell region 104 are different such that the various instances of cell region 104 are based on corresponding various ones of the cells shown in FIGS. 2A-2D, 6, 7A-7D, 8A-8C, 9A-9D, 10A-10C, 11A-11D, 12A-12C and 13A-13L, (again) discussed below.

Figures 2A, 2B:
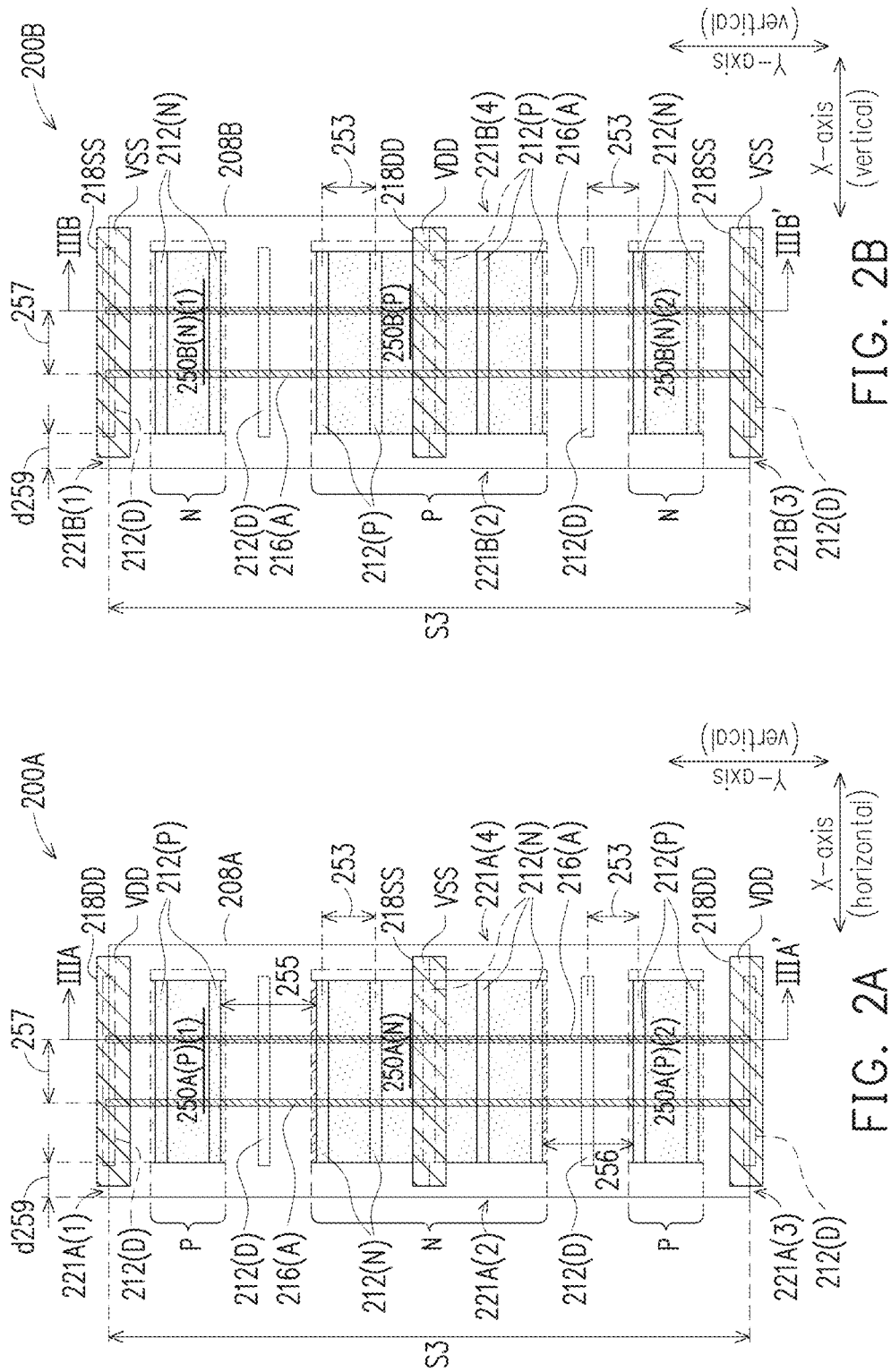

FIG. 2A is a layout diagram 200A, in accordance with some embodiments.

Layout diagram 200A includes a cell 208A. In some embodiments, cell 208A is used as a standard cell in a library comprised of standard cells. An example of a semiconductor device resulting from a layout diagram which includes cell 208A, e.g., layout diagram 200A, is semiconductor device 100 of FIG. 1, wherein cell region 104 of semiconductor device 100 results from cell 208A. Cell 208A is summarized in row 1 of the table appearing below.

Cell 208A is designated for finFET technology, and includes fin patterns which extend substantially parallel to a first direction. For reference purposes, there is a second direction which is substantially perpendicular to the first direction. In FIG. 2A, the first and second directions are correspondingly the horizontal and vertical directions. In some embodiments, the first and second directions are directions other than the corresponding horizontal and vertical directions. The fin patterns include dummy fin patterns 212(D), active fin patterns 212(N) which are designated for NMOS technology, and active fin patterns 212(P) which are designated for PMOS technology.

In FIG. 2A, cell 208A is rectangular, with a long axis substantially parallel to the horizontal direction, and a short axis substantially parallel to the vertical direction. Cell 208A includes a first edge 221A(1), a second edge 221A(2), a third edge 221A(3) and a fourth edge 221A(4). Each of first edge 221A(1) and third edge 221A(3) is substantially parallel to the horizontal direction. Each of second edge 221A(2) and fourth edge 221A(4) is substantially parallel to the vertical direction.

Fins (see corresponding FIG. 3A, discussed below) resulting from instances of active fin patterns 212(N) of FIGS. 2A-2B will be configured for NMOS technology. Fins (see corresponding FIG. 3A, discussed below) resulting from instances of active fin pattern 212(P) of FIGS. 2A-2B will be configured for PMOS technology. In some embodiments, fins resulting from instances of dummy fin pattern 212(D) of FIG. 2 are not included as functional components in semiconductor devices. Accordingly, in some embodiments, fins resulting from instances of dummy fin pattern 212(D) are not configured for either NMOS or PMOS technology. In some embodiments, fins resulting from instances of dummy fin pattern 212(D) are not doped for a particular conductivity. In some embodiments, dummy fin patterns 212(D) are included/located so as to provide isolation, e.g., between an instance of active fin pattern 212(N) and active fin pattern 212(P). Because the potential 'active status' of dummy fin pattern 212(D) is sacrificed, hence dummy fin pattern 212(D) is sometimes referred to as a sacrificial fin pattern. Additional details regarding the structure and manufacture of CMOS finFET technology are disclosed in commonly assigned U.S. Pat. No. 8,786,019, granted Jul. 22, 2014, the entirety of which is hereby incorporated by reference.

In FIG. 2A, relative to the vertical direction, the immediately adjacent fins are evenly spaced apart according to a first grid (the latter not shown). A pitch 253 of such fin patterns (hereinafter, 'fin pitch 253') is determined according to layout design rules and the process/technology node by which will be fabricated a semiconductor device corresponding to a layout diagram which includes cell 208A. Each of fin patterns 212(D), 212(N) and 212(P) is rectangular, with a long axis substantially parallel to the horizontal direction, and a short axis substantially parallel to the vertical direction. For each of fin patterns 212(D), 212(N) and 212(P), a size of the short axis (or 'width'), width_fin, also is determined according to layout design rules and the process/technology node by which will be fabricated a semiconductor device corresponding to a layout diagram which includes cell 208A.

Cell 208A is organized into a first active region 250A(N), a second active region 250A(P)(1) and a third active region 250A(P)(2). Relative to the vertical direction, first active region 250A(N) is located in a central portion of cell 208A. Relative to the vertical direction, second active region 250A(P)(1) is located between first active region 250A(N) and a first edge 221A(1) of cell 208A. Relative to the vertical direction, second active region 250A(P)(2) is located between first active region 250A(N) and a third edge 221A(3) of cell 208A.

First active region 250A(N) includes a sequence of three or more consecutive active fins 212(N). In FIG. 2A, first active region 250A(N) includes 5 instances of active fin 212(N). Second active region 250A(P)(1) includes one or more active fins 212(P). In FIG. 2A, second active region 250A(P)(1) includes 2 instances of active fin 212(P). Third active region 250A(P)(2) includes one or more active fins 212(P). In FIG. 2A, third active region 250A(P)(2) includes 2 instances of active fin 212(P). Other numbers of active fins are contemplated for each of first active region 250A(N), second active region 250A(P)(1) and third active region 250A(P)(2), e.g., in light of the various numbers of active fins shown in FIGS. 6, 7A-7D, 8A-8D, 9A-9D, 10A-10C, 11A-11D, 12A-12C and 13A-13 13L discussed below, and the like.

Regarding cell 208A, as compared to a stack (in the vertical direction) of two corresponding single height cells, e.g., the stack of single height cells 442D(1) and 442D(2) in FIG. 4A (discussed below), the sequence of five active fins 212(N) in first active region 250A(N) of double height cell 208A includes one bonus fin. By contrast, relative to the vertical direction, the stack of single height cells 442D(1) and 442D(2) is separated by a dummy fin 412(D); single height cells 442D(1) and 442D(2) each include two active fins 212(N) in corresponding active regions 444A(N)(1) and 444A(N)(2); neither, however, of active regions 444A(N)(1) and 444A(N)(2) includes a sequence of three or more consecutive active fins 212(N); and the sum of active fins 412(N) in active regions 444A(N)(1) and 444A(N)(2) is 4, which is equal a difference between a sum (namely five) of active fins 212(N) in first active region 250A(N) minus the number (namely one) of bonus active fins 212(N) in first active region 250A(N).

In FIG. 2A, cell 208A includes four instances of dummy fin pattern 212(D). Relative to the vertical direction, one instance of dummy fin pattern 212(D) is located in a first gap between first active region 250A(N) and second active region 250A(P)(1), where the first gap has a size 255. Relative to the vertical direction, one instance of dummy fin pattern 212(D) is located in a second gap between first active region 250A(N) and third active region 250A(P)(2), where the second gap has a size 256. A first 'boundary' instance of dummy fin pattern 212(D) is substantially collinear with first edge 221A(1) of cell 208A such that cell 208A includes substantially one-half of the first boundary instance of dummy fin pattern 212(D). A second boundary instance of dummy fin pattern 212(D) is substantially collinear with third edge 221A(3) of cell 208A such that cell 208A includes substantially one-half of the second boundary instance of dummy fin pattern 212(D).

Relative to the vertical direction, the size 255 of the first gap is 255=d1*pitch_253−width_fin, where d1 is a positive integer representing the count of dummy fin patterns 212(D) located in the first gap. In cell 208A, d1=1 such that 255=pitch_253−width_fin. Relative to the vertical direction, the size 256 of the second gap is 256=d2*pitch_253−width_fin, where d2 is a positive integer representing the count of dummy fin patterns 212(D) located in the second gap. In cell 208A, d2=1 such that 256=pitch_253−width_fin.

Regarding cell 208A, relative to the vertical direction, a size S3 of the long axis (or 'height') of cell 208A is S3=(D+P+N)*pitch_253, where each of D, N and P is a non-negative integer, D represents the count of dummy fin patterns 212(D) included in cell 208A, N is the count of active fin patterns 212(N) included in cell 208A, P is the count of active fin patterns 212(P) included in cell 208A, and pitch_253 is a variable representing fin pitch 253. In cell 208A, N=5, P=4 and D=3. It is noted that D=3 because there are two whole instances and two half-instances of dummy fin pattern 212(D) in cell 208A such that D=3=2+2*(½). Accordingly, for cell 208, S3=12*pitch_253.

In FIG. 2A, cell 208A further includes gate patterns, at least one on which is an active gate pattern 216(A), which extend substantially parallel to the second direction according to a second grid (the latter not shown). There can also be dummy gate patterns (not shown in FIG. 2A, but see, e.g., FIGS. 4A-4B, discussed below). While cell 208A includes instances of active gate pattern 216(A), cell 208A does not include instances of a dummy gate pattern. The gate patterns, e.g., active gate patterns 216(A), are located over corresponding ones of fin patterns 212(D), 212(N) and 212(P).

Relative to the horizontal direction, immediately adjacent instances of the gate patterns are evenly spaced apart according to a second grid (the latter not shown). A pitch 257 of such gate patterns (hereinafter, 'gate pitch 257') is determined according to layout design rules and the process/technology node by which will be fabricated a semiconductor device corresponding to a layout diagram which includes cell 208A. For each of fin patterns 212(D), 212(N) and 212(P), a size of the long axis (or 'length'), length_fin, is an integer multiple of gate pitch 257. In particular, length_fin=j*pitch_257, where j is a positive integer, and pitch_257 is a variable representing gate pitch 257. In FIG. 2A, j=3 such that length_fin=3*pitch_257.

In FIG. 2A, relative to the horizontal direction, corresponding instances of active gate pattern 216(A) intersect the fin patterns at location_1≈⅓*length_fin and at location_2≈⅔*length_fin. In some embodiments, instances of active gate pattern 216(A) intersect the fin patterns at locations other than location_1 and location_2.

Regarding cell 208A, relative to the horizontal direction, second edge 221A(2) and fourth edge 221A(4) of cell 208A extend beyond corresponding ends of the fin patterns by a distance d259. In FIG. 2A, distance d259 has a value d259=(pitch_257)/2. In some embodiments, distance d259 has a value other than d259=(pitch_257)/2. A size width_cell of the short axis of cell 208A is width_cell=k+j*pitch_257, where j and k are positive integers. In FIG. 2A, j=3 (as noted above) and k=1 such that width_cell=4*pitch_462. In some embodiments, j is a positive integer other than j=3. In some embodiments, k is a positive integer other than k=1.

Each of gate patterns 216(A) is rectangular, with a long axis substantially parallel to the vertical direction, and a short axis substantially parallel to the horizontal direction. For each of gate patterns 216(A), a size of the short axis (or 'width'), width_gate, also is determined according to layout design rules and the process/technology node by which will be fabricated a semiconductor device corresponding to a layout diagram which includes cell 208A.

Layout diagram 200A of FIG. 2A further includes power grid segment patterns (PG patterns) 218DD and a PG pattern 218SS. Each instance of PG segment 218DD is designated for a voltage VDD. Each instance of PG segment 218DD is designated for a voltage VSS. In some embodiments, each instance of PG segment 218DD and each instance of PG segment 218DD are designated for voltages other than the corresponding voltages VDD and VSS. Each of PG patterns 218SS and 218DD is rectangular, with a long axis substantially parallel to the horizontal direction, and a short axis substantially parallel to the vertical direction. For each of PG patterns fin patterns 218DD and 218SS, a size of the short axis (or 'width'), width_PG, also is determined according to layout design rules and the process/technology node by which will be fabricated a semiconductor device corresponding to a layout diagram which includes cell 208A.

In layout diagram 200A, there is one instance of PG pattern 218SS which is located over, and substantially collinearly with respect to, a midline of first active region 250A(N), where the midline of first active region 250A(N) is substantially parallel to the horizontal direction. Also in layout diagram 200A, there are instances of PG pattern 218DD which are located correspondingly over, and substantially collinearly with respect to, first edge 221A(1) and third edge 221A(3).

FIG. 2B is a layout diagram 200B, in accordance with some embodiments.

Layout diagram 200B includes a cell 208B. Cell 208B of FIG. 2B is similar to cell 208A of FIG. 2A. More generally, layout diagram 200B FIG. 2B is similar to layout diagram 200A of FIG. 2A. For brevity, the discussion of cell 208B will focus on differences of cell 208B with respect to cell 208A. In some embodiments, cell 208B is used as a standard cell in a library comprised of standard cells. An example of a semiconductor device resulting from a layout diagram which includes cell 208B, e.g., layout diagram 200B, is semiconductor device 100 of FIG. 1, wherein cell region 104 of semiconductor device 100 results from cell 208B. Cell 208A is summarized in row 2 of the table appearing below.

Cell 208B is organized into a first active region 250B(P), a second active region 250B(N)(1) and a third active region 250B(N)(2). First active region 250B(P) includes a sequence of three or more consecutive active fins 212(P). Relative to the vertical direction, first active region 250B(P) is located in a central portion of cell 208B. In particular, first active region 250B(P) includes 5 instances of active fin 212(P). Second active region 250B(N)(1) includes one or more active fins 212(N). Relative to the vertical direction, second active region 250B(N)(1) is located between first active region 250B(P) and a first edge 221B(1) of cell 208B. In particular, second active region 250B(N)(1) includes 2 instances of active fin 212(N). Third active region 250B(N)(2) includes one or more active fins 212(N). Relative to the vertical direction, second active region 250B(N)(2) is located between first active region 250B(P) and a third edge 221B(3) of cell 208B. In particular, third active region 250B(P)(2) includes 2 instances of active fin 212(N).

In cell 208B, relative to the vertical direction, one instance of dummy fin pattern 212(D) is located in a first gap between first active region 250B(P) and second active region 250B(N)(1), where the first gap has the size 255. Also, relative to the vertical direction, one instance of dummy fin pattern 212(D) is located in a second gap between first active region 250B(P) and third active region 250B(N)(2), where the second gap has the size 256.

Layout diagram 200B of FIG. 2B further includes PG patterns 218DD and 218SS. In layout diagram 200B, there is one instance of PG pattern 218DD which is located over, and substantially collinearly with respect to, a midline of first active region 250B(P), where the midline of first active region 250B(P) is substantially parallel to the horizontal direction. Also in layout diagram 200B, there are instances of PG pattern 218SS which are located correspondingly over, and substantially collinearly with respect to, first edge 221B(1) and third edge 221B(3).

FIG. 2C is a layout diagram 200C, in accordance with some embodiments.

Layout diagram 200C includes a cell 208C. Cell 208C of FIG. 2C is similar to cell 208A of FIG. 2A. More generally, layout diagram 200C FIG. 2C is similar to layout diagram 200A of FIG. 2A. For brevity, the discussion of cell 200C will focus on differences of cell 208C with respect to cell 208A. In some embodiments, cell 208C is used as a standard cell in a library comprised of standard cells. An example of a semiconductor device resulting from a layout diagram which includes cell 200C, e.g., layout diagram 200C, is semiconductor device 100 of FIG. 1, wherein cell region 104 of semiconductor device 100 results from cell 208C. Cell 208C is summarized in row 3 of the table appearing below.

In cell 208C, relative to the vertical direction, no instance of dummy fin pattern 212(D) is located in a first gap between first active region 250C(N) and second active region 250C(P)(1), where the first gap has a size 255'. Relative to the vertical direction, and in contrast to cell 200A of FIG. 2A, the size 255' of the first gap is not an integer multiple of the fin width (again, width_fin), e.g., 255'≠d1*pitch_253−width_fin, where d1 (as discussed above) is a positive integer representing the count of dummy fin patterns 212(D) otherwise located in the first gap. Also, relative to the vertical direction, no instance of dummy fin pattern 212(D) is located in a second gap between first active region 250C(N) and third active region 250C(P)(2), where the second gap has a size 256'. Relative to the vertical direction, and in contrast to cell 200A of FIG. 2A, the size 256' of the second gap is not an integer multiple of the fin width, e.g., 256'≠d1*pitch_253−width_fin, where d2 is a positive integer representing the count of dummy fin patterns 212(D) otherwise located in the second gap. In some embodiments, fin patterns 212(D), 212(N) and 212(P) are arranged according to the first grid as in FIG. 2A, and instances of dummy fin pattern 212(D) also are designated for removal during fabrication of a semiconductor device. In some embodiments, instances of dummy fin pattern 212(D) are designated for removal by being covered/overlaid in layout diagram 200C with corresponding cut-patterns (not shown). A cut-pattern corresponding to a fin pattern indicates that any portion of the fin-pattern underlying the cut-pattern will be removed during fabrication.

Regarding layout 200C, in some embodiments, fin patterns 212(D), 212(N) and 212(P) are not formed according to a grid but instead are formed using mandrel techniques, with an advantageous result that no instance of dummy fin pattern 212(D) are formed in the first gap nor in the second gap, thereby eliminating the need later to remove instances of dummy fin pattern 212(D). As compared to formation according to a grid, the mandrel techniques have another advantage of increased flexibility in determining sizes 255' and 256'. Additional details regarding mandrel techniques are disclosed in commonly assigned U.S. patent application Ser. No. 15/362,002, filed Nov. 28, 2016, having Pre-Grant Publication No. 20170317089, the entirety of which is hereby incorporated by reference.

FIG. 2D is a layout diagram 200D, in accordance with some embodiments.

Layout diagram 200D includes a cell 208D. Cell 208D of FIG. 2D is similar to cell 208B of FIG. 2B. More generally, layout diagram 200D FIG. 2D is similar to layout diagram 200B of FIG. 2B. Furthermore, cell 208D of FIG. 2D is similar to cell 208C of FIG. 2C. More generally, layout diagram 200D FIG. 2D is similar to layout diagram 200C of FIG. 2C. For brevity, the discussion of cell 200D will focus on differences of cell 208D with respect to each of cell 208B and cell 208C. In some embodiments, cell 208D is used as a standard cell in a library comprised of standard cells. An example of a semiconductor device resulting from a layout diagram which includes cell 200D, e.g., layout diagram 200D, is semiconductor device 100 of FIG. 1, wherein cell region 104 of semiconductor device 100 results from cell 208D. Cell 208D is summarized in row 4 of the table appearing below.

More specifically, in terms of active regions and active fin patterns, active regions 250D(P), 250D(N)(1) and 250D(N)(2) and associated instances of fin patterns 212(P) and 212(N) of cell 208D of FIG. 2D are similar to corresponding active regions 250B(P), 250B(N)(1) and 250B(N)(2) and associated instances of fin patterns 212(P) and 212(N) of cell 208B of FIG. 2B. In terms of dummy fin patterns, dummy fin patterns 212(D) of cell 208D are similar to corresponding dummy fin patterns 212(D) of cell 208C of FIG. 2C. In cell 208D, relative to the vertical direction, no instance of dummy fin pattern 212(D) is located in a first gap between first active region 250D(P) and second active region 250D(N)(1), where the first gap has the size 255' of FIG. 2C. Also, relative to the vertical direction, no instance of dummy fin pattern 212(D) is located in a second gap between first active region 250C(N) and third active region 250C(P)(2), where the second gap has the size 256'.

Figure 3A:
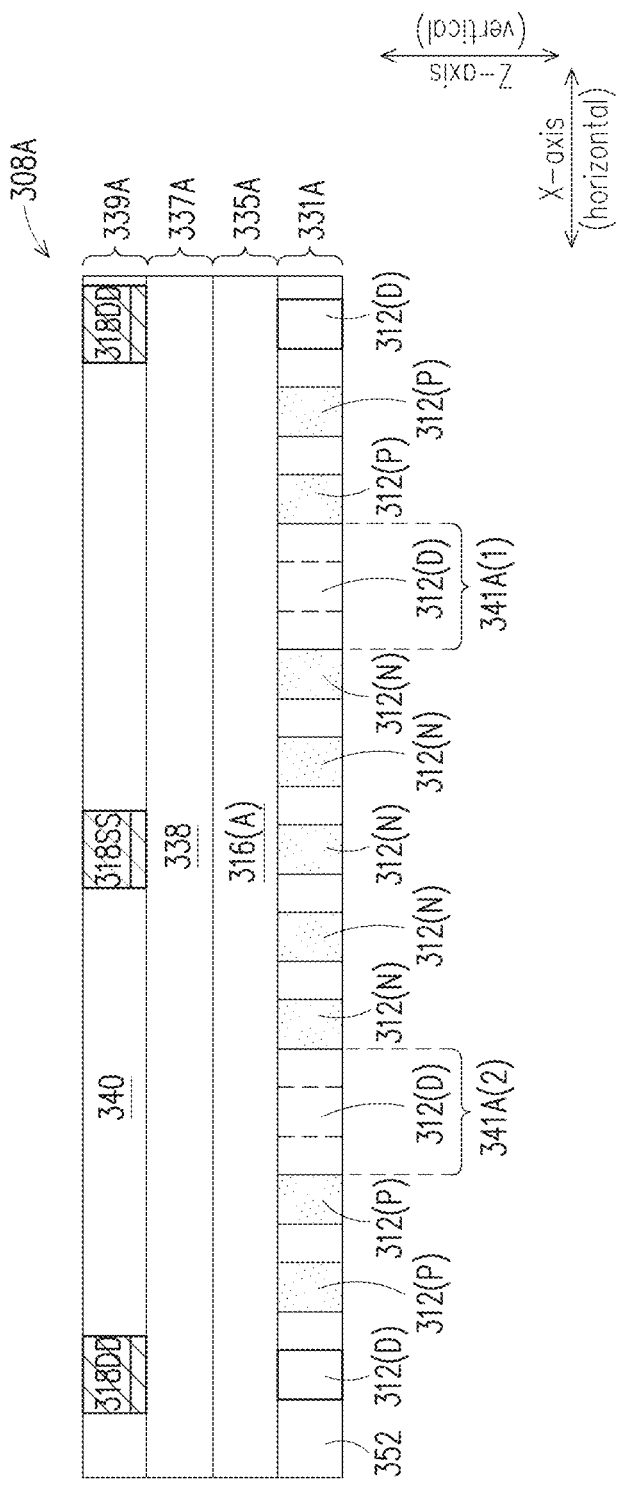
FIGS. 3A-3B are corresponding cross-sections of a cell region of a semiconductor device, in accordance with some embodiments.

FIG. 3A is a cross-section of a cell region 308A of a semiconductor device, in accordance with some embodiments.

Cell region 308A is an example of a cell region of a semiconductor device which is fabricated based on a layout diagram such as the layout diagrams of FIGS. 2A and 2B, and (as discussed below) FIGS. 4A-4B, 5A-5B and 9D. As such, cell region 308A is an example of cell region 104 of semiconductor device 100 of FIG. 1. In light of differences between FIGS. 2A-2B, 4A-4B, 5A-5B and 9D with respect (as discussed below) to FIGS. 6, 7A-7D, 8A-8D, 9A-9C, 10A-10C, 11A-11D, 12A-12C and 13A-13L, cell region 308A is similar to examples of a cell region of a semiconductor device which is fabricated based on a layout diagram such as the layout diagrams of FIGS. 6, 7A-7D, 8A-8D, 9A-9C, 10A-10C, 11A-11D, 12A-12C and 13A-13L.

Semiconductor device 308A includes layers 331A, 335A, 337A and 339A. Layer 335A is formed on layer 331A. Layer 337A is formed on layer 335A. Layer 339A is formed on layer 337A. Layer 331A corresponds to layer M(i) of metallization, layer 335A corresponds to layer M(i+1) of metallization, and layer 339A corresponds to layer M(i+1) of metallization, where i is an integer and i≥0. In some embodiments, the $i^{th}$ layer is the first layer of metallization, in which case i=0 or i=1 depending upon the numbering convention of the corresponding design rules.

Layer 331A includes: lines 312D, 312P and 312N corresponding to fin patterns 212(D), 212(P) and 212(N) of FIG. 2A; and an interlayer dielectric (ILD) 352. Instances of line 312(D) in gaps 341A(1) and 341A(2) are optional and accordingly have been shown in phantom lines. When instances of line 312(D) in gaps 341A(1) and 341A(2) are present, cell region 308A of FIG. 3A corresponds to cell 208A of layout diagram 200A of FIG. 2A. When instances of line 312(D) in gaps 341A(1) and 341A(2) are not present, cell region 308A of FIG. 3A corresponds to cell 208B of layout diagram 200B of FIG. 2B.

Layer 335A includes a line 316(A) corresponding to gate pattern 216(A) of FIG. 2A. In some embodiments, line 316(A) is formed in direct contact with corresponding lines 312D, 312P and 312N corresponding to fin patterns 212(D), 212(P) and 212(N). In some embodiments, vias (not shown) are provided between line 316(A) is formed in direct contact with corresponding lines 312D, 312P and 312N, the vias being located in an interconnect layer (not shown) inserted between layers 331A and 335A. Layer 337A includes an ILD 338. Layer 339A includes PG segments 318DD and 318SS corresponding to PG patterns 218DD and 218SS of FIG. 2A; and an ILD 340.

Figure 3B:
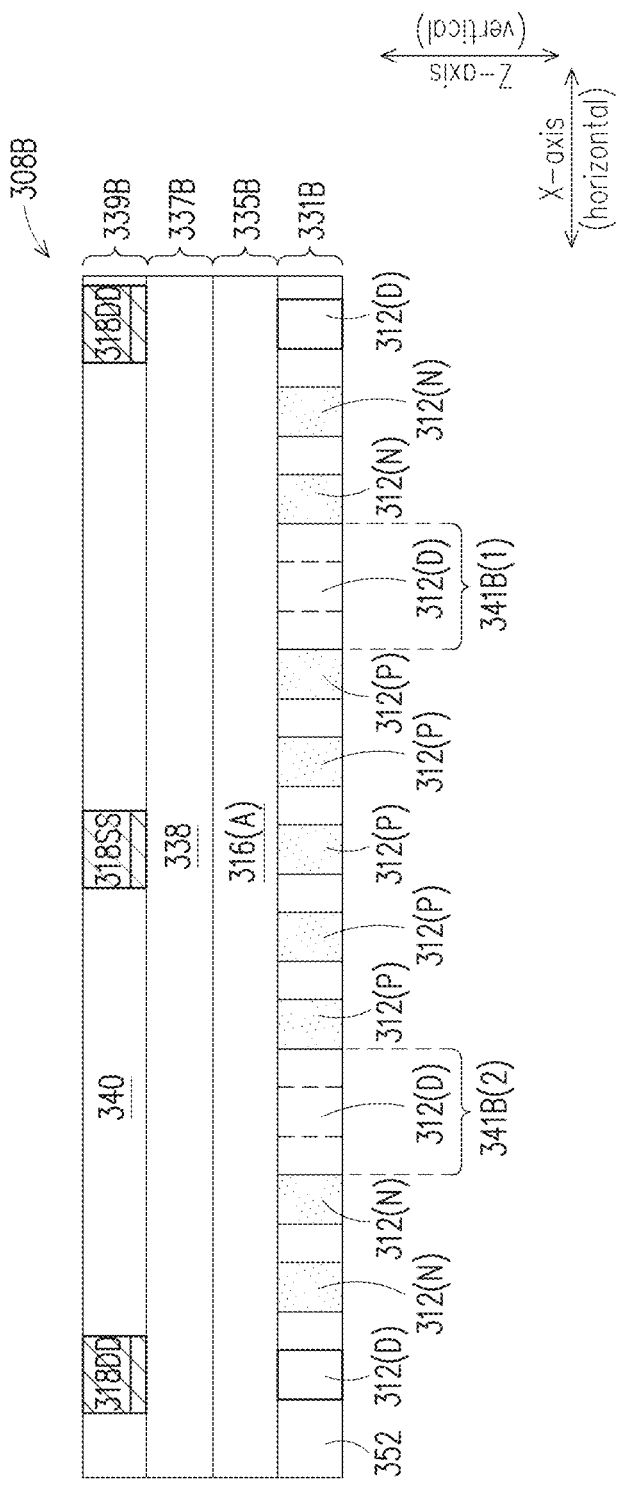

FIG. 3B is a cross-section of a cell region 308B of a semiconductor device, in accordance with some embodiments.

Cell region 308B of FIG. 3B is similar to cell region 308A of FIG. 3A. For brevity, the discussion of cell region 308B will focus on differences of cell region 308B with respect to cell region 308A. Cell region 308B is an example of a cell region of a semiconductor device which is fabricated based on a layout diagram such as the layout diagrams of FIGS. 2C and 2C, and (as discussed below) FIGS. 4C-4D and 5C-5D. As such, cell region 308B is an example of cell region 104 of semiconductor device 100 of FIG. 1.

Layer 331B includes: lines 312D, 312P and 312N corresponding to fin patterns 212(D), 212(P) and 212(N) of FIG. 2B; and an interlayer dielectric (ILD) 352. Instances of line 312(D) in gaps 341B(1) and 341B(2) are optional and accordingly have been shown in phantom lines. When instances of line 312(D) in gaps 341B(1) and 341B(2) are present, cell region 308B of FIG. 3B corresponds to cell 208C of layout diagram 200C of FIG. 2C. When instances of line 312(D) in gaps 341B(1) and 341B(2) are not present, cell region 308B of FIG. 3B corresponds to cell 208D of layout diagram 200D of FIG. 2D.

Figure 4A:
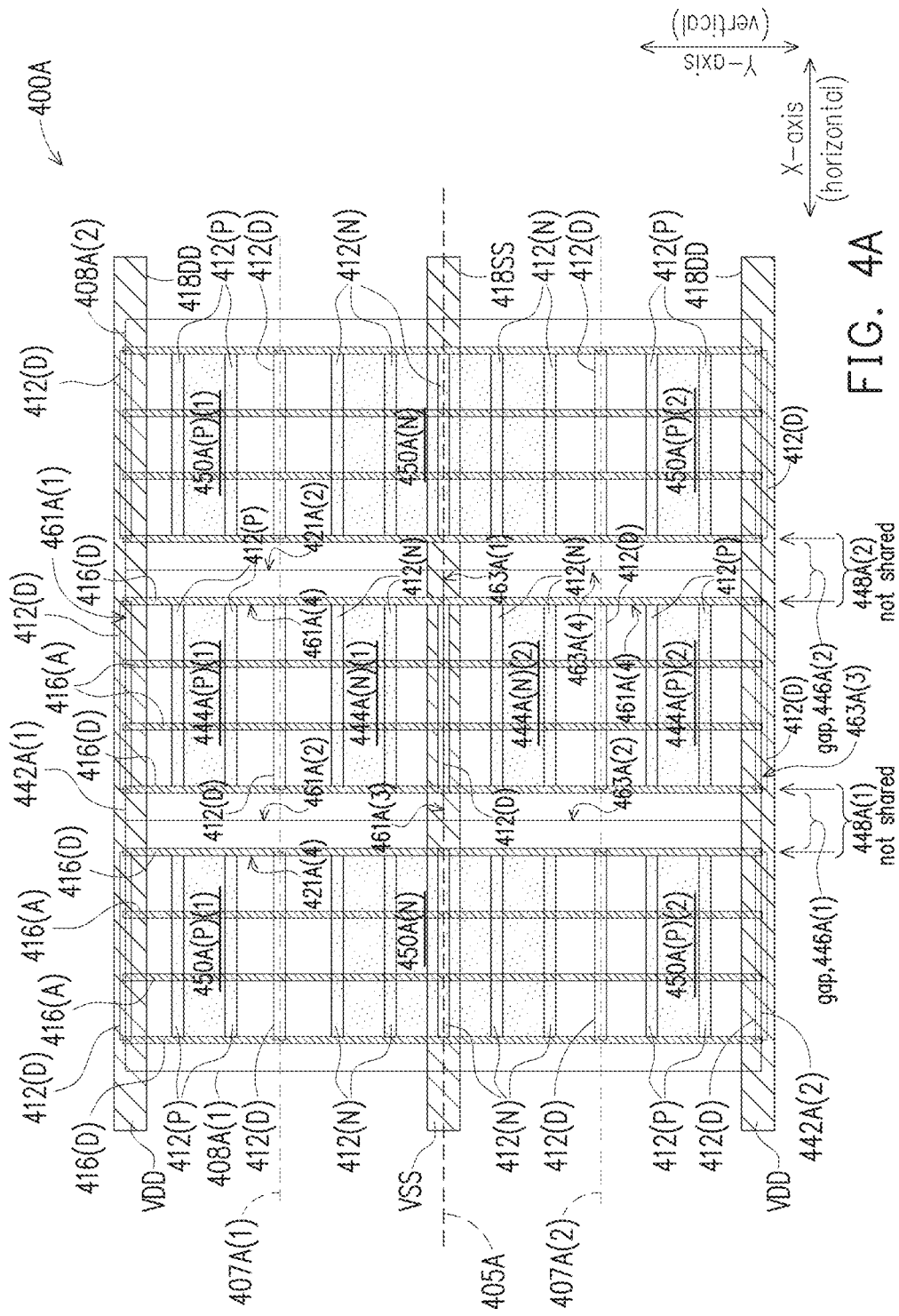
FIGS. 4A-4D are corresponding layout diagrams, in accordance with some embodiments.

FIG. 4A is a layout diagram 400A, in accordance with some embodiments.

Layout diagram 400A includes double height cells 408A(1) and 408A(2), and single height cells 442A(1) and 442A(2). Each of cells 408A(1) and 408A(2) of FIG. 4A is similar to cell 208A of FIG. 2A. For brevity, the discussion of cells 408A(1) and 408A(2) will focus on differences with respect to cell 208A. An example of a semiconductor device resulting from layout diagram 400A is semiconductor device 100 of FIG. 1, wherein instances of cell region 104 of semiconductor device 100 result correspondingly from one or more of cells 408A(1), 408A(2), 442A(1) and/or 442A(2) of FIG. 4A, or the like.

In layout diagram 400A, each of cells 408A(1), 408A(2), 442A(1) and 442A(2) is designated for finFET technology, and includes fin patterns which extend substantially parallel to a first direction. For reference purposes, there is a second direction which is substantially perpendicular to the first direction. In FIG. 4A, the first and second directions are correspondingly the horizontal and vertical directions. In some embodiments, the first and second directions are directions other than the corresponding horizontal and vertical directions. The fin patterns include dummy fin patterns 412D, active fin patterns 412N which are designated for NMOS technology, and active fin patterns 412P which are designated for PMOS technology. In some embodiments (not shown), the active fin patterns of layout 400A are flipped relative to what is shown in FIG. 4A such that active fin patterns designated in FIG. 4A for NMOS technology are instead designated for PMOS technology, and vice-versa; accordingly, such embodiments (again, not shown) differ from what is shown in FIG. 4A in a manner similar to how cell 208B of FIG. 2B differs from cell 208A of FIG. 2A.

In FIG. 4A, relative to the vertical direction, each of a midline of cell 408A(1) and a midline of cell 408A(2) is substantially collinear with a horizontal reference line 405A. Inserted between double height cells 408A(1) and 408A(2) is a stack, relative to the vertical direction, of single height cells 442A(1) and 442A(2). A third edge 461A(3) of cell 442A(2) is substantially collinear with reference line 405A. A first edge 463A(1) of cell 442A(1) is substantially collinear with reference line 405A. Relative to reference line 405A, cell 442A(2) is mirror symmetric with respect to cell 442A(1).

Single height cell 442A(1) is organized into a first active region 444A(N)(1) and a second active region 444A(P)(1). First active region 444A(N)(1) is located between a third edge 461A(3) and a reference line 407A(1), where reference line 407A(1) is substantially collinear with a midline of cell 442A(1). Second active region 444A(P)(1) is located between a first edge 461A(1) and reference 407A(1). Single height cell 442A(2) is organized into a first active region 444A(N)(2) and a second active region 444A(P)(2). First active region 444A(N)(2) is located between a first edge 463A(1) and a reference line 407A(2), where reference line 407A(2) is substantially collinear with a midline of cell 442A(2). Second active region 444A(P)(2) is located between a third edge 463A(3) and reference 407A(2).

Each of first active regions 444A(N)(1) and 444A(N)(2) includes three or more active fins 412(N). In FIG. 4A, each of first active regions 444A(N)(1) and 444A(N)(2) includes 2 instances of active fin 412(N). Each of second active regions 444A(P)(1) and 444A(P)(2) includes one or more active fins 412(P). In FIG. 2A, each of second active regions 444A(P)(1) and 444A(P)(2) includes 2 instances of active fin 212(P). Other numbers and/or locations of active fins are contemplated for each of active regions 444A(N)(1), 444A(N)(2), 444A(P)(1) and/or 444A(P)(2)), e.g., in light of the various numbers of active fins and/or various locations of active fins shown in FIGS. 6, 7A-7D, 8A-8D, 9A-9D, 10A-10C, 11A-11D, 12A-12C and 13A-13L discussed below, and the like.

In single height cell 442A(1), relative to the vertical direction, one instance of dummy fin pattern 412(D) is located substantially parallel to midline 407(1) in a gap between first active region 444A(N)(1) and second active region 444A(P)(1), where the gap has the size 455. Also, relative to the vertical direction, one instance of dummy fin pattern 412(D) is located substantially parallel to midline 407(2) in a gap between first active region 444A(N)(2) and second active region 444A(P)(2), where the second gap has the size 456. A first boundary instance of dummy fin pattern 212(D) is substantially collinear with first edge 461A(1) of cell 442A(1) such that cell 442A(1) includes substantially one-half of the first boundary instance of dummy fin pattern 212(D). A second boundary instance of dummy fin pattern 412(D) is substantially collinear with third edge 463A(3) of cell 442A(2) such that cell 442A(2) includes substantially one-half of the second boundary instance of dummy fin pattern 412(D).

In FIG. 4A, each of double height cells 408A(1) and 408A(2) and single height cells 442A(1) and 442A(2) includes dummy gate patterns 416(D) as well as active gate patterns 416(A). Relative to the horizontal direction, corresponding instances of active gate pattern 216(A) intersect a given one of the fin patterns at location_1=⅓*length_fin and at location_2=⅔*length_fin. In some embodiments, instances of active gate pattern 416(A) intersect the fin patterns at locations other than location_1 and location_2. Also, relative to the horizontal direction, corresponding instances of dummy gate pattern 416(D) intersect a given one of the fin patterns first and second ends of the given fin pattern.

In some embodiments, gate electrodes resulting from instances of dummy gate pattern 416(D) of FIG. 4A are not included as functional components in semiconductor devices. Accordingly, in some embodiments, gate electrodes resulting from instances of dummy gate pattern 416(D) are not configured for a particular conductivity. In some embodiments, a given instance of dummy gate pattern 416(D) is designated as dummy rather than as active because the given instance of dummy gate pattern 416(D) is located over an end of a corresponding active fin such that the active fin does not extend sufficiently, in the horizontal direction, beyond both sides of the given instance of dummy gate pattern 416(D). Because the potential 'active status' of dummy gate pattern 416(D) is sacrificed, hence dummy gate pattern 416(D) is sometimes referred to as a sacrificial gate pattern.

In layout 400A, relative to the horizontal direction, where double height cell 408A(1) abuts the stack of single height cells 442A(1) and 442A(2), there is a gap 446A(1). In particular, gap 446A(1) is located between the instance of dummy gate pattern 416(D) which is proximate to fourth edge 421A(4) of cell 408A(1) and the instance of dummy gate pattern 416(D) which is proximate to each of second edge 461A(2) of cell 442A(1) and second edge 463A(2) of cell 442A(2). As such, neither of cell 442A(1) nor cell 442A(2) shares an instance of dummy gate pattern 416(D) with cell 408A(1), with the 'not shared' condition being called out in FIG. 4A by reference number 448A(1).

Similarly, in layout 400A, relative to the horizontal direction, where double height cell 408A(2) abuts the stack of single height cells 442A(1) and 442A(2), there is a gap 446A(2). In particular, gap 446A(2) is located between the instance of dummy gate pattern 416(D) which is proximate to second edge 421A(2) of cell 408A(1) and the instance of dummy gate pattern 416(D) which is proximate to each of fourth edge 461A(4) of cell 442A(1) and fourth edge 463A(4) of cell 442A(2). As such, neither of cell 442A(1) nor cell 442A(2) shares an instance of dummy gate pattern 416(D) with cell 408A(2), with the not shared condition being called out in FIG. 4A by reference number 448A(2).

In FIG. 4A, relative to the horizontal direction, a boundary between cell 408A(1) and cell 442A(1) is defined by a consecutive sequence as follows: active gate pattern 416(A) in cell 408A(1); dummy gate pattern 416(D) in cell 408A(1); dummy gate pattern 416(D) in cell 442A(1); and active gate pattern 416(A) in cell 442A(1). Similarly, relative to the horizontal direction, a boundary between cell 408A(1) and cell 442A(2) is defined by a consecutive sequence as follows: active gate pattern 416(A) in cell 408A(1); dummy gate pattern 416(D) in cell 408A(1); dummy gate pattern 416(D) in cell 442A(2); and active gate pattern 416(A) in cell 442A(2).

Also in FIG. 4A, relative to the horizontal direction, a boundary between cell 442A(1) and cell 408A(2) is defined by a consecutive sequence as follows: active gate pattern 416(A) in cell 442A(1); dummy gate pattern 416(D) in cell 442A(1); dummy gate pattern 416(D) in cell 408A(2); and active gate pattern 416(A) in cell 408A(2). Similarly, relative to the horizontal direction, a boundary between cell 442A(2) and cell 408A(2) is defined by a consecutive sequence as follows: active gate pattern 416(A) in cell 442A(2); dummy gate pattern 416(D) in cell 442A(2); dummy gate pattern 416(D) in cell 408A(2); and active gate pattern 416(A) in cell 408A(2).

Figure 4B:
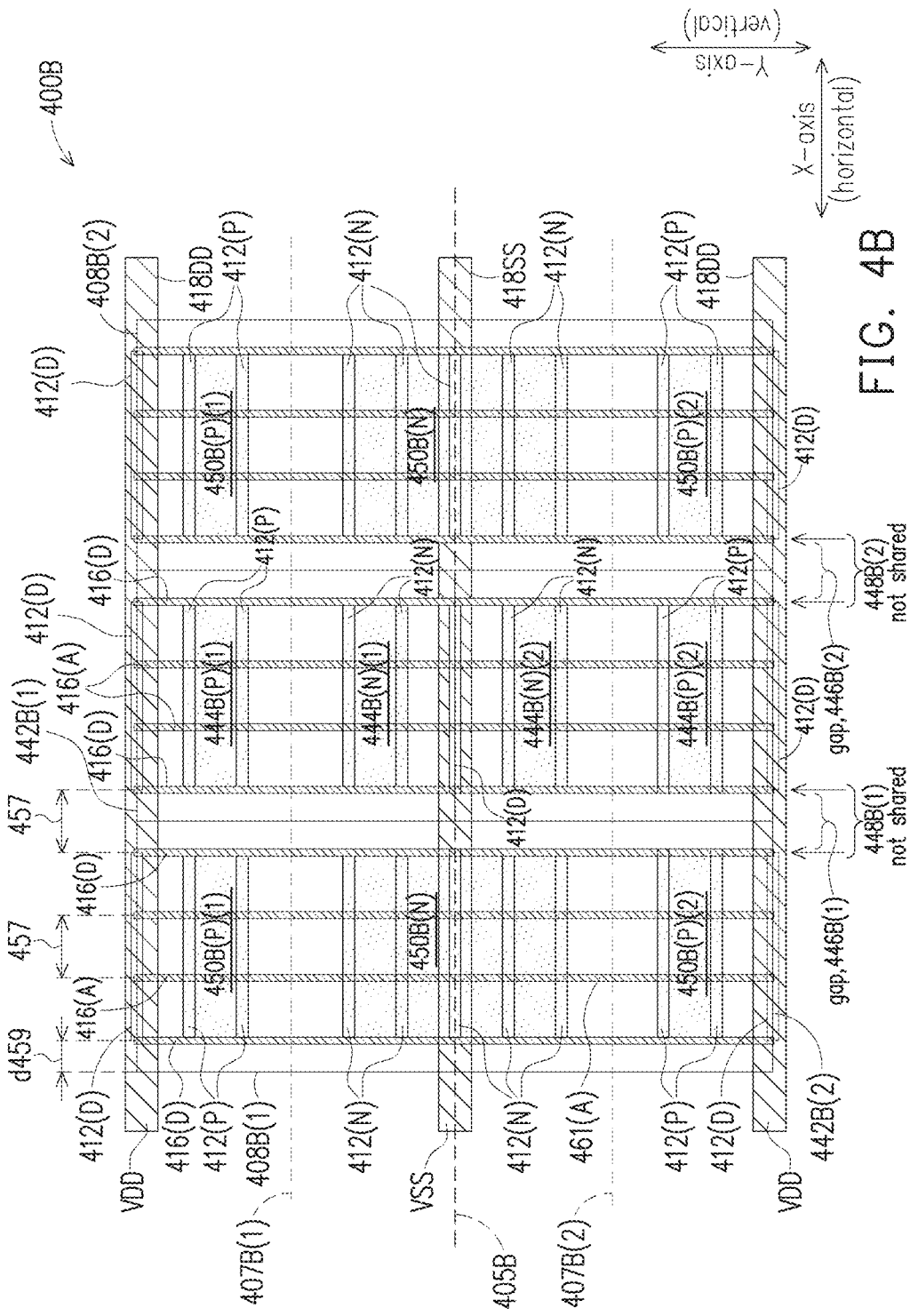

FIG. 4B is a layout diagram 400B, in accordance with some embodiments.

Layout diagram 400B of FIG. 4B is similar to layout diagram 400A of FIG. 4A. For brevity, the discussion of layout diagram 400B will focus on differences of layout diagram 400B with respect to layout diagram 400A. An example of a semiconductor device resulting from layout diagram 400B is semiconductor device 100 of FIG. 1, wherein instances of cell region 104 of semiconductor device 100 result correspondingly from one or more of cells 408B(1), 408B(2), 442B(1) and/or 442B(2) of FIG. 4B, or the like.

Layout diagram 400B of FIG. 4B differs from layout 400A of FIG. 4A in a manner similar to how cell 208C of FIG. 2C differs from cell 208A of FIG. 2A. Accordingly, no instances of dummy fin pattern 412(D) are substantially collinear with reference line 407B(1) nor with reference line 407B(2).

Figure 4C:
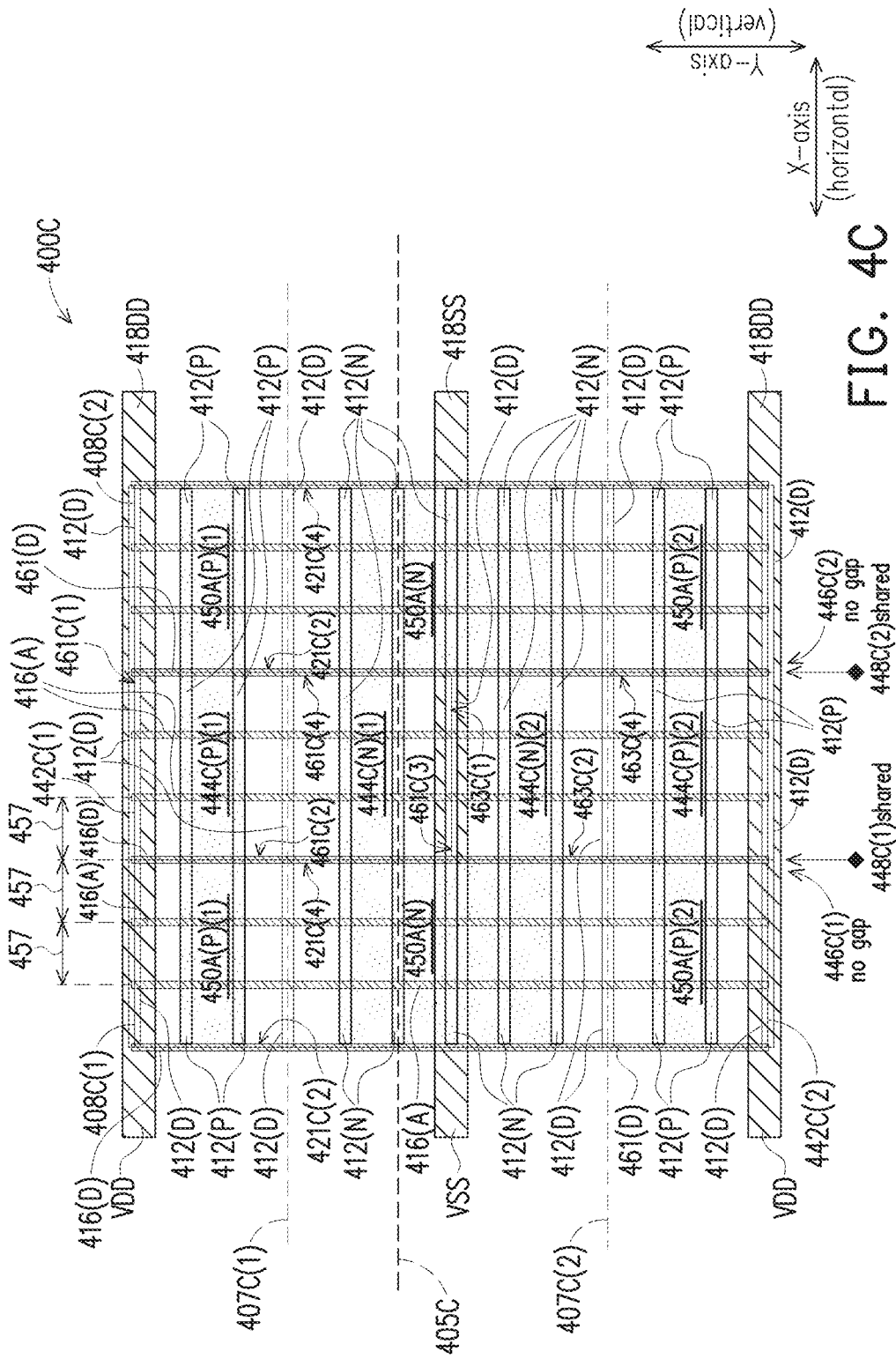

FIG. 4C is a layout diagram 400C, in accordance with some embodiments.

Layout diagram 400C of FIG. 4C is similar to layout diagram 400A of FIG. 4A. For brevity, the discussion of layout diagram 400C will focus on differences of layout diagram 400C with respect to layout diagram 400A. An example of a semiconductor device resulting from layout diagram 400C is semiconductor device 100 of FIG. 1, wherein instances of cell region 104 of semiconductor device 100 result correspondingly from one or more of cells 408C(1), 408C(2), 442C(1) and/or 442C(2) of FIG. 4B, or the like.

Regarding layout diagram 400C, whereas layout diagram 400A includes gaps 446A(1) and 446A(2), no corresponding gaps are present in layout 400C as indicated by corresponding callouts 446C(1) and 446C(2). Relative to the horizontal direction, an advantage of layout diagram 400C is that layout diagram 400C is denser than layout diagram 400A of FIG. 4A.

In FIG. 4C, relative to the horizontal direction, second edge 421A(2) and fourth edge 421A(4) of cell 408C(1) intersect the fin patterns substantially at corresponding ends of the fin patterns, in contrast to cell 408A(1) of FIG. 4A. Similarly, second edge 421A(2) and fourth edge 421A(4) of cell 408C(2) intersect the fin patterns substantially at corresponding ends of the fin patterns. Also, second edge 461C(2) and fourth edge 461C(4) of cell 442C(1) intersect the fin patterns substantially at corresponding ends of the fin patterns. Similarly, second edge 461C(2) and fourth edge 461C(4) of cell 442C(2) intersect the fin patterns substantially at corresponding ends of the fin patterns.

Regarding layout 400C, a first instance of dummy gate pattern 416(D) associated with cell 408C(1) is substantially collinear with second edge 421C(2) of cell 408C(1) such that cell 408C(1) includes substantially one-half of the first instance of dummy gate pattern 416(D) associated with cell 408C(1). A second instance of dummy gate pattern 416(D) associated with cell 408C(1) is substantially collinear with fourth second edge 421C(4) of cell 408C(1) such that cell 408C(1) includes substantially one-half of the second instance of dummy gate pattern 416(D) associated with cell 408C(1). First and second instances of dummy gate pattern 416(D) associated with cell 408C(2) are correspondingly substantially collinear with second edge 421C(2) and fourth second edge 421C(4) of cell 408C(2) such that cell 408C(2) includes substantially one-half of each of the first and second instances of dummy gate pattern 416(D) associated with cell 408C(2).

Also regarding layout 400C, a first instance of dummy gate pattern 416(D) associated with cell 442C(1) is substantially collinear with second edge 461C(2) of cell 442C(1) such that cell 442C(1) includes substantially one-half of the first instance of dummy gate pattern 416(D) associated with cell 442C(1). A second instance of dummy gate pattern 416(D) associated with cell 408C(1) is substantially collinear with fourth second edge 461C(4) of cell 442C(1) such that cell 442C(1) includes substantially one-half of the second instance of dummy gate pattern 416(D) associated with cell 442C(1). First and second instances of dummy gate pattern 416(D) associated with cell 442C(2) are correspondingly substantially collinear with second edge 463C (2) and fourth second edge 463C (4) of cell 442C(2) such that cell 442C(2) includes substantially one-half of each of the first and second instances of dummy gate pattern 416(D) associated with cell 442C(2).

As such, in layout 400C, fourth edge 421C(4) of cell 408C(1) shares a dummy gate pattern 416(D) with each of second edge 461C(2) of cell 442C(1) and second edge 463C (2) of cell 442C(2), as indicated by callout 448C (1). Consequently, relative to the horizontal direction, where double height cell 408C(1) abuts the stack of single height cells 442C(1) and 422C (2), again, there is no gap as indicated by callout 446C(1). Also, second edge 421C(2) of cell 408C(2) shares a dummy gate pattern 416(D) with each of fourth edge 461C(4) of cell 442C(1) and fourth edge 463C (4) of cell 442C(2), as indicated by callout 448C (2). Consequently, relative to the horizontal direction, where double height cell 408C(2) abuts the stack of single height cells 442C(1) and 422C (2), again, there is no gap as indicated by callout 446C(2).

In FIG. 4C, a boundary, relative to the horizontal direction, between cell 408C(1) and cell 442C(1) is defined by a consecutive sequence as follows: active gate pattern 416(A) in cell 408C(1); dummy gate pattern 416(D) shared by cell 408C(1) and cell 442C(1); and active gate pattern 416(A) in cell 442A(1). Similarly, a boundary, relative to the horizontal direction, between cell 408C(1) and cell 442C(2) is defined by a consecutive sequence as follows: active gate pattern 416(A) in cell 408C(1); dummy gate pattern 416(D) shared by cell 408C(1) and cell 442C(1); and active gate pattern 416(A) in cell 442C(2).

Also in FIG. 4C, relative to the horizontal direction, a boundary between cell 442C(1) and cell 408C(2) is defined by a consecutive sequence as follows: active gate pattern 416(A) in cell 442C(1); dummy gate pattern 416(D) shared by cell 442C(1) and cell 408C(2); and active gate pattern 416(A) in cell 408C(2). Similarly, relative to the horizontal direction, a boundary between cell 442C(2) and cell 408C(2) is defined by a consecutive sequence as follows: active gate pattern 416(A) in cell 442C(2); dummy gate pattern 416(D) shared by cell 442C(2) and cell 408C(2); and active gate pattern 416(A) in cell 408C(2).

Figure 4D:
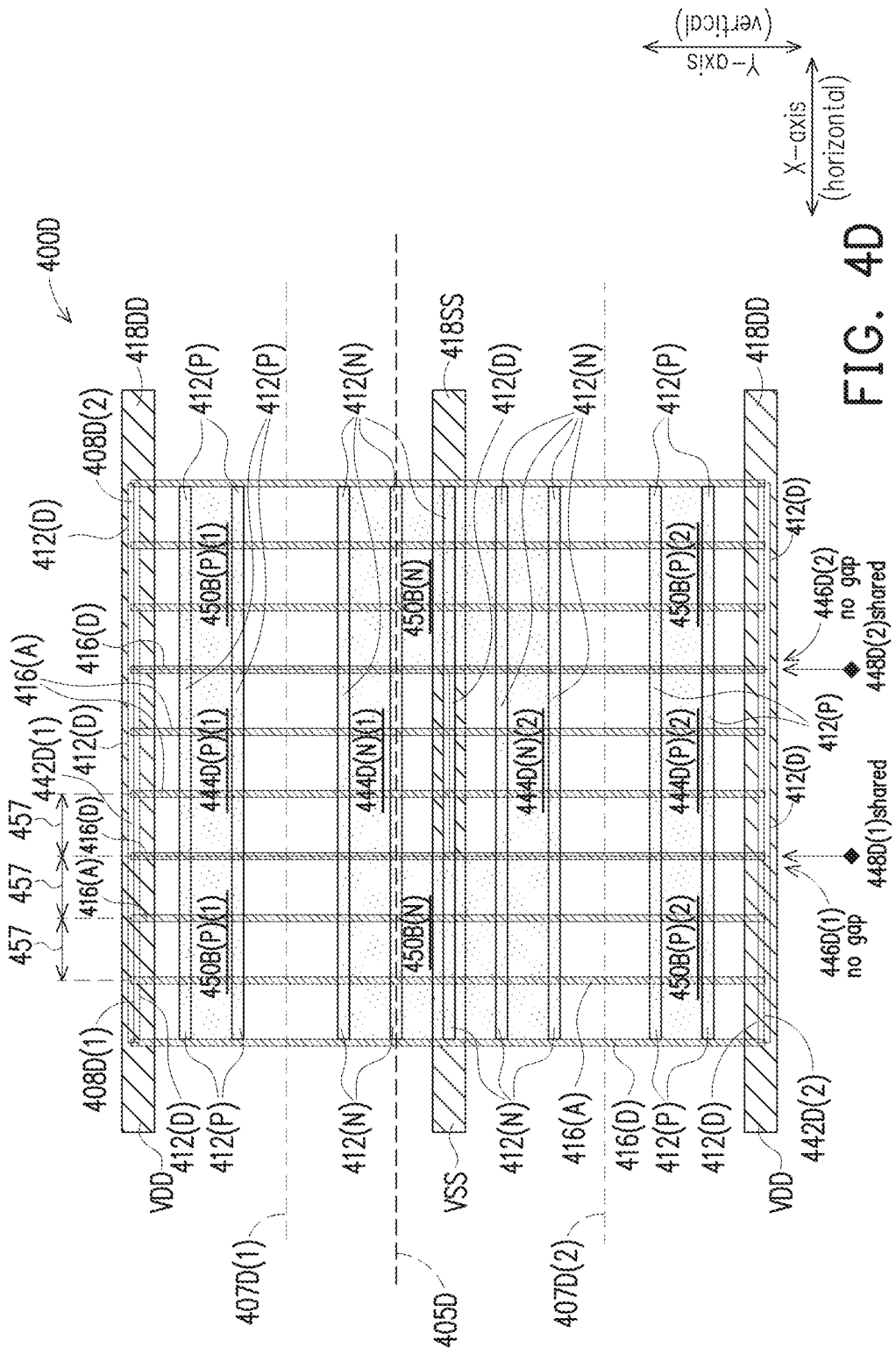

FIG. 4D is a layout diagram 400D, in accordance with some embodiments.

Layout diagram 400D of FIG. 4D is similar to layout diagram 400C of FIG. 4C. For brevity, the discussion of layout diagram 400D will focus on differences of layout diagram 400D with respect to layout diagram 400C. An example of a semiconductor device resulting from layout diagram 400D is semiconductor device 100 of FIG. 1, wherein instances of cell region 104 of semiconductor device 100 result correspondingly from one or more of cells 408D(1), 408D(2), 442D(1) and/or 442D(2) of FIG. 4D, or the like.

Layout diagram 400D of FIG. 4D differs from layout 400C of FIG. 4C in a manner similar to how cell 208C of FIG. 2C differs from cell 208A of FIG. 2A. Accordingly, no instances of dummy fin 412(D) are substantially collinear with reference line 407C (1) nor with reference line 407C (2).

Figure 5A:
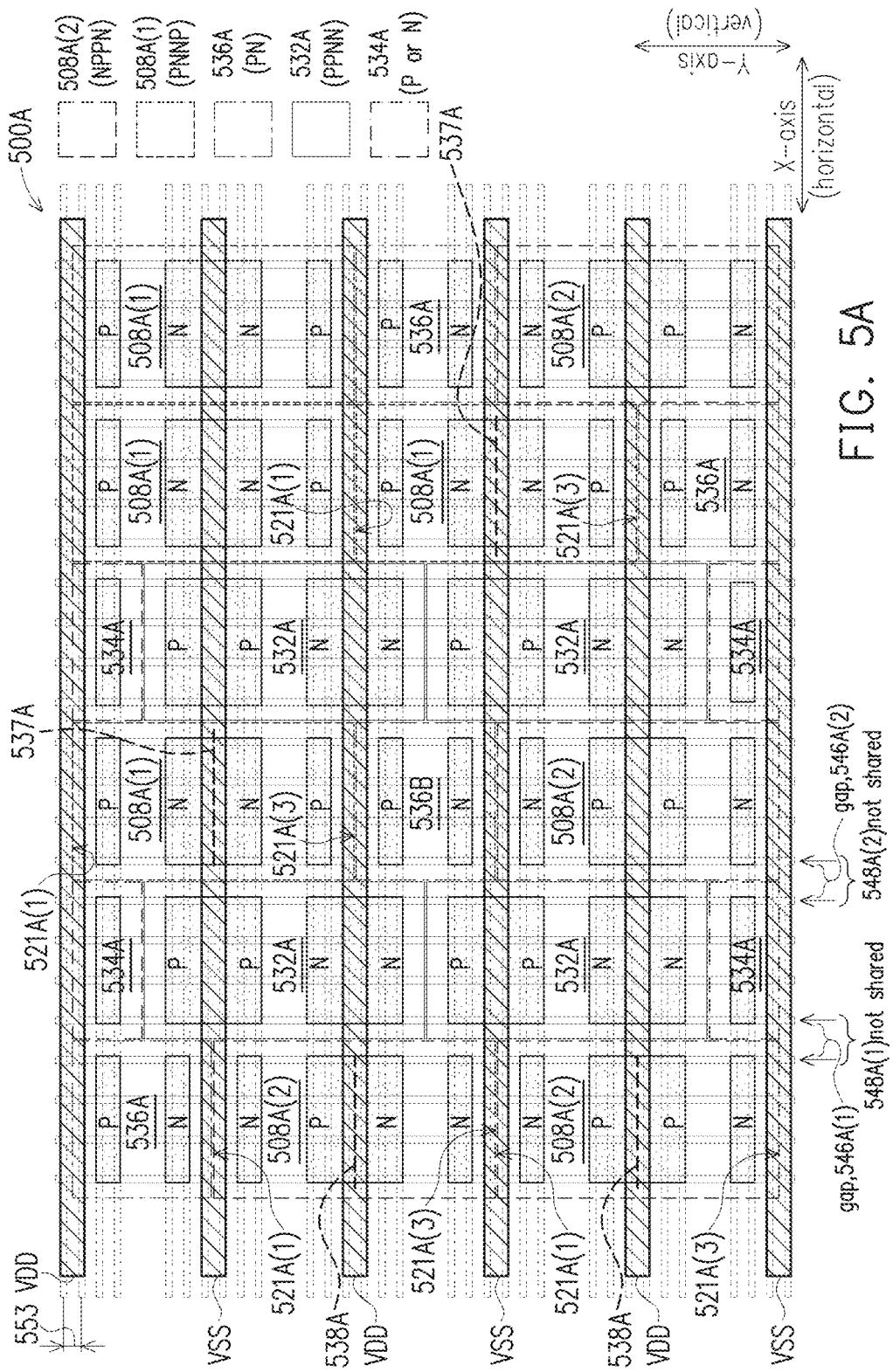
FIGS. 5A-5D are corresponding layout diagrams, in accordance with some embodiments.

FIG. 5A is a layout diagram 500A, in accordance with some embodiments.

Layout diagram 500A includes double height cells 508A(1) and 508A(2), double height cells 532A and 534A and single height cells 536A. Cell 508A(1) of FIG. 5A is similar to cell 208A of FIG. 2A. Cell 508A(2) of FIG. 5A is similar to cell 208B of FIG. 2B. Cell 536A of FIG. 5A is similar to cells 442A(1) and 442A(2) of FIG. 4A. For brevity, the discussion of cells 508A(1) and 508A(2) will focus on differences with respect to corresponding cells 208B and 208A. Similarly, for brevity, the discussion of cell 536A will focus on differences with respect to corresponding cells 442A(1) and 442A(2). An example of a semiconductor device resulting from layout diagram 500A is semiconductor device 100 of FIG. 1, wherein instances of cell region 104 of semiconductor device 100 result correspondingly from one or more of cells 508A(1), 508A(2), 536A, 532A and 534A of FIG. 5A, or the like.

In layout diagram 500A, each of cells 508A(1), 508A(2), 536A, 532A and 534A is designated for finFET technology, and includes fin patterns which extend substantially parallel to a first direction. For reference purposes, there is a second direction which is substantially perpendicular to the first direction. In FIG. 5A, the first and second directions are correspondingly the horizontal and vertical directions. In some embodiments, the first and second directions are directions other than the corresponding horizontal and vertical directions. The fin patterns include dummy fin patterns, active fin patterns which are designated for NMOS technology, and active fin patterns which are designated for PMOS technology, none of which are called out with reference numbers in FIG. 5A for simplicity of illustration. Layout diagram 500A further includes power grid segment patterns (PG patterns), some of which are designated for a voltage VDD and some of which are designated for a voltage VSS. Though called out with labels VDD or VSS, corresponding ones of the PG patterns are not called out with reference numbers in FIG. 5A for simplicity of illustration. In some embodiments (not shown), the active fin patterns and PG patterns of layout 500A are flipped relative to what is shown in FIG. 5A such that active fin patterns designated in FIG. 5A for NMOS technology are instead designated for PMOS technology and PG patterns designated for VSS are instead designated for VDD, and vice-versa; accordingly, such embodiments (again, not shown) differ from what is shown in FIG. 5A in a manner similar to how cell 208B of FIG. 2B differs from cell 208A of FIG. 2A.

In FIG. 5A, for simplicity of illustration, a labeling convention is adopted. In particular, relative to a sequence in the vertical direction, single height cell 536A is labeled as 'PN.' Here, 'PN' indicates that cell 536A includes a single active region having active fin patterns which are designated for PMOS technology and a single active region having active fin patterns which are designated for NMOS technology. For simplicity of illustration in FIG. 5A, neither of the active regions in cell 536A is called out with reference numbers. Also, each instance of cell 534 includes a single active region, which can be labeled as 'P' or 'N' to indicate that the single active region has active fin patterns which are designated correspondingly for PMOS technology or NMOS technology. For simplicity of illustration in FIG. 5A, the active region in each instance of cell 534A is not called out with a reference number.

Regarding the labeling convention of FIG. 5A, relative to a sequence in the vertical direction, double height cell 508A(1) is labeled as 'PNNP.' Here, 'PNNP' indicates that cell 508A(1) corresponds to a stack (in the vertical direction) of two instances of a single height 'PN' cell 536A albeit with the 'NN' portion of cell 508A(1) representing a larger single active region having active fin patterns which are designated for NMOS technology rather than two discrete smaller active fin patterns which are designated for NMOS technology (see discussion above of cell 208A of FIG. 2A). For simplicity of illustration in FIG. 5A, none of the active regions in cell 508A(1) is called out with reference numbers. Similarly, relative to a sequence in the vertical direction, double height cell 508A(2) is labeled as 'NPPN.' Here, 'NPPN' indicates that cell 508A(1) corresponds to a stack (in the vertical direction) of two instances of a single height 'NP' cell (not shown) albeit with the 'PP' portion of the cell 508A(2) representing a larger single active region having active fin patterns which are designated for PMOS technology rather than two discrete smaller active fin patterns which are designated for PMOS technology (see discussion above of cell 208B of FIG. 2B). For simplicity of illustration in FIG. 5A, none of the active regions in cell 508A(2) is called out with reference numbers.

Further regarding the labeling convention of FIG. 5A, relative to a sequence in the vertical direction, double height cell 532A is labeled as 'PPNN.' Here, 'PPNN' indicates that cell 532A corresponds to a version of single height cell 536A which has been stretched/scaled from the single height of cell 536A to double height. Accordingly, cell 532A includes a single active region having active fin patterns which are designated for PMOS technology and a single active region having active fin patterns which are designated for NMOS technology. Relative to the vertical direction, size S_532A of each of the single active PMOS region and the single active NMOS region in cell 532A is greater than a size S_536A of each of the single active PMOS region and the single active NMOS region in cell 536A. The size S_532A is greater than the size S_536A because each of the single active PMOS region and the single active NMOS region in cell 532A includes bonus fins in a manner similar to how cell 208A of FIG. 2A includes bonus fins. A sum, $\Sigma$, of active fins in each of the single active PMOS region and the single active NMOS region in cell 532A is $\Sigma=2*m+n$, where m and n are positive integers, m is a variable representing the number in each of the single active PMOS region and the single active NMOS region in cell 536A, and n is a variable representing the number of bonus fins in each of the single active PMOS region and the single active NMOS region in cell 536A.

In FIG. 5A, relative to the vertical direction, midlines 537A of cells 508A(1) are offset from midlines 538A of cells 508A(2). Relative to the vertical direction, to the extent that a first given instance of cell 508A(1) overlaps a first given instance of cell 508A(2), a first edge 521A(1) or a third edge 521(3) of the first given instance of cell 508A(1) will be substantially collinear with midline 538A of the first given instance of cell 508A(2). Similarly, to the extent that a second given instance of cell 508A(2) overlaps a second given instance of cell 508A(1), a first edge 521A(1) or a third edge 521(3) of the second given instance of cell 508A(2) will be substantially collinear with midline 537A of the second given instance of cell 508A(1).

Figure 5B:
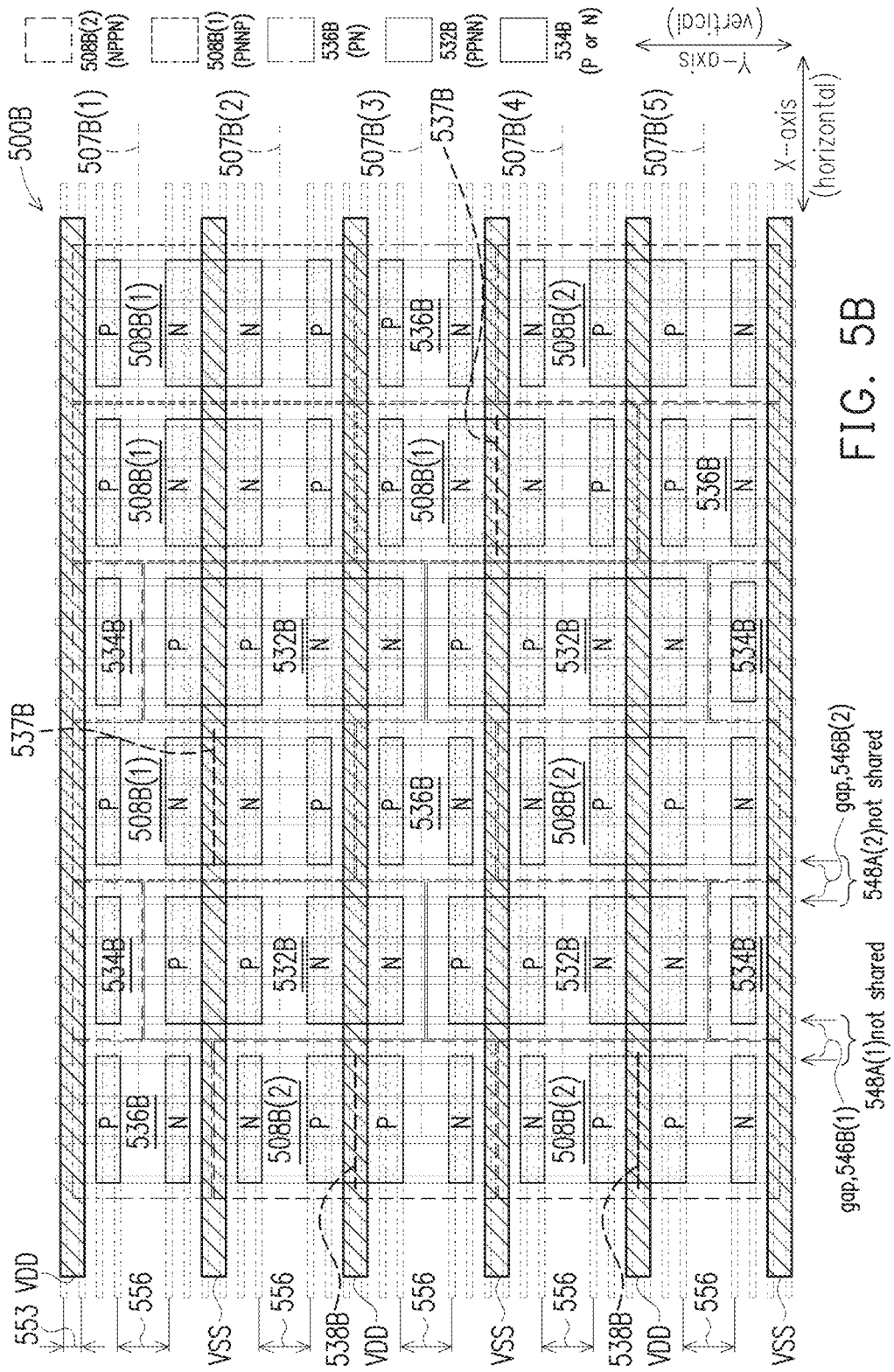

FIG. 5B is a layout diagram 400B, in accordance with some embodiments.

Layout diagram 500B of FIG. 5B is similar to layout diagram 500A of FIG. 5A. For brevity, the discussion of layout diagram 500B will focus on differences of layout diagram 500B with respect to layout diagram 500A. An example of a semiconductor device resulting from layout diagram 500B is semiconductor device 100 of FIG. 1, wherein instances of cell region 104 of semiconductor device 100 result correspondingly from one or more of cells 508B(1), 508B(2), 536B, 532B and 534B of FIG. 5B, or the like.

Layout diagram 500B of FIG. 5B differs from layout 500A of FIG. 5A in a manner similar to how cell 208C of FIG. 2C differs from cell 208A of FIG. 2A. Accordingly, no instances of dummy fin patterns are substantially collinear with any of reference lines 507B (1)-507B (5).

Figure 5C:
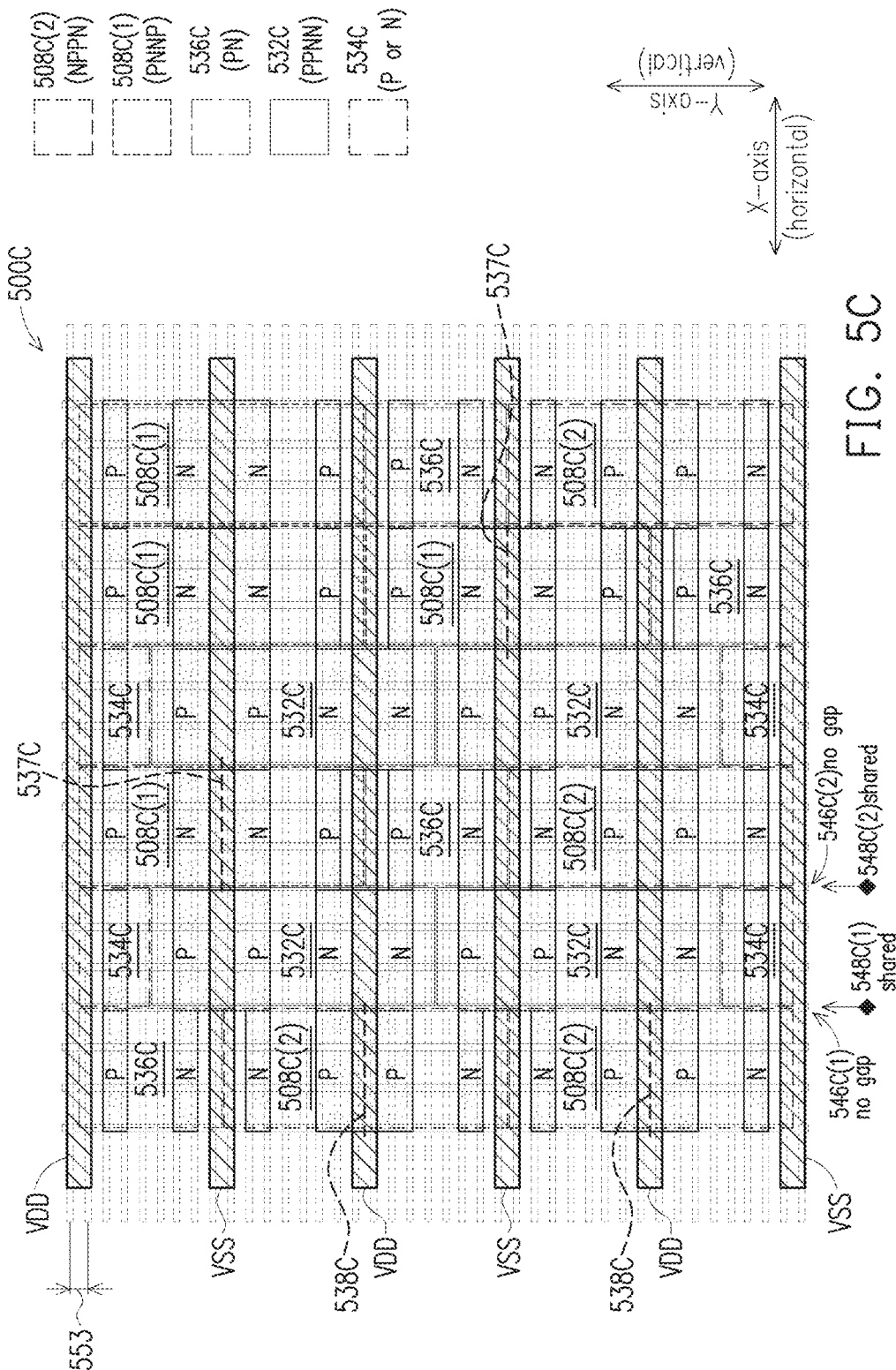

FIG. 5C is a layout diagram 500C, in accordance with some embodiments.

Layout diagram 500C of FIG. 5C is similar to layout diagram 500A of FIG. 5A. For brevity, the discussion of layout diagram 500C will focus on differences of layout diagram 500C with respect to layout diagram 500A. An example of a semiconductor device resulting from layout diagram 400C is semiconductor device 100 of FIG. 1, wherein instances of cell region 104 of semiconductor device 100 result correspondingly from one or more of cells 508C(1), 508C(2), 536C, 532C and 534C of FIG. 5C, or the like.

Regarding layout diagram 500C, whereas layout diagram 500A includes gaps 546A(1) and 546A(2), no corresponding gaps are present in layout 500C as indicated by corresponding callouts 546C(1) and 546C(2). Relative to the horizontal direction, an advantage of layout diagram 500C is that layout diagram 500C is denser than layout diagram 500A of FIG. 5A.

In FIG. 5C, a boundary, relative to the horizontal direction, between an instance of a first cell, e.g., cell 508C(1), and a second cell, e.g., an instance of cell 508C(2), is defined by a consecutive sequence as follows: an instance of the active gate pattern in cell 508C(1); an instance of the dummy gate pattern shared by cell 508C(1) and cell 508C(2); and an instance of the active gate pattern in cell 508C(2).

Figure 5D:
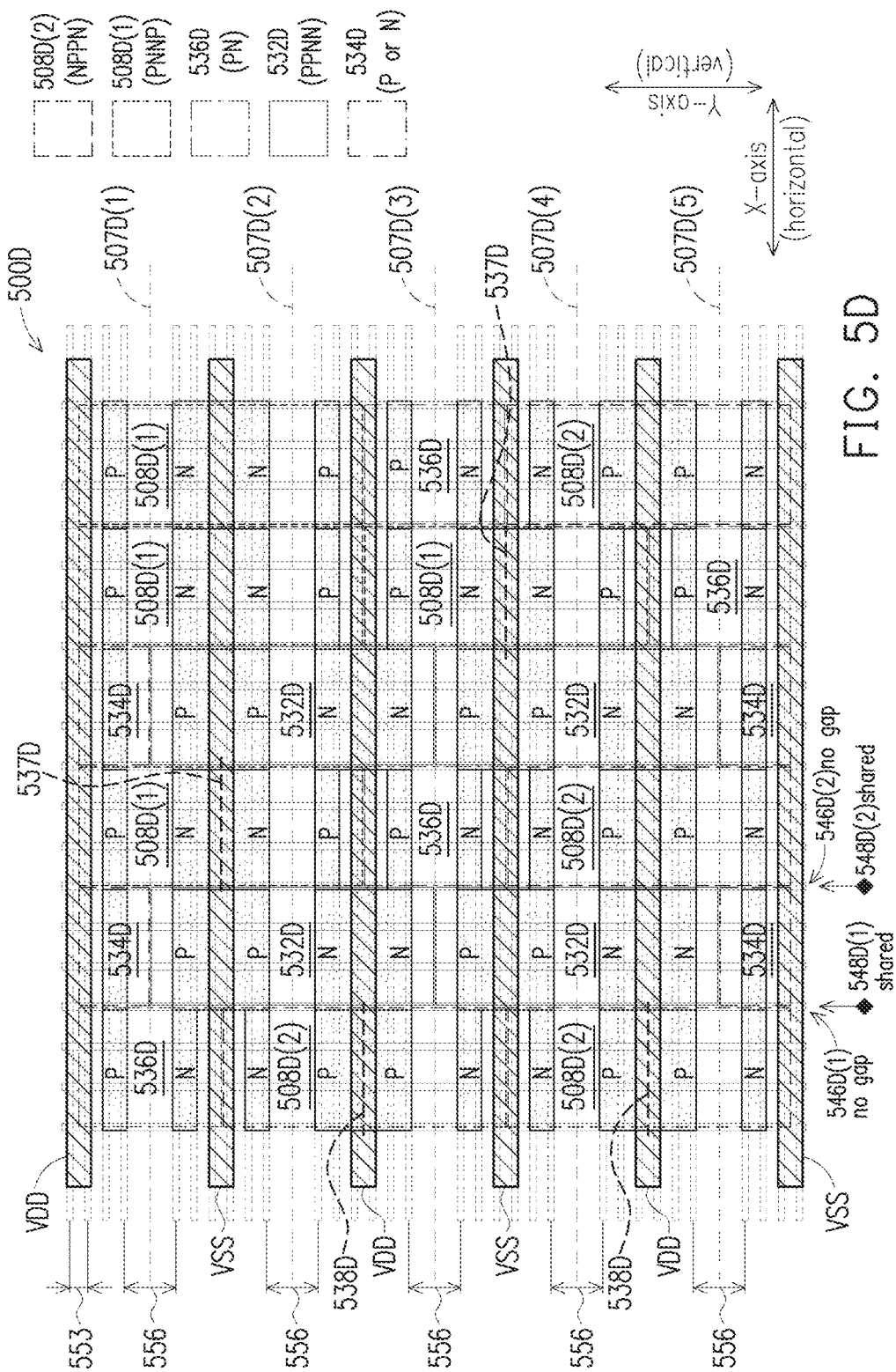

FIG. 5D is a layout diagram 500D, in accordance with some embodiments.

Layout diagram 500D of FIG. 5D is similar to layout diagram 500C of FIG. 5C. For brevity, the discussion of layout diagram 500D will focus on differences of layout diagram 500D with respect to layout diagram 500C. An example of a semiconductor device resulting from layout diagram 500D is semiconductor device 100 of FIG. 1, wherein instances of cell region 104 of semiconductor device 100 result correspondingly from one or more of cells 508D(1), 508D(2), 536D, 532D and 534D of FIG. 5D, or the like.

Layout diagram 500D of FIG. 5D differs from layout 500C of FIG. 5C in a manner similar to how cell 208C of FIG. 2C differs from cell 208A of FIG. 2A. Accordingly, no instances of dummy fin patterns are substantially collinear with any of reference lines 507D(1)-507D(5).

Figure 6:
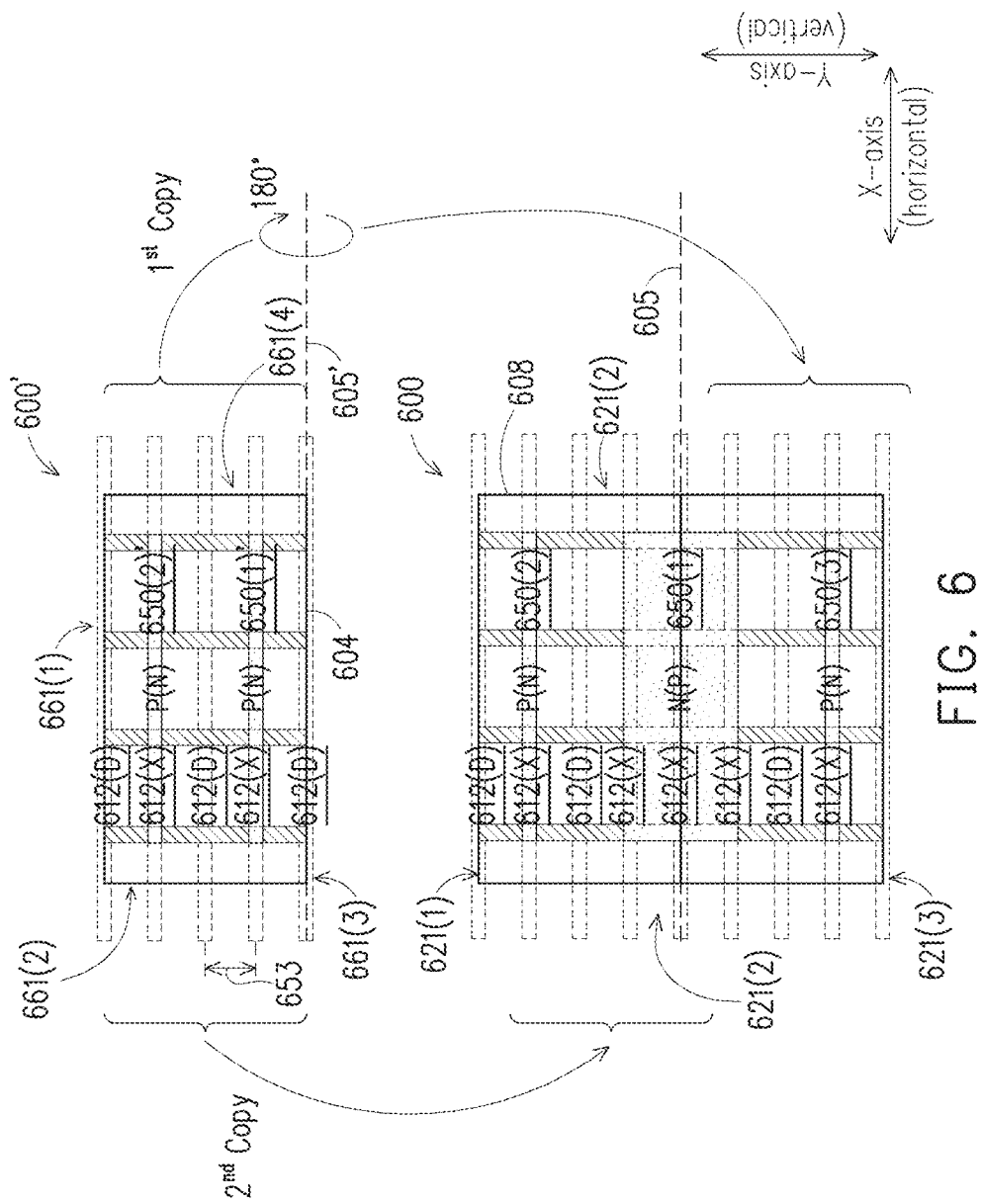
FIG. 6 is a combination diagram showing how a first layout diagram relates to a 'building block' in the form of a second layout diagram, in accordance with some embodiments.

FIG. 6 is a combination diagram showing how a layout diagram 600 relates to a 'building block' in the form of a layout diagram 600', in accordance with some embodiments.

Layout diagram 600 includes a double height cell 608. Cell 608 is similar, e.g., to each of cell 208A of FIG. 2A and cell 208B of FIG. 2B. Layout diagram 600' includes a cell 604. Cell 604 is similar, e.g., to cells 442A(1) and 442A(2) of FIG. 4A. For brevity, the discussion of cell 600 will focus on differences of cell 600 with respect to cell 208A and cell 208B, and the discussion of cell 604 will focus on differences of cell 604 with respect to 442A(1) and 442A(2). In some embodiments, cell 600 is used as a standard cell in a library comprised of standard cells. An example of a semiconductor device resulting from a layout diagram which includes cell 600 is semiconductor device 100 of FIG. 1, wherein cell region 104 of semiconductor device 100 results from cell 600. Cell 608 is summarized in row 5 of the table appearing below.

Each of cells 600 and 600' is designated for finFET technology, and includes fin patterns which extend substantially parallel to a first direction. For reference purposes, there is a second direction which is substantially perpendicular to the first direction. In FIG. 6, the first and second directions are correspondingly the horizontal and vertical directions. In some embodiments, the first and second directions are directions other than the corresponding horizontal and vertical directions. The fin patterns include dummy fin patterns 612(D) and active fin patterns 612(X). In some embodiments, a first set of active fin patterns 612(X) are designated for NMOS technology, and a second set of active fin patterns 612(X) are designated for PMOS technology in a manner similar, e.g., to cell 208A of FIG. 2A. In some embodiments, the first and second sets of active fin patterns 612(X) are flipped such that the first set of active fin patterns 612(X) is instead designated for PMOS technology, and the second set of active fin patterns 612(X) is instead designated for NMOS technology in a manner similar, e.g., to cell 208B of FIG. 2B.

Cell 600 is organized into a first active region 650(1), a second active region 650(2) and a third active region 650(3). First active region 650(1) includes a sequence of three or more consecutive NMOS/PMOS configured active fins 612 (X). Second active region 650(2) includes one or more PMOS/NMOS configured active fins 612(X). Third active region 650(3) includes one or more PMOS/NMOS configured active fins 612(X). As shown in FIG. 6, first active region 650(1) includes a sequence of three consecutive NMOS/PMOS configured active fins 612(X), second active region 650(2) includes one PMOS/NMOS configured active fin 612(X), and third active region 650(3) includes one PMOS/NMOS configured active fins 612(X). Cell 604 is organized into a first active region 650(1)' and a second active region 650(2)'. First active region 650(1)' includes one or more consecutive NMOS/PMOS configured active fins 612(X). Second active region 650(2)' includes one or more PMOS/NMOS configured active fins 612(X). As shown in FIG. 6, first active region 650(1)' includes one NMOS/PMOS configured active fin 612(X) and second active region 650(2)' includes one PMOS/NMOS configured active fin 612(X). Other numbers of active fins and/or locations of active fins are contemplated for each of first active region 650(1), second active region 650(2) and third active region 650(3), and correspondingly for first active region 650(1)' and second active region 650(2)', e.g., in light of the various numbers of active fins and/or various locations of active fins shown in FIGS. 7A-7D, 8A-8D, 9A-9D, 10A-10C, 11A-11D, 12A-12C and 13A-13L discussed below, and the like.

In FIG. 6, cell 604 has a first edge 661(1), a second edge 661(2), a third edge 661(3) and a fourth edge 661(4). Third edge 661(3) of cell 604 is substantially collinear with a reference line 605'. Cell 608 is based on a stack relative to the vertical direction, of first and second copies (not shown) of cell 604. Cell 608 has a first edge 621(1), a second edge 621(2), a third edge 621(3) and a fourth edge 621(4). In effect, using reference line 605' as an axis of rotation, the first copy of cell 604 is rotated 180 degrees about reference line 605' and located so that third edge 661(3) of the first copy of cell 604 is collinear with a reference line 605. Also, in effect, the second copy of cell 604 is oriented the same as cell 604 and is stacked on the first copy of cell 604 so that third edge 661(3) of the second copy of cell 604 is collinear with a reference line 605. As a result, second active region 650(2) in cell 608 corresponds to second active region 650(2)' in the second copy of cell 604, third active region 650(3) in cell 608 corresponds to second active region 650(2)' in the first copy of cell 604, a first portion of first active region 650(1) in cell 608 corresponds in part to first active region 650(1)' in the second copy of cell 604; and a second portion of first active region 650(1) in cell 608 corresponds in part to first active region 650(1)' in the first copy of cell 604.

In cell 608, first active region 650(1) further includes a third portion, relative to the vertical direction, between the first and second portions. The third portion of first active regions 650(1) includes one or more bonus fins. As shown in FIG. 6, the third portion of first active region 650(1) includes one bonus NMOS/PMOS configured active fin 612(X). Other numbers of bonus active fins are contemplated for first active region 650(1), e.g., in light of the various numbers of bonus active fins shown in FIGS. 7A-7D, 8A-8D, 9A-9D, 10A-10C, 11A-11D, 12A-12C and 13A-13L discussed below, and the like.

Reference line 605, relative to the vertical direction, represents a midline of cell 608. Relative to reference line 605, cell 608 is mirror symmetric.

FIGS. 7A-7D are combination diagrams showing how layout diagrams 700A-700D relate to 'building blocks' in the form of corresponding layout diagrams 700A'-700D', in accordance with some embodiments.

Each of layout diagrams 700A-700D is similar, e.g., to layout diagram 600 of FIG. 6. Each of layout diagrams 700A'-700D' is similar, e.g., to layout diagram 600' of FIG. 6.

Layout diagrams 700A-700D include corresponding double height cells 708A-708D and 704A-704D. Semiconductor device 100 of FIG. 1 is an example of a semiconductor devices resulting from layout diagrams which correspondingly include cells 708A-708D, wherein cell region 104 of semiconductor device 100 results from corresponding cells 708A-708D. Cells 708A-708D are summarized in corresponding rows 6-9 of the table appearing below.

Cells 708A-708D are similar, e.g., to cell 608 of FIG. 6, but cells 708A-708D also differ from 608 in terms of differing numbers of active fins in first active regions 750A(1)-750D(1), second active regions 750A(2)-750D(2) and third active regions 750A(3)-750D(3) and/or differing positions (relative to the vertical direction) of first active regions 750A(1)-750D(1), second active regions 750A(2)-750D(2) and third active regions 750A(3)-750D(3). Cells 704A-704D are similar, e.g., to cell 604 of FIG. 6, but cells 704A-704D also differ from 604 in terms of differing numbers of active fins in first active regions 750A(1)'-750D(1)' and second active regions 750A(2)'-750(2)' and/or differing positions (relative to the vertical direction) of first active regions 750A(1)'-750D(1)' and second active regions 750A(2)'-750D(2)'.

FIGS. 8A-8D are combination diagrams showing how layout diagrams 800A-800D relate to 'building blocks' in the form of corresponding layout diagrams 800A'-800D', in accordance with some embodiments.

Each of layout diagrams 800A-800D is similar, e.g., to layout diagram 600 of FIG. 6. Each of layout diagrams 800A'-800D' is similar, e.g., to layout diagram 600' of FIG. 6.

Layout diagrams 800A-800D include corresponding double height cells 808A-808D and 804A-804D. Semiconductor device 100 of FIG. 1 is an example of a semiconductor devices resulting from layout diagrams which correspondingly include cells 808A-808D, wherein cell region 104 of semiconductor device 100 results from corresponding cells 808A-808D. Cells 808A-808D are summarized in corresponding rows 10-13 of the table appearing below.

Cells 808A-808D are similar, e.g., to cell 608 of FIG. 6, but cells 808A-808D also differ from 608 in terms of differing numbers of active fins in first active regions 850A(1)-850D(1), second active regions 850A(2)-850D(2) and third active regions 850A(3)-850D(3) and/or differing positions (relative to the vertical direction) of first active regions 850A(1)-850D(1), second active regions 850A(2)-850D(2) and third active regions 850A(3)-850D(3). Cells 804A-804D are similar, e.g., to cell 604 of FIG. 6, but cells 804A-804D also differ from 604 in terms of differing numbers of active fins in first active regions 850A(1)'-850D(1)' and second active regions 850A(2)'-850(2)' and/or differing positions (relative to the vertical direction) of first active regions 850A(1)'-850D(1)' and second active regions 850A(2)'-850D(2)'.

FIGS. 9A-9D are combination diagrams showing how layout diagrams 900A-900D relate to 'building blocks' in the form of corresponding layout diagrams 900A'-900D', in accordance with some embodiments.

Each of layout diagrams 900A-900D is similar, e.g., to layout diagram 600 of FIG. 6. Each of layout diagrams 900A'-900D' is similar, e.g., to layout diagram 600' of FIG. 6. Also, FIG. 9D corresponds in some respects to FIG. 2A.

Layout diagrams 900A-900D include corresponding double height cells 908A-908D and 904A-904D. Semiconductor device 100 of FIG. 1 is an example of a semiconductor devices resulting from layout diagrams which correspondingly include cells 908A-908D, wherein cell region 104 of semiconductor device 100 results from corresponding cells 908A-908D. Cells 908A-908D are summarized in corresponding rows 14-17 of the table appearing below.

Cells 908A-908D are similar, e.g., to cell 608 of FIG. 6, but cells 908A-908D also differ from 608 in terms of differing numbers of active fins in first active regions 950A(1)-950D(1), second active regions 950A(2)-950D(2) and third active regions 950A(3)-950D(3) and/or differing positions (relative to the vertical direction) of first active regions 950A(1)-950D(1), second active regions 950A(2)-950D(2) and third active regions 950A(3)-950D(3). It is noted that cell 908D corresponds to cell 208A of FIG. 2A and cell 208B of FIG. 2B. Cells 904A-904D are similar, e.g., to cell 604 of FIG. 6, but cells 904A-904D also differ from 604 in terms of differing numbers of active fins in first active regions 950A(1)'-950D(1)' and second active regions 950A(2)'-950(2)' and/or differing positions (relative to the vertical direction) of first active regions 950A(1)'-950D(1)' and second active regions 950A(2)'-950D(2)'.

Figures 10A, 10B:
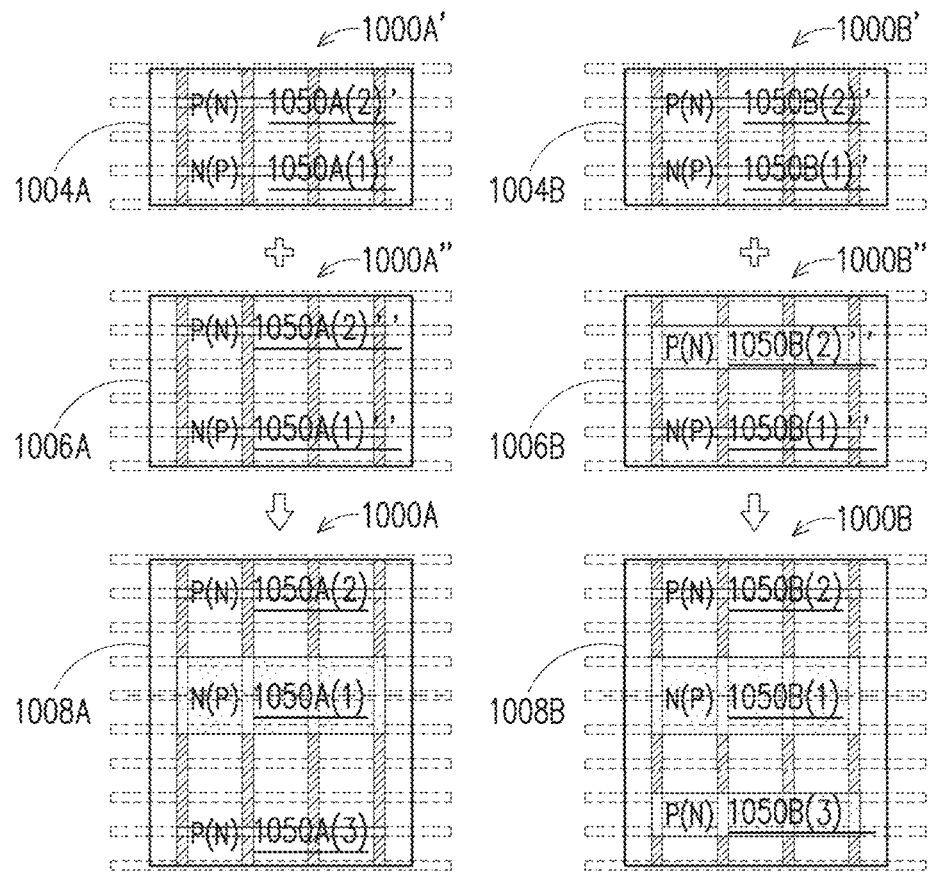
FIGS. 10A-10C are combination diagrams showing how first layout diagrams relate to corresponding 'building blocks' in the form of corresponding second layout diagrams, in accordance with some embodiments.
Figure 10C:
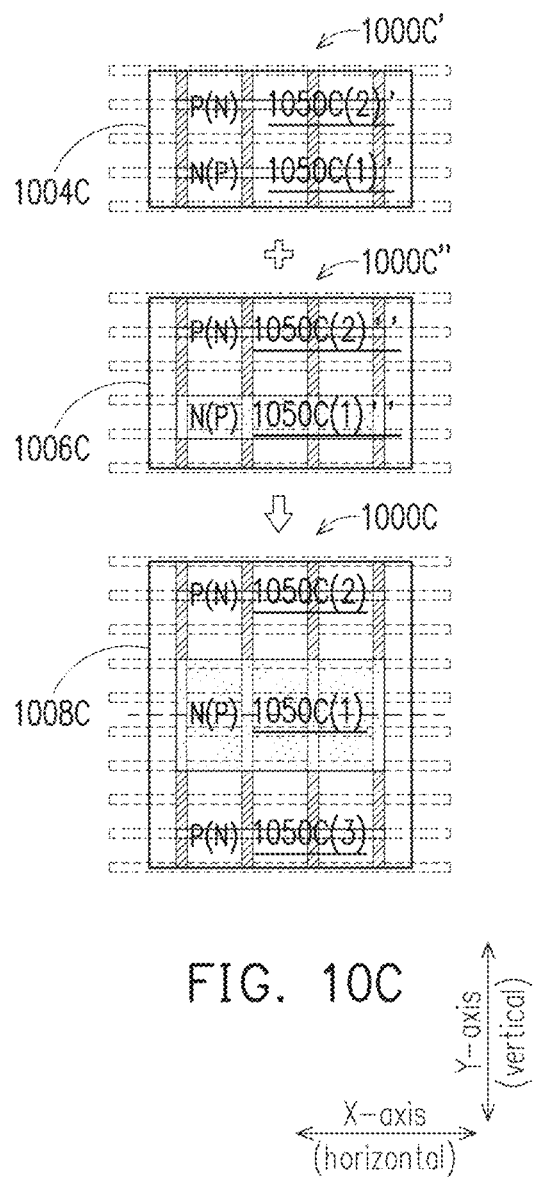
Figure 11A:
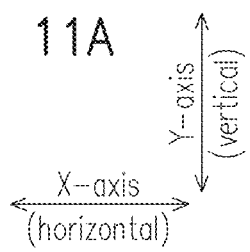
FIGS. 11A-11D are combination diagrams showing how first layout diagrams relate to corresponding 'building blocks' in the form of corresponding second layout diagrams, in accordance with some embodiments.
Figure 11B:
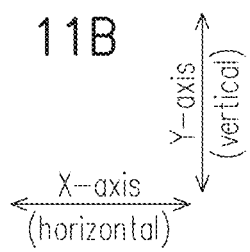
Figure 11C:
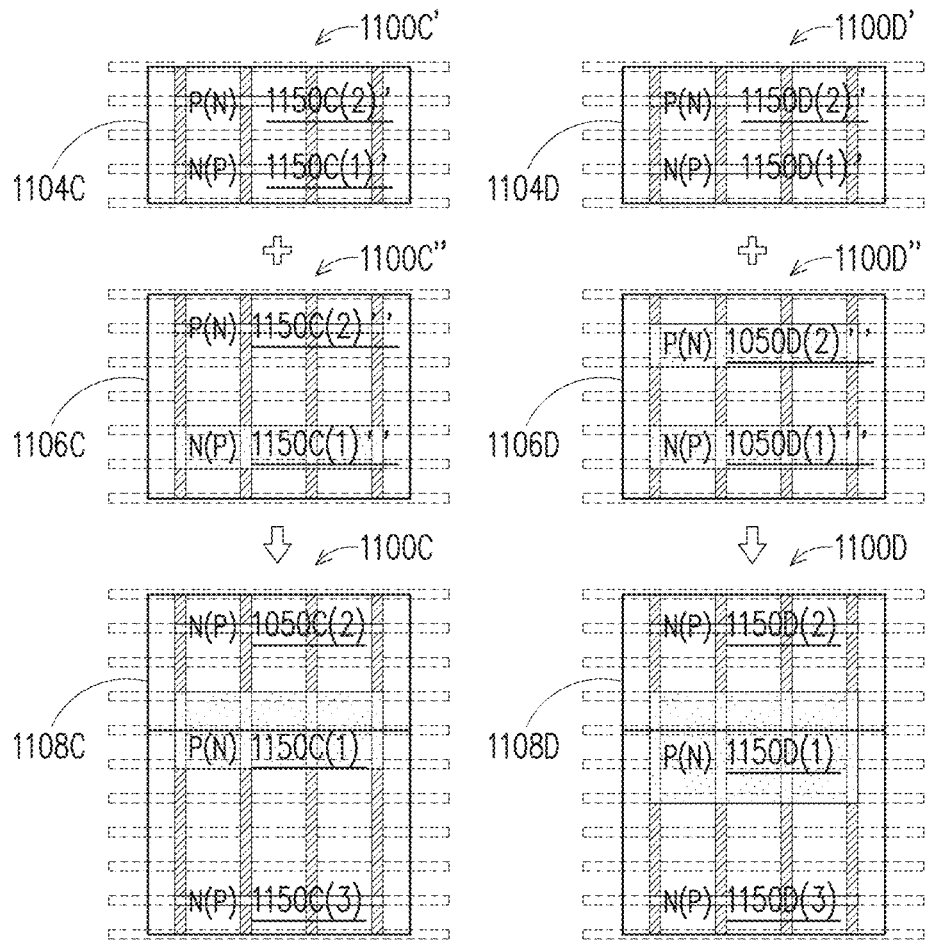
Figure 11C:
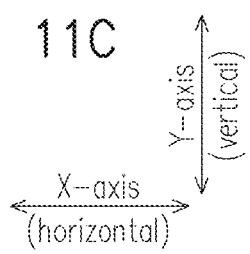
Figure 11D:
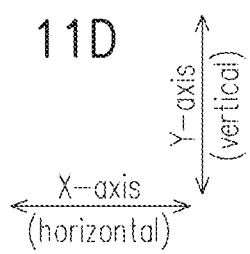

FIGS. 10A-10C are combination diagrams showing how layout diagrams 1000A-1000C relate to 'building blocks' in the form of corresponding layout diagrams 1000A'-1000C', in accordance with some embodiments.

Each of layout diagrams 1000A-1000C is similar, e.g., to layout diagram 600 of FIG. 6. Each of layout diagrams 1000A'-1000C' is similar, e.g., to layout diagram 600' of FIG. 6. Layout diagrams 1000A'-1000C' are similar, e.g., to corresponding layout diagrams 800A'-800C' of corresponding FIGS. 8A-8C.

Layout diagrams 1000A-1000C include corresponding double height cells 1008A-1008C and 1004A-1004C. Semiconductor device 100 of FIG. 1 is an example of a semiconductor devices resulting from layout diagrams which correspondingly include cells 1008A-1008C, wherein cell region 104 of semiconductor device 100 results from corresponding cells 1008A-1008C. Cells 1008A-1008C are summarized in corresponding rows 18-20 of the table appearing below.

Cells 1008A-1008C are similar, e.g., to cell 608 of FIG. 6, but cells 1008A-1008C also differ from 608 in terms of differing numbers of active fins in first active regions 1050A(1)-1050C(1), second active regions 1050A(2)-1050C(2) and third active regions 1050A(3)-1050C(3) and/or differing positions (relative to the vertical direction) of first active regions 1050A(1)-1050C(1), second active regions 1050A(2)-1050C(2) and third active regions 1050A(3)-1050C(3). Cells 1004A-1004C are similar, e.g., to cell 604 of FIG. 6, but cells 1004A-1004C also differ from 604 in terms of differing numbers of active fins in first active regions 1050A(1)'-1050C(1)' and second active regions 1050A(2)'-1050C(2)' and/or differing positions (relative to the vertical direction) of first active regions 1050A(1)'-1050C(1)' and second active regions 1050A(2)'-1050C(2)'.

FIGS. 11A-11D are combination diagrams showing how layout diagrams 1100A-1100D relate to 'building blocks' in the form of corresponding layout diagrams 1100A'-1100D', in accordance with some embodiments.

Each of layout diagrams 1100A-1100D is similar, e.g., to layout diagram 600 of FIG. 6. Each of layout diagrams 1100A'-1100D' is similar, e.g., to layout diagram 600' of FIG. 6. Layout diagrams 1100A'-1100D' are similar, e.g., to corresponding layout diagrams 900A'-900D' of corresponding FIGS. 9A-9D.

Layout diagrams 1100A-1100D include corresponding double height cells 1108A-1108D and 1104A-1104D. Semiconductor device 100 of FIG. 1 is an example of a semiconductor devices resulting from layout diagrams which correspondingly include cells 1108A-1108D, wherein cell region 104 of semiconductor device 100 results from corresponding cells 1108A-1108D. Cells 1108A-1108D are summarized in corresponding rows 21-24 of the table appearing below.

Cells 1108A-1108D are similar, e.g., to cell 608 of FIG. 6, but cells 1108A-1108D also differ from 608 in terms of differing numbers of active fins in first active regions 1150A(1)-1150D(1), second active regions 1150A(2)-1150D(2) and third active regions 1150A(3)-1150D(3) and/or differing positions (relative to the vertical direction) of first active regions 1150A(1)-1150D(1), second active regions 1150A(2)-1150D(2) and third active regions 1150A(3)-1150D(3). Cells 1104A-1104D are similar, e.g., to cell 604 of FIG. 6, but cells 1104A-1104D also differ from 604 in terms of differing numbers of active fins in first active regions 1150A(1)'-1150D(1)' and second active regions 1150A(2)'-1150(2)' and/or differing positions (relative to the vertical direction) of first active regions 1150A(1)'-1150D(1)' and second active regions 1150A(2)'-1150D(2)'.

Figure 12A:
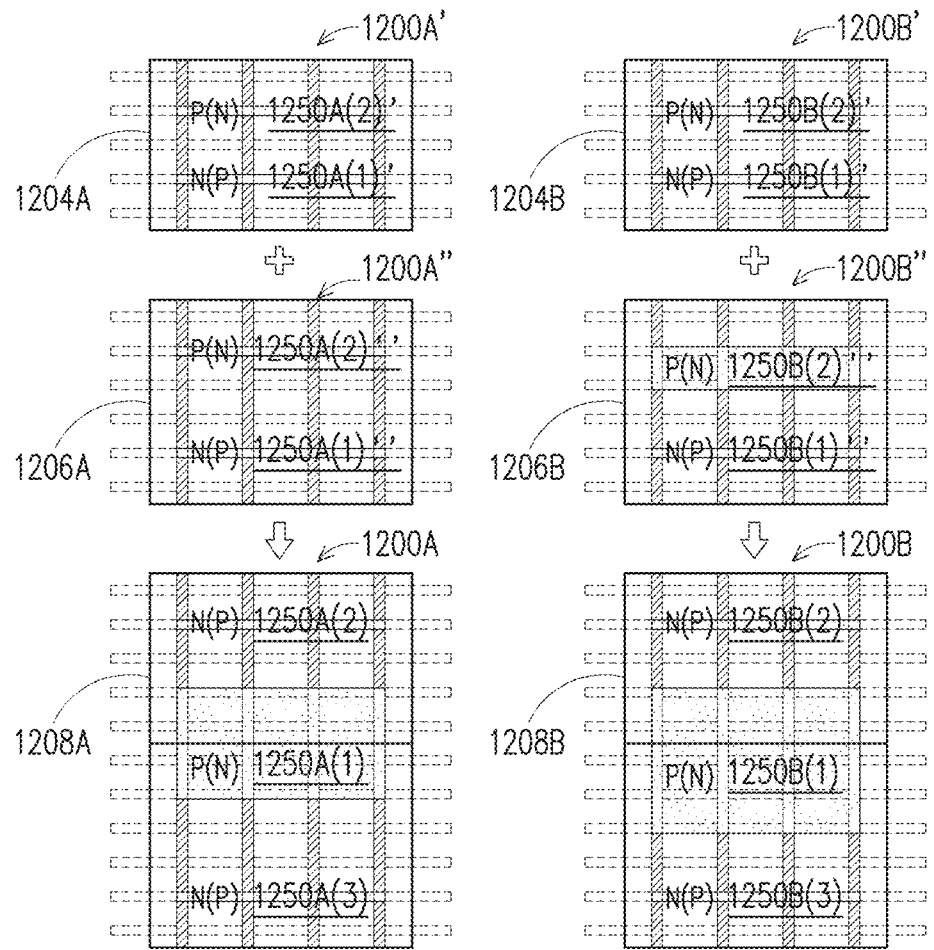
FIGS. 12A-12C are combination diagrams showing how first layout diagrams relate to corresponding 'building blocks' in the form of corresponding second layout diagrams, in accordance with some embodiments.
Figure 12A:
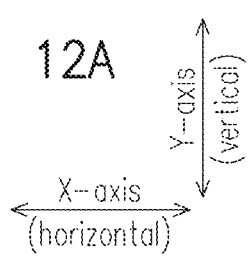
Figure 12B:
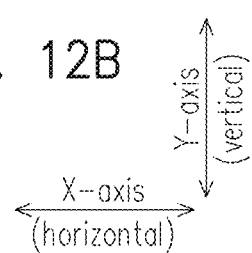
Figure 12C:
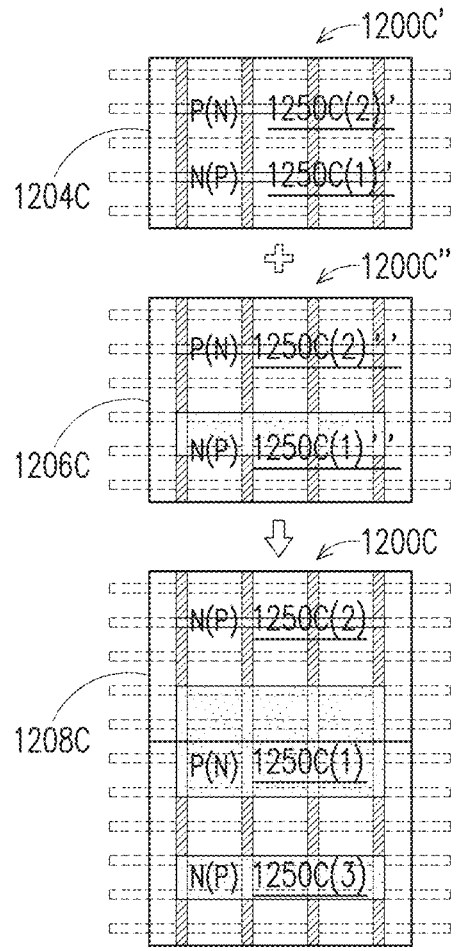
Figures 13A, 13B:
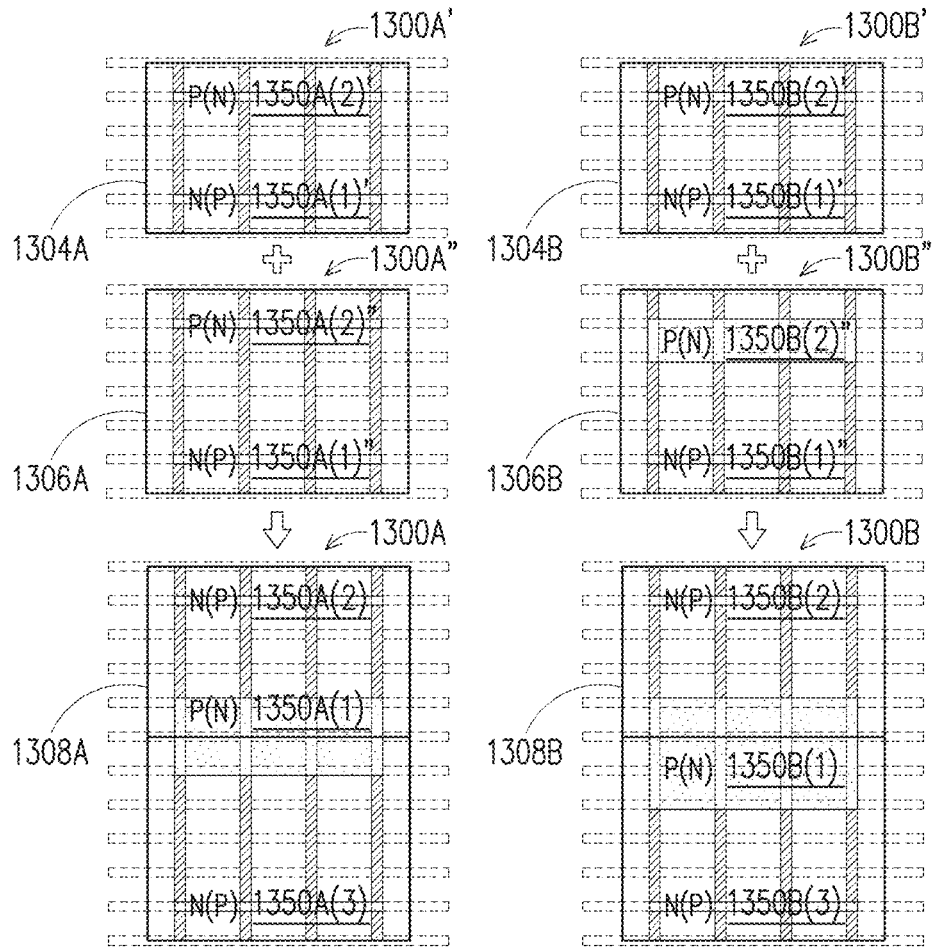
Figures 13C, 13D:
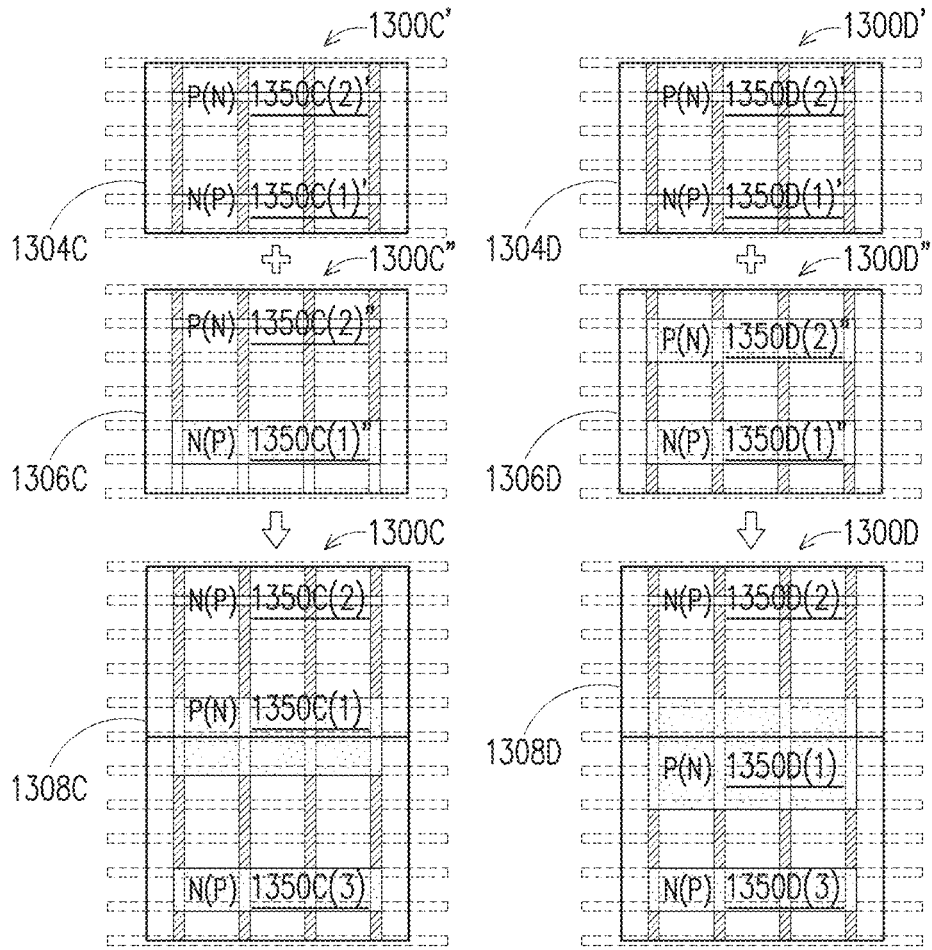
Figures 13E, 13F:
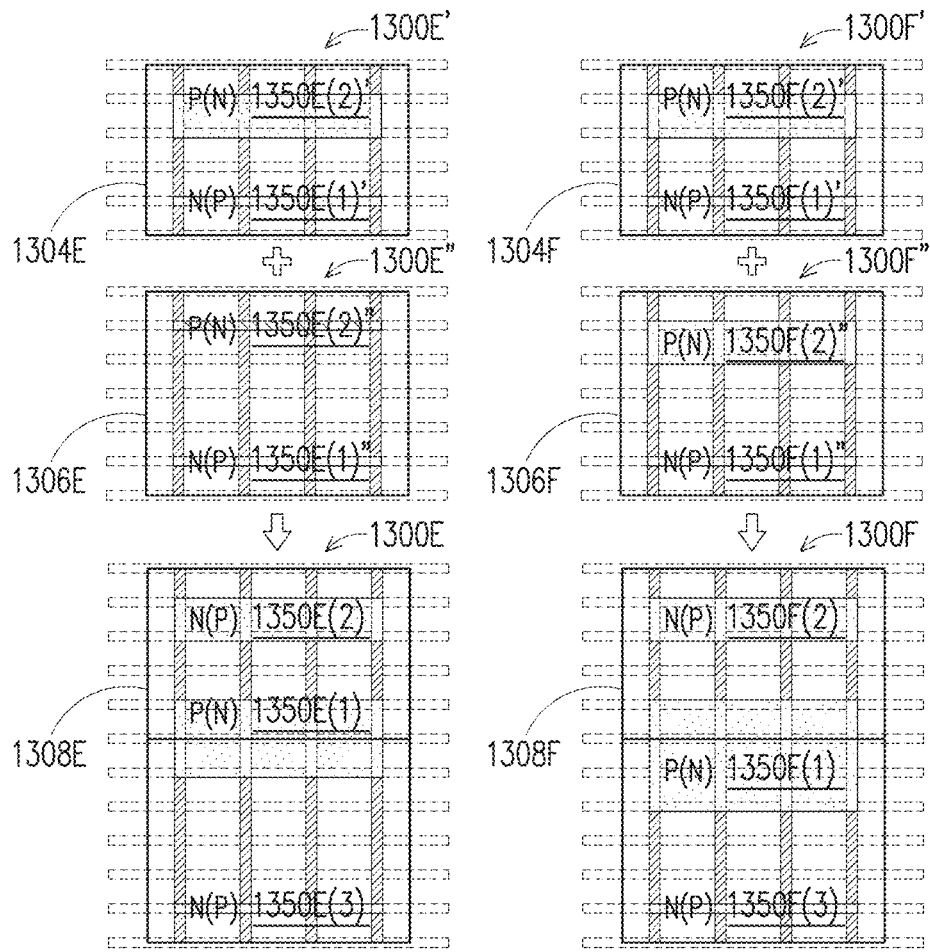
Figures 13G, 13H:
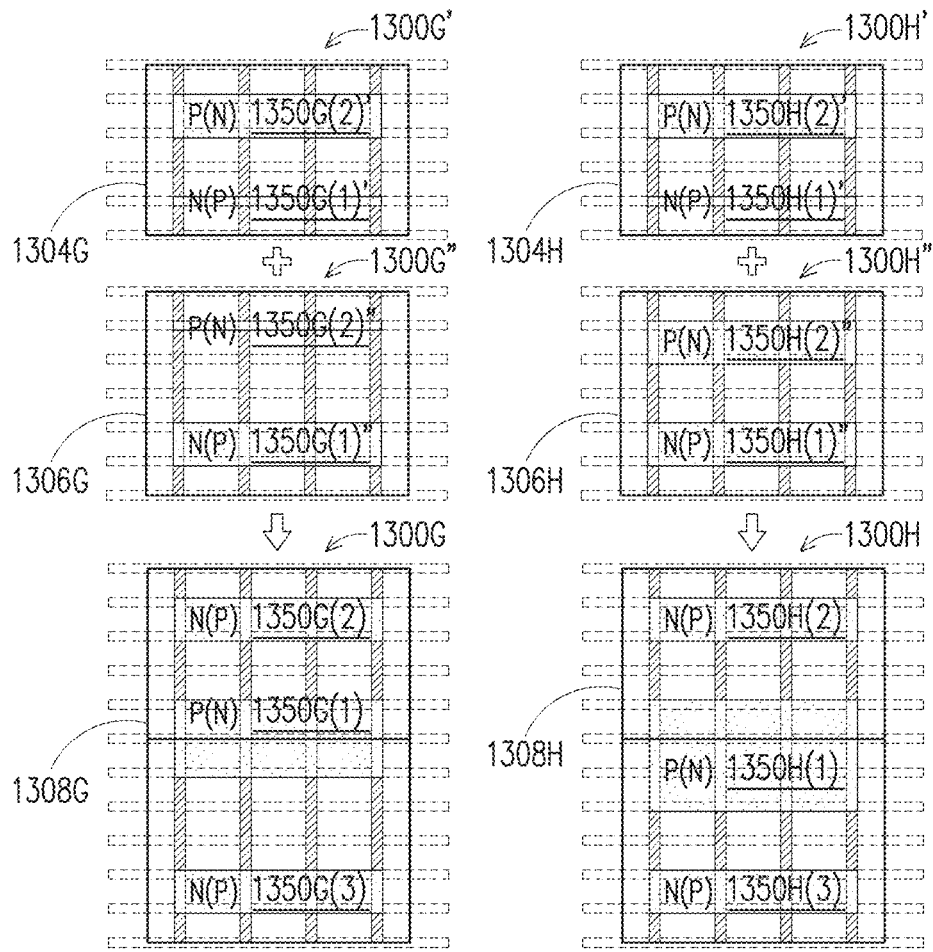
Figures 13I, 13J:
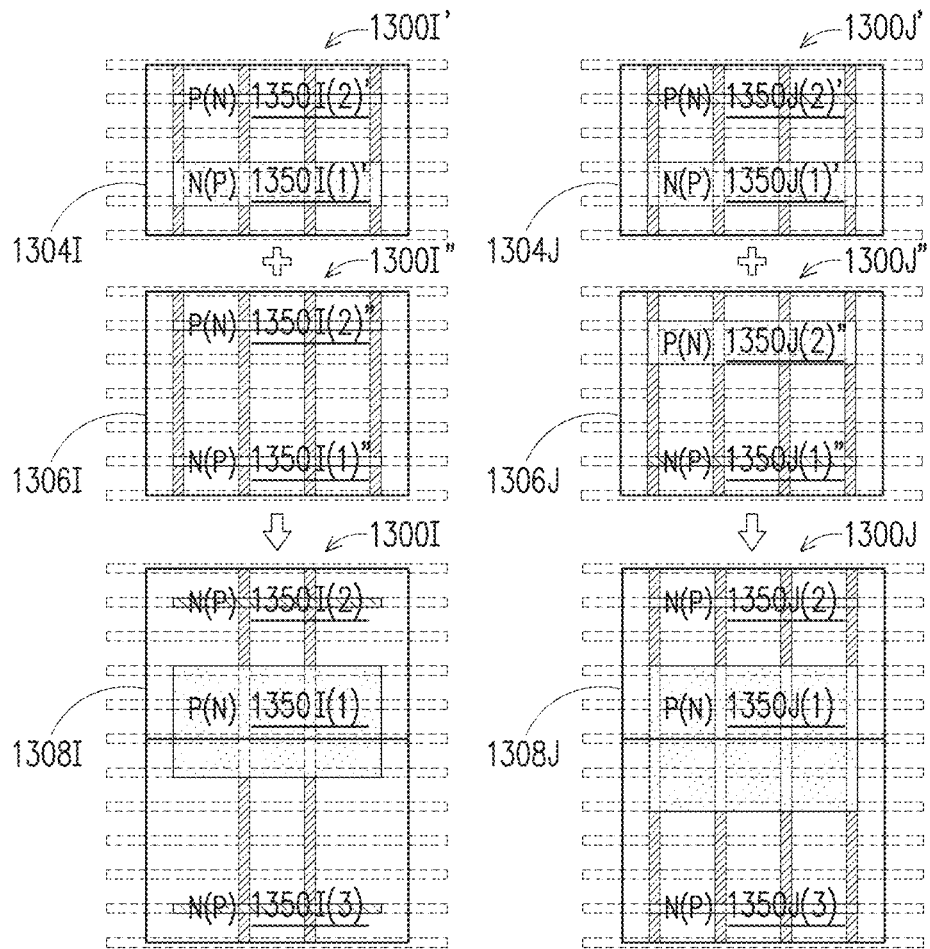

FIGS. 12A-12C are combination diagrams showing how layout diagrams 1200A-1200C relate to 'building blocks' in the form of corresponding layout diagrams 1200A'-1200C', in accordance with some embodiments.

Figures 7A, 7B:
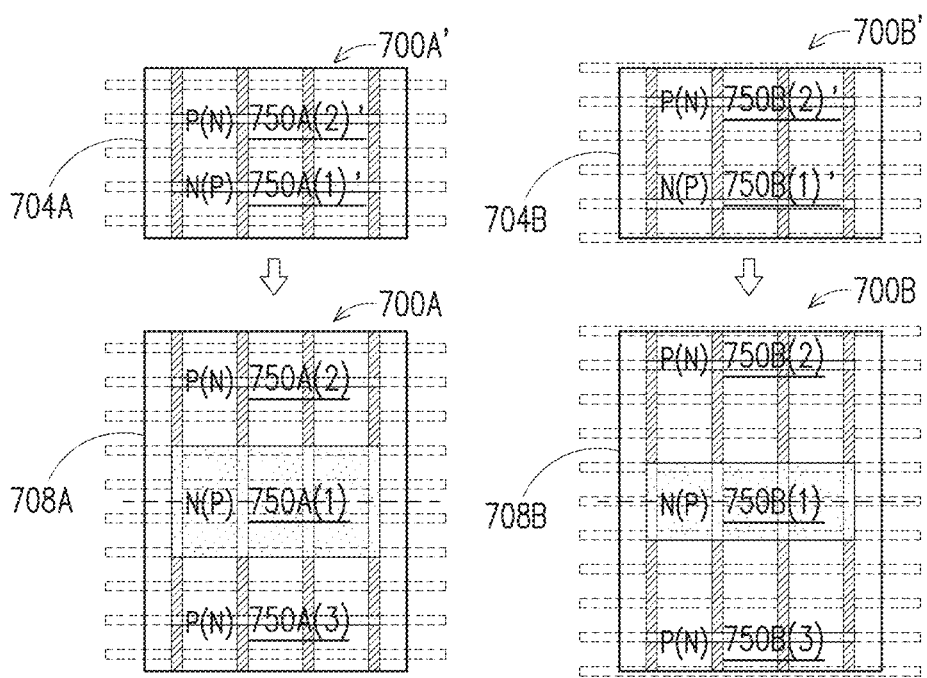
FIGS. 7A-7D are combination diagrams showing how first layout diagrams relate to corresponding 'building blocks' in the form of corresponding second layout diagrams, in accordance with some embodiments.
Figures 8C, 8D:
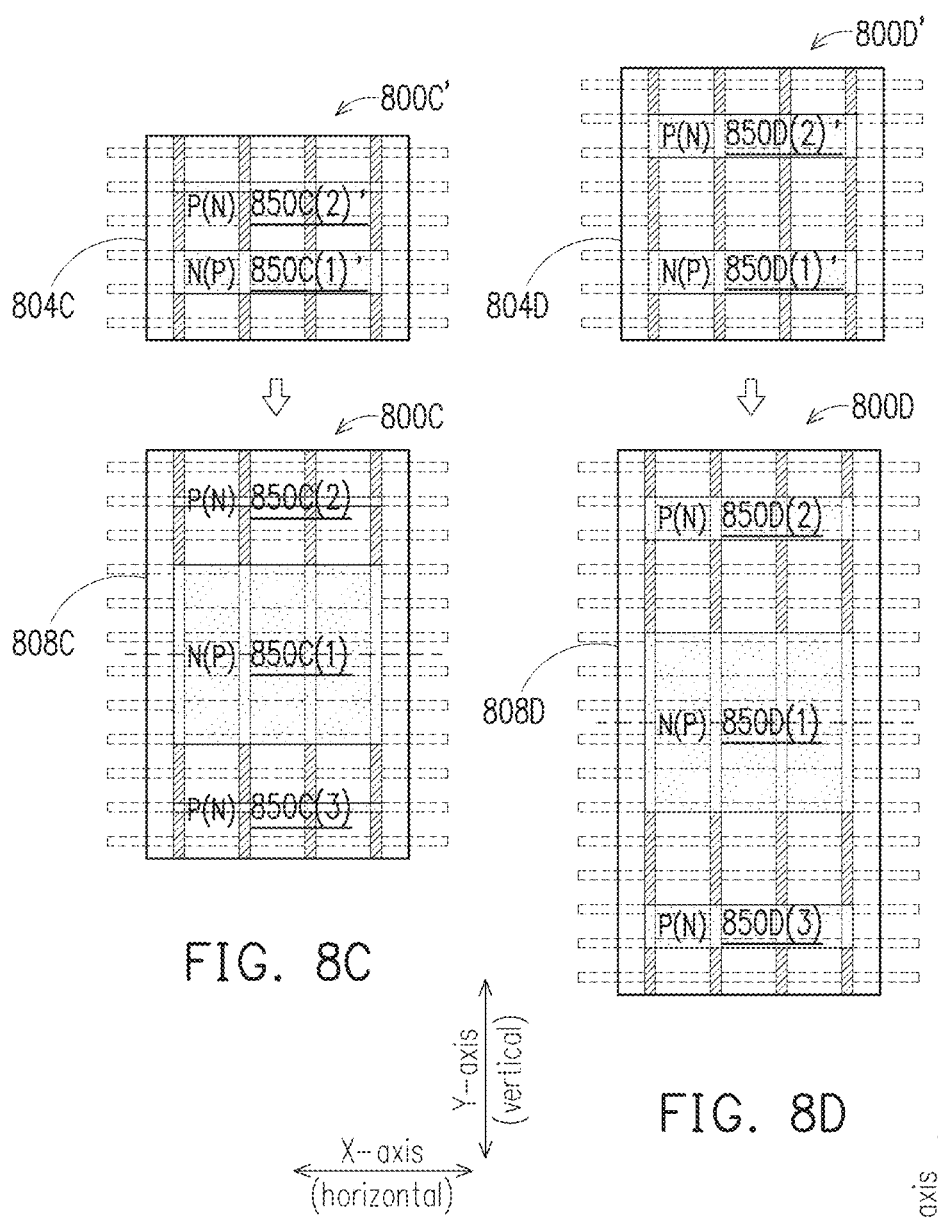

Layout diagrams 1200A-1200C are similar, e.g., to corresponding layout diagrams 800A-800C of corresponding FIGS. 8A-8C. Each of layout diagrams is 1200A'-1200C' is similar, e.g., to layout diagram 700A' of FIG. 7A. Layout diagrams 1200A"-1200C" are similar, e.g., to corresponding layout diagrams 800A'-800C' of corresponding FIGS. 8A-8C.

Layout diagrams 1200A-1200C include corresponding double height cells 1208A-1208C and 1204A-1204C. Semiconductor device 100 of FIG. 1 is an example of a semiconductor devices resulting from layout diagrams which correspondingly include cells 1208A-1208C, wherein cell region 104 of semiconductor device 100 results from corresponding cells 1208A-1208C. Cells 1208A-1208C are summarized in corresponding rows 25-27 of the table appearing below.

Cells 1208A-1208C are similar, e.g., to cell 608 of FIG. 6, but cells 1208A-1208C also differ from 608 in terms of differing numbers of active fins in first active regions 1250A(1)-1250C(1), second active regions 1250A(2)-1250C(2) and third active regions 1250A(3)-1250C(3) and/or differing positions (relative to the vertical direction) of first active regions 1250A(1)-1250C(1), second active regions 1250A(2)-1250C(2) and third active regions 1250A(3)-1250C(3). Cells 1204A-1204C are similar, e.g., to cell 604 of FIG. 6, but cells 1204A-1204C also differ from 604 in terms of differing numbers of active fins in first active regions 1250A(1)'-1250C(1)' and second active regions 1250A(2)'-1250(2)' and/or differing positions (relative to the vertical direction) of first active regions 1250A(1)'-1250C(1)' and second active regions 1250A(2)'-1250C(2)'.

FIGS. 13A-13D are combination diagrams showing how layout diagrams 1300A-1300D relate to 'building blocks' in the form of corresponding layout diagrams 1300A'-1300D', in accordance with some embodiments.

Figures 9C, 9D:
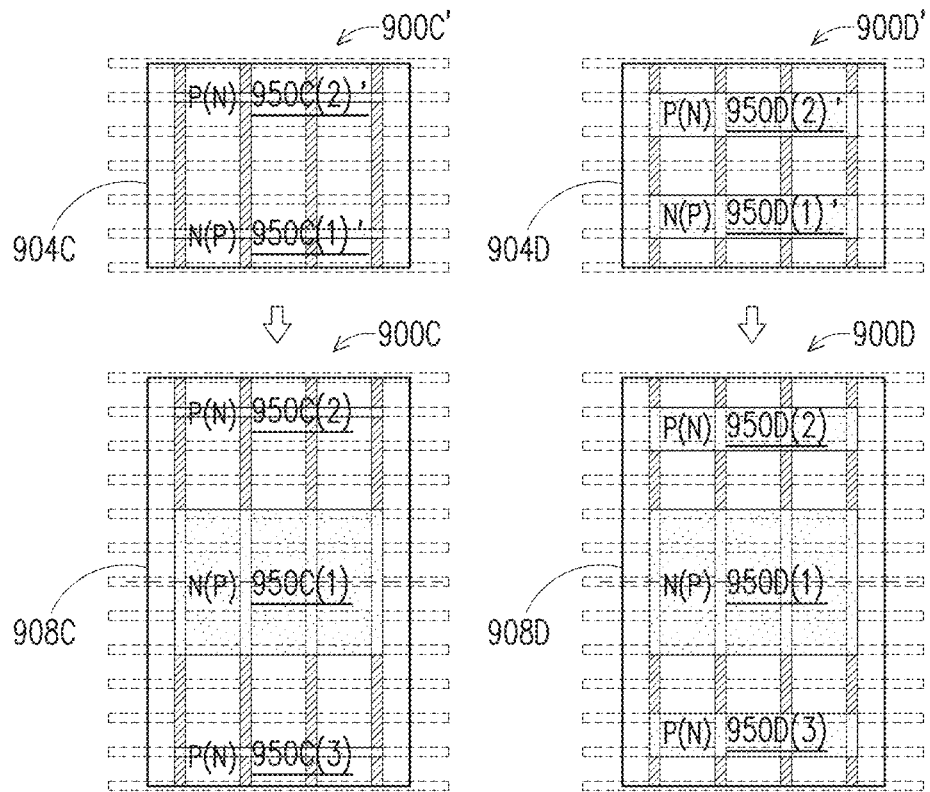

Layout diagram 1300A is similar, e.g., to layout diagram 900A of FIG. 9A. Layout diagram 1300B is similar, e.g., to layout diagram 900C of FIG. 9C. Layout diagram 1300C is similar, e.g., to layout diagrams 900A-900B of corresponding FIGS. 9A-9B. Layout diagram 1300D is similar, e.g., to layout diagrams 900C-900D of corresponding FIGS. 9C-9D.

Each of layout diagrams 1300A'-1300D' is similar, e.g., to layout diagram 700B' of FIG. 7B. Layout diagram 1300A" is similar, e.g., to layout diagram 900A' of FIG. 9A. Layout diagram 1300B" is similar, e.g., to layout diagram 900B' of FIG. 9B. Layout diagram 1300C" is similar, e.g., to layout diagram 900C' of FIG. 9C. Layout diagram 1300D" is similar, e.g., to layout diagram 900D' of FIG. 9D.

Layout diagrams 1300A-1300D include corresponding double height cells 1308A-1308D and 1304A-1304D. Semiconductor device 100 of FIG. 1 is an example of a semiconductor devices resulting from layout diagrams which correspondingly include cells 1308A-1308D, wherein cell region 104 of semiconductor device 100 results from corresponding cells 1308A-1308D. Cells 1308A-1308D are summarized in corresponding rows 28-31 of the table appearing below.

Cells 1308A-1308D are similar, e.g., to cell 608 of FIG. 6, but cells 1308A-1308D also differ from 608 in terms of differing numbers of active fins in first active regions 1350A(1)-1350D(1), second active regions 1350A(2)-1350D(2) and third active regions 1350A(3)-1350D(3) and/or differing positions (relative to the vertical direction) of first active regions 1350A(1)-1350D(1), second active regions 1350A(2)-1350D(2) and third active regions 1350A(3)-1350D(3). Cells 1304A-1304D are similar, e.g., to cell 604 of FIG. 6, but cells 1304A-1304D also differ from 604 in terms of differing numbers of active fins in first active regions 1350A(1)'-1350D(1)' and second active regions 1350A(2)'-1350(2)' and/or differing positions (relative to the vertical direction) of first active regions 1350A(1)'-1350D(1)' and second active regions 1350A(2)'-1350D(2)'.

FIGS. 13E-13H are combination diagrams showing how layout diagrams 1300E-1300H relate to 'building blocks' in the form of corresponding layout diagrams 1300E'-1300H', in accordance with some embodiments.

Layout diagram 1300E is similar, e.g., to layout diagrams 900A-900B of corresponding FIGS. 9A-9B. Layout diagram 1300F is similar, e.g., to layout diagrams 900C-900D of corresponding FIGS. 9C-9D. Layout diagram 1300G is similar, e.g., to layout diagram 900B of FIG. 9B. Layout diagram 1300H is similar, e.g., to layout diagrams 900B and 900D of corresponding FIGS. 9B and 9D.

Figures 7C, 7D:
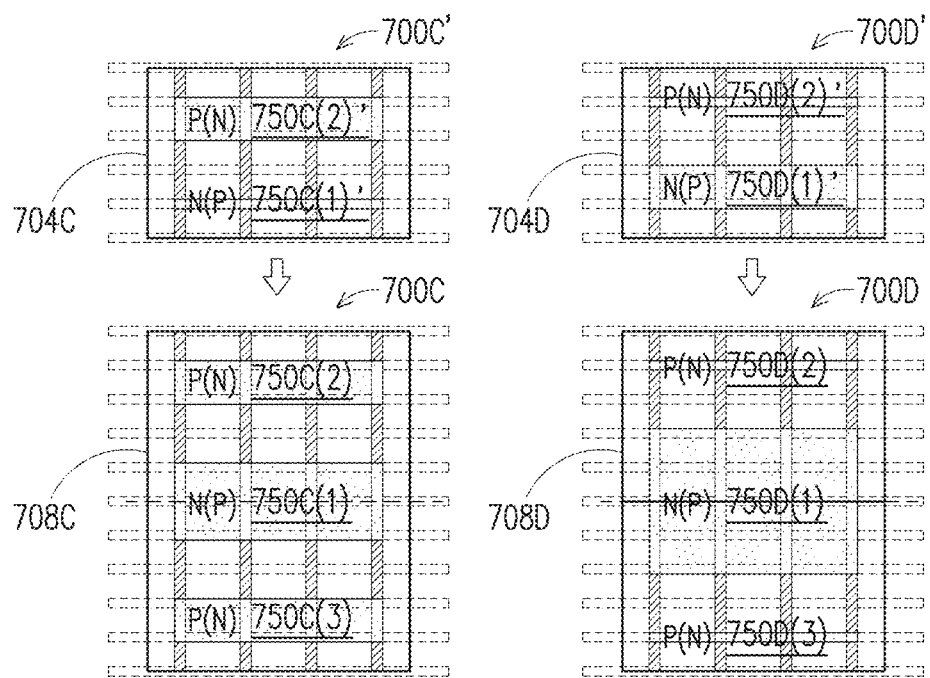

Each of layout diagrams 1300E'-1300H' is similar, e.g., to layout diagram 700C' of FIG. 7C. Layout diagram 1300E" is similar, e.g., to layout diagram 900A' of FIG. 9A. Layout diagram 1300F" is similar, e.g., to layout diagram 900B' of FIG. 9B. Layout diagram 1300G" is similar, e.g., to layout diagram 900C' of FIG. 9C. Layout diagram 1300H" is similar, e.g., to layout diagram 900D' of FIG. 9D.

Layout diagrams 1300E-1300H include corresponding double height cells 1308E-1308H and 1304E-1304H. Semiconductor device 100 of FIG. 1 is an example of a semiconductor devices resulting from layout diagrams which correspondingly include cells 1308E-1308H, wherein cell region 104 of semiconductor device 100 results from corresponding cells 1308E-1308H. Cells 1308E-1308H are summarized in corresponding rows 28-31 of the table appearing below.

Cells 1308E-1308H are similar, e.g., to cell 608 of FIG. 6, but cells 1308E-1308H also differ from 608 in terms of differing numbers of active fins in first active regions 1350E(1)-1350H(1), second active regions 1350E(2)-1350H(2) and third active regions 1350E(3)-1350H(3) and/or differing positions (relative to the vertical direction) of first active regions 1350E(1)-1350H(1), second active regions 1350E(2)-1350H(2) and third active regions 1350E(3)-1350H(3). Cells 1304E-1304H are similar, e.g., to cell 604 of FIG. 6, but cells 1304E-1304H also differ from 604 in terms of differing numbers of active fins in first active regions 1350E(1)'-1350H(1)' and second active regions 1350E(2)'-1350(2)' and/or differing positions (relative to the vertical direction) of first active regions 1350E(1)'-1350H(1)' and second active regions 1350E(2)'-1350H(2)'.

FIGS. 13I-13L are combination diagrams showing how layout diagrams 1300I-1300L relate to 'building blocks' in the form of corresponding layout diagrams 1300I'-1300L', in accordance with some embodiments.

Layout diagram 1300I is similar, e.g., to layout diagrams 900A and 900C of corresponding FIGS. 9A and 9C. Layout diagram 1300J is similar, e.g., to layout diagram 900C of FIG. 9C. Layout diagram 1300K is similar, e.g., to layout diagrams 900B and 900C of corresponding FIGS. 9B and 9C. Layout diagram 1300L is similar, e.g., to layout diagrams 900C and 900D of corresponding FIGS. 9C and 9D.

Each of layout diagrams 1300I'-1300L' is similar, e.g., to layout diagram 700D' of FIG. 7D. Each of layout diagrams 1300A", 1300E" and 1300I" is similar, e.g., to layout diagram 900A' of FIG. 9A. Each of layout diagrams 1300B", 1300F" and 1300J" is similar, e.g., to layout diagram 900B' of FIG. 9B. Each of layout diagrams 1300C", 1300G" and 1300K" is similar, e.g., to layout diagram 900C' of FIG. 9C. Each of layout diagrams 1300D", 1300H" and 1300L" is similar, e.g., to layout diagram 900D' of FIG. 9D.

Layout diagrams 1300I-1300L include corresponding double height cells 1308I-1308L and 1304I-1304L. Semiconductor device 100 of FIG. 1 is an example of a semiconductor devices resulting from layout diagrams which correspondingly include cells 1308I-1308L, wherein cell region 104 of semiconductor device 100 results from corresponding cells 1308I-1308L. Cells 1308I-1308L are summarized in corresponding rows 28-31 of the table appearing below.

Cells 1308I-1308L are similar, e.g., to cell 608 of FIG. 6, but cells 1308I-1308L also differ from 608 in terms of differing numbers of active fins in first active regions 1350I(1)-1350L(1), second active regions 1350I(2)-1350L(2) and third active regions 1350I(3)-1350L(3) and/or differing positions (relative to the vertical direction) of first active regions 1350I(1)-1350L(1), second active regions 1350I(2)-1350L(2) and third active regions 1350I(3)-1350L(3). Cells 1304I-1304L are similar, e.g., to cell 604 of FIG. 6, but cells 1304I-1304L also differ from 604 in terms of differing numbers of active fins in first active regions 1350I(1)'-1350L(1)' and second active regions 1350I(2)'-1350(2)' and/or differing positions (relative to the vertical direction) of first active regions 1350I(1)'-1350L(1)' and second active regions 1350I(2)'-1350L(2)'.

Some of the attributes of cells 208A-208D, 608, 708A-708D, 808A-808D, 908A-908D, 1008A-1008C, 1108A-1108D, 1208A-1208C and 1308A-1308L of corresponding FIGS. of corresponding FIGS. 2A-2B are summarized in the following table. Similarly, some of the attributes of cells 200A-200B of corresponding FIGS. 2A-2D, 6, 7A-7D, 8A-8C, 9A-9D, 10A-10C, 11A-11D, 12A-12C and 13A-13L (discussed above) also are summarized in the following table.

More particularly regarding the following table, row numbers 1-39 list information about the cells shown in corresponding FIGS. 2A-2D, 6, 7A-7D, 8A-8C, 9A-9D, 10A-10C, 11A-11D, 12A-12C and 13A-13L (discussed above). For a given cell (as indicated by a corresponding row in the table), columns 3, 4 and 5 of the table indicate the number of active fins correspondingly located in the second active region x50y(2), the first active region x50y(1), and the third active region x50y(3). For example, row 7 of the table refers to cell 708B of FIG. 7B such that: in column 3, regarding "x50y(2)," x=7 and y=B, hence column 3 refers to second active region 750B(2), which has 1 active fin; in column 4, regarding "x50y(1)," x=7 and y=B, hence column 4 refers to first active region 750B(1), which has 3 active fins; in column 5, regarding "x50y(3)," x=7 and y=B, hence column 5 refers to third active region 750B(3), which has 1 active fin; column 6 indicates that second active region 750A(2) and third active region 750A(3) are symmetric; column 7 indicates that the total ($\Sigma$) number of active and dummy fins in cell 708B is 10; column 8 indicates that a bonus fin is substantially collinear with a midline (relative to the vertical direction) of cell 708B; column 9 indicates that cell 708B includes 1 bonus active fin; and column 10 indicates that first and second dummy fins are substantially collinear with the first (top) and third (bottom) edges of cell 708B resulting in ½ of the first dummy cell and ½ of the second dummy fin being included in cell 708B.

| | | | 3<br>Σ fins<br>in 2nd<br>Active<br>Region<br>x50y(2) | 4<br>Σ fins<br>in 1st<br>Active<br>Region<br>x50y(1) | 5<br>Σ fins<br>in 3rd<br>Active<br>Region<br>x50y(3) | 6<br>2nd:3rd<br>Active<br>Region<br>symmetric? | ↓ Col. # ↓<br>7<br>Σ fins<br>(active<br>and<br>dummy)<br>in cell | 8<br>bonus fin<br>collinear<br>withmidline<br>of cell? | 9<br>Σ<br>bonus<br>fins | 10<br>dummy<br>fin on 1st<br>edge and<br>3rd edge<br>of cell? |
|---|---|---|---|---|---|---|---|---|---|---|
| ↓ Row# | 1<br>FIG. | 2<br>Cell | | | | | | | | |
| 1 | 2A | 208A | 2 | 5 | 2 | yes | 12 | yes | 1 | yes |
| 2 | 2B | 208B | 2 | 5 | 2 | yes | 12 | yes | 1 | yes |
| 3 | 2C | 208C | 2 | 5 | 2 | yes | 12 | yes | 1 | yes |
| 4 | 2D | 208C | 2 | 5 | 2 | yes | 12 | yes | 1 | yes |
| 5 | 6 | 608 | 1 | 3 | 1 | yes | 8 | yes | 1 | yes |
| 6 | 7A | 708A | 1 | 4 | 1 | yes | 10 | no | 2 | no |
| 7 | 7B | 708B | 1 | 3 | 1 | yes | 10 | yes | 1 | yes |
| 8 | 7C | 708C | 2 | 3 | 2 | yes | 10 | yes | 1 | yes |
| 9 | 7D | 708C | 1 | 5 | 1 | yes | 10 | yes | 1 | yes |
| 10 | 8A | 808A | 1 | 4 | 1 | yes | 12 | no | 2 | no |
| 11 | 8B | 808B | 2 | 4 | 2 | yes | 12 | no | 2 | no |
| 12 | 8C | 808C | 1 | 6 | 1 | yes | 12 | no | 2 | no |
| 13 | 8D | 808D | 2 | 6 | 2 | yes | 16 | no | 2 | no |
| 14 | 9A | 908A | 1 | 3 | 1 | yes | 12 | yes | 1 | yes |
| 15 | 9B | 908B | 2 | 3 | 2 | yes | 12 | yes | 1 | yes |
| 16 | 9C | 908C | 1 | 5 | 1 | yes | 12 | yes | 1 | yes |
| 17 | 9D | 908D | 2 | 5 | 2 | yes | 12 | yes | 1 | yes |
| 18 | 10A | 1008A | 1 | 3 | 1 | no | 9 | yes | 1 | yes |
| 19 | 10B | 1008B | 1 | 4 | 1 | no | 9 | yes | 1 | yes |
| 20 | 10C | 1008C | 1 | 3 | 1 | no | 9 | yes | 1 | yes |
| 21 | 11A | 1108A | 1 | 3 | 1 | no | 10 | yes | 1 | yes |
| 22 | 11B | 1108B | 1 | 3 | 1 | no | 10 | yes | 1 | yes |
| 23 | 11C | 1108C | 1 | 3 | 2 | no | 10 | yes | 1 | yes |
| 24 | 11D | 1108D | 1 | 4 | 2 | no | 10 | yes | 1 | yes |
| 25 | 12A | 1208A | 1 | 4 | 1 | no | 9 | no | 2 | no |
| 26 | 12B | 1208B | 1 | 4 | 1 | no | 9 | no | 2 | no |
| 27 | 12C | 1208C | 1 | 4 | 2 | no | 9 | no | 2 | no |
| 28 | 13A | 1308A | 1 | 3 | 1 | no | 11 | yes | 1 | yes |
| 29 | 13B | 1308B | 1 | 4 | 1 | no | 11 | yes | 1 | yes |
| 30 | 13C | 1308C | 1 | 3 | 2 | no | 11 | yes | 1 | yes |
| 31 | 13D | 1308D | 1 | 4 | 2 | no | 11 | yes | 1 | yes |
| 32 | 13E | 1308E | 2 | 3 | 1 | no | 11 | yes | 1 | yes |
| 33 | 13F | 1308F | 2 | 4 | 1 | no | 11 | yes | 1 | yes |
| 34 | 13G | 1308G | 2 | 3 | 2 | yes | 11 | yes | 1 | yes |
| 35 | 13H | 1308H | 2 | 4 | 2 | yes | 11 | yes | 1 | yes |
| 36 | 13I | 1308I | 1 | 4 | 1 | no | 11 | yes | 1 | yes |
| 37 | 13J | 1308J | 1 | 5 | 1 | no | 11 | yes | 1 | yes |
| 38 | 13K | 1308K | 1 | 4 | 2 | no | 11 | yes | 1 | yes |
| 39 | 13L | 1308L | 1 | 5 | 2 | no | 11 | yes | 1 | yes |

Figure 14A:
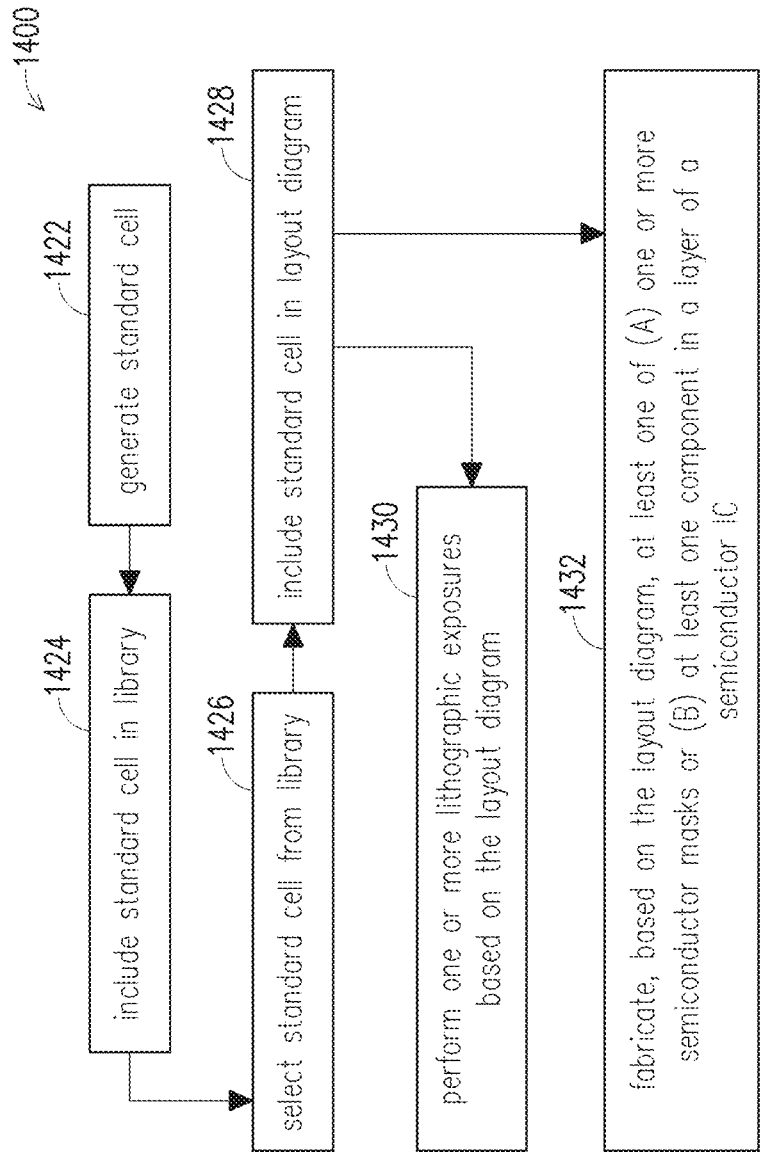
FIGS. 14A-14B are flowcharts of methods of generating a layout diagram, in accordance with some embodiments.

FIG. 14A is a flowchart of a method 1400 of generating a layout diagram of a standard cell, in accordance with some embodiments.

Method 1400 is implementable, for example, using EDA system 1500 (FIG. 15, discussed below), in accordance with some embodiments.

In FIG. 14A, method 1400 includes blocks 1422-1432. At block 1422, a standard cell is generated. Examples of such standard cells include the standard cells mentioned in the table appearing above.

From block 1422 of FIG. 14A, flow proceeds to block 1424. At block 1424, the standard cell is included in a library. An example of the library is library 1507 of FIG. 15, discussed below. From block 1424, flow proceeds to a block 1426. At block 1426, the standard cell is selected from the library. From block 1426, flow proceeds to block 1428. At block 1428, the standard cell is included in a layout diagram.

From block 1428 of FIG. 14A, flow proceeds to block 1430 and/or block 1432. At block 1430, based on the layout, one or more lithographic exposures are performed. See discussion of FIG. 10, below. At block 1432, based on the layout, at least one of (A) one or more semiconductor masks or (B) at least one component in a layer of a semiconductor integrated circuit is fabricated. See discussion of FIG. 10, below.

Figure 14B:
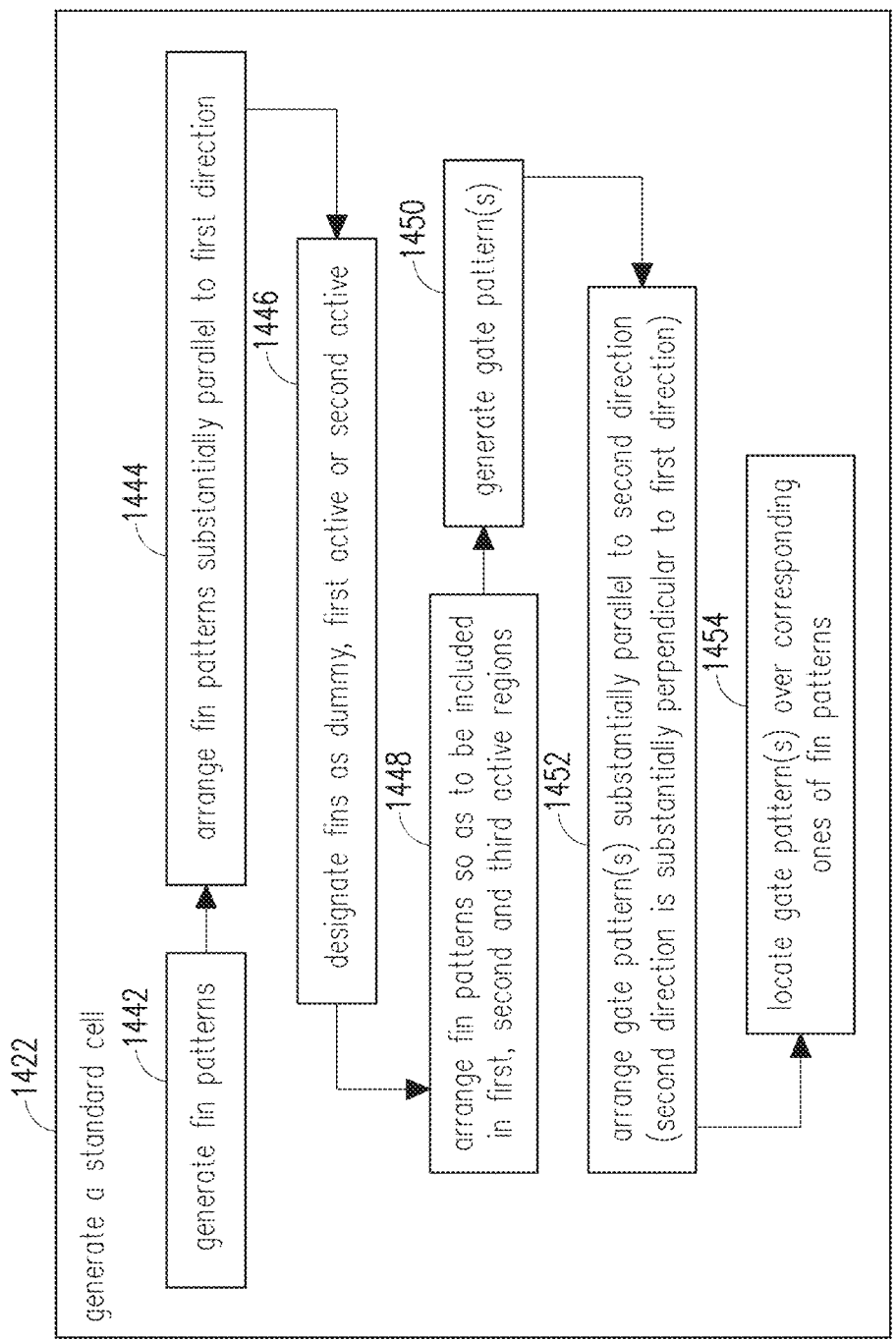

FIG. 14B is a flowchart of showing block 1422 of FIG. 14A in more detail, in accordance with some embodiments.

In FIG. 14B, block 1422 includes blocks 1442-1454. At block 1422, fin patterns are generated. Examples of fin patterns include fin patterns 212(D), 212(N) and 212(P) in FIG. 2A. From block 1422, flow proceeds to block 1424. At block 1424, the fin patterns substantially parallel to a first direction. In the example of FIG. 2A, fin patterns 212(D), 212(N) and 212(P) are parallel to the horizontal direction. From block 1444, flow proceeds to block 1446. At block 1446, the patterns are designated to include dummy fin patterns, first active fin patterns and second active fin patterns. In the example of FIG. 2A, there are dummy fin patterns 212(D), first active fin patterns 212(N), and second active fin patterns 212(P). From block 1446, flow proceeds to block 1448.

At block 1448, the fin patterns are arranged so as to be included in first, second and third active regions. In the example of FIG. 2A, there are first active region 250A(N), second active region 250A(P)(1) and third active region 250A(P)(2). From block 1448, flow proceeds to block 1450. At block 1450, one or more gate patterns are generated. In the example of FIG. 2A, there are gate patterns 216(A). From block 1450, flow proceeds to block 1452. At block 1452, the one or more gate patterns are arranged to be substantially parallel to the second direction. In the example of FIG. 2A, the second direction is vertical. From block 1452, flow proceeds to block 1454. At block 1454, the one or more gate patterns are located over corresponding ones of the fin patterns.

Figure 15:
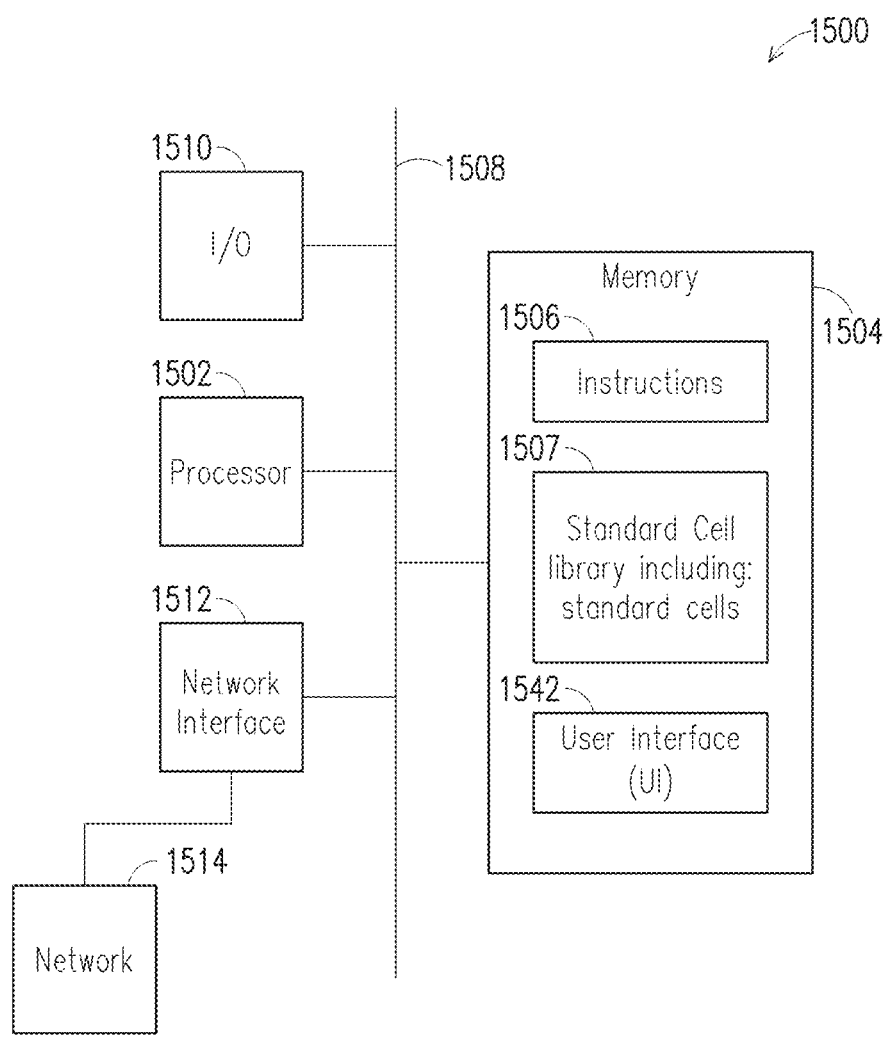
FIG. 15 is a block diagram of an electronic design automation (EDA) system in accordance with some embodiments.

FIG. 15 is a block diagram of an electronic design automation (EDA) system 1500 in accordance with some embodiments.

In some embodiments, EDA system 1500 includes an APR system. Methods described herein of generating layout diagrams, in accordance with one or more embodiments, are implementable, for example, using EDA system 1500, in accordance with some embodiments.

In some embodiments, EDA system 1500 is a general purpose computing device including a hardware processor 1502 and a non-transitory, computer-readable storage medium 1504. Storage medium 1504, amongst other things, is encoded with, i.e., stores, computer program code 1506, i.e., a set of executable instructions. Execution of instructions 1506 by hardware processor 1502 represents (at least in part) an EDA tool which implements a portion or all of, e.g., the methods described herein in accordance with one or more (hereinafter, the noted processes and/or methods).

Processor 1502 is electrically coupled to computer-readable storage medium 1504 via a bus 1508. Processor 1502 is also electrically coupled to an I/O interface 1510 by bus 1508. A network interface 1512 is also electrically connected to processor 1502 via bus 1508. Network interface 1512 is connected to a network 1514, so that processor 1502 and computer-readable storage medium 1504 are capable of connecting to external elements via network 1514. Processor 1502 is configured to execute computer program code 1506 encoded in computer-readable storage medium 1504 in order to cause system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, computer-readable storage medium 1504 is an electronic, magnetic, optical, electromagnetic, infrared, and/or a semiconductor system (or apparatus or device). For example, computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1504 includes a compact disk-read only memory (CD-ROM), a compact disk-read/write (CD-R/W), and/or a digital video disc (DVD).

In one or more embodiments, storage medium 1504 stores computer program code 1506 configured to cause system 1500 (where such execution represents (at least in part) the EDA tool) to be usable for performing a portion or all of the noted processes and/or methods. In one or more embodiments, storage medium 1504 also stores information which facilitates performing a portion or all of the noted processes and/or methods. In one or more embodiments, storage medium 1504 stores library 1507 of standard cells including such standard cells as disclosed herein.

EDA system 1500 includes I/O interface 1510. I/O interface 1510 is coupled to external circuitry. In one or more embodiments, I/O interface 1510 includes a keyboard, keypad, mouse, trackball, trackpad, touchscreen, and/or cursor direction keys for communicating information and commands to processor 1502.

EDA system 1500 also includes network interface 1512 coupled to processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1500.

System 1500 is configured to receive information through I/O interface 1510. The information received through I/O interface 1510 includes one or more of instructions, data, design rules, libraries of standard cells, and/or other parameters for processing by processor 1502. The information is transferred to processor 1502 via bus 1508. EDA system 1500 is configured to receive information related to a UI through I/O interface 1510. The information is stored in computer-readable medium 1504 as user interface (UI) 1542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1500. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 16:
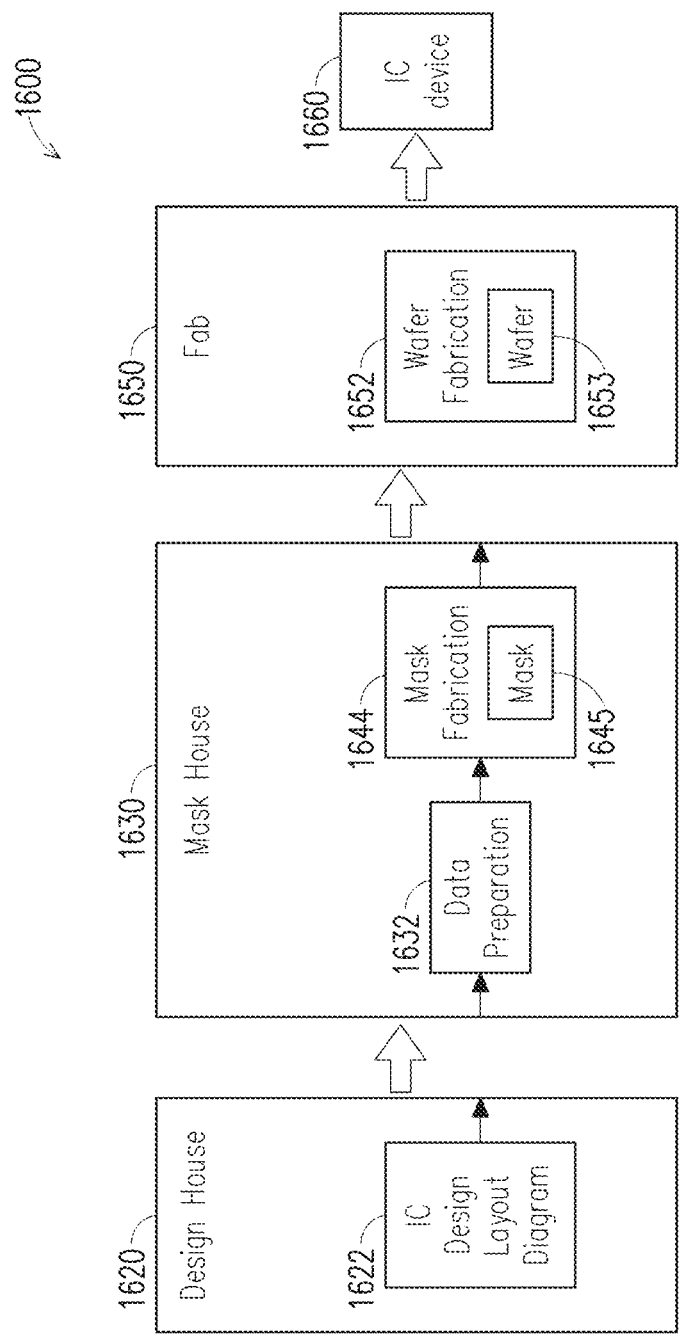
FIG. 16 is a block diagram of an integrated circuit (IC) manufacturing system, and an IC manufacturing flow associated therewith, in accordance with some embodiments.

FIG. 16 is a block diagram of an integrated circuit (IC) manufacturing system 1600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1600.

In FIG. 16, IC manufacturing system 1600 includes entities, such as a design house 1620, a mask house 1630, and an IC manufacturer/fabricator ("fab") 1650, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1620, mask house 1630, and IC fab 1650 is owned by a single larger company. In some embodiments, two or more of design house 1620, mask house 1630, and IC fab 1650 coexist in a common facility and use common resources.

Design house (or design team) 1620 generates an IC design layout diagram 1622. IC design layout diagram 1622 includes various geometrical patterns designed for an IC device 1660. The geometrical patterns correspond to patterns of metal, oxide, or semiconductor layers that make up the various components of IC device 1660 to be fabricated. The various layers combine to form various IC features. For example, a portion of IC design layout diagram 1622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1620 implements a proper design procedure to form IC design layout diagram 1622. The design procedure includes one or more of logic design, physical design or place and route. IC design layout diagram 1622 is presented in one or more data files having information of the geometrical patterns. For example, IC design layout diagram 1622 can be expressed in a GDSII file format or DFII file format.

Mask house 1630 includes data preparation 1632 and mask fabrication 1644. Mask house 1630 uses IC design layout diagram 1622 to manufacture one or more masks 1645 to be used for fabricating the various layers of IC device 1660 according to IC design layout diagram 1622. Mask house 1630 performs mask data preparation 1632, where IC design layout diagram 1622 is translated into a representative data file ("RDF"). Mask data preparation 1632 provides the RDF to mask fabrication 1644. Mask fabrication 1644 includes a mask writer. A mask writer converts the RDF to an image on a substrate, such as a mask (reticle) 1645 or a semiconductor wafer 1653. The design layout diagram 1622 is manipulated by mask data preparation 1632 to comply with particular characteristics of the mask writer and/or requirements of IC fab 1650. In FIG. 16, mask data preparation 1632 and mask fabrication 1644 are illustrated as separate elements. In some embodiments, mask data preparation 1632 and mask fabrication 1644 can be collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout diagram 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1632 includes a mask rule checker (MRC) that checks the IC design layout diagram 1622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1622 to compensate for limitations during mask fabrication 1644, which may undo part of the modifications performed by OPC in order to meet mask creation rules.

In some embodiments, mask data preparation 1632 includes lithography process checking (LPC) that simulates processing that will be implemented by IC fab 1650 to fabricate IC device 1660. LPC simulates this processing based on IC design layout diagram 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1622.

It should be understood that the above description of mask data preparation 1632 has been simplified for the purposes of clarity. In some embodiments, data preparation 1632 includes additional features such as a logic operation (LOP) to modify the IC design layout diagram 1622 according to manufacturing rules. Additionally, the processes applied to IC design layout diagram 1622 during data preparation 1632 may be executed in a variety of different orders.

After mask data preparation 1632 and during mask fabrication 1644, a mask 1645 or a group of masks 1645 are fabricated based on the modified IC design layout diagram 1622. In some embodiments, mask fabrication 1644 includes performing one or more lithographic exposures based on IC design layout diagram 1622. In some embodiments, an electron-beam (e-beam) or a mechanism of multiple e-beams is used to form a pattern on a mask (photomask or reticle) 1645 based on the modified IC design layout diagram 1622. Mask 1645 can be formed in various technologies. In some embodiments, mask 1645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1645 includes a transparent substrate (e.g., fused quartz) and an opaque material (e.g., chromium) coated in the opaque regions of the binary mask. In another example, mask 1645 is formed using a phase shift technology. In a phase shift mask (PSM) version of mask 1645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1644 is used in a variety of processes. For example, such a mask(s) is used in an ion implantation process to form various doped regions in semiconductor wafer 1653, in an etching process to form various etching regions in semiconductor wafer 1653, and/or in other suitable processes.

IC fab 1650 includes wafer fabrication 1652. IC fab 1650 is an IC fabrication business that includes one or more manufacturing facilities for the fabrication of a variety of different IC products. In some embodiments, IC fab 1650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1650 uses mask(s) 1645 fabricated by mask house 1630 to fabricate IC device 1660. Thus, IC fab 1650 at least indirectly uses IC design layout diagram 1622 to fabricate IC device 1660. In some embodiments, semiconductor wafer 1653 is fabricated by IC fab 1650 using mask(s) 1645 to form IC device 1660. In some embodiments, the IC fabrication includes performing one or more lithographic exposures based at least indirectly on IC design layout diagram 1622. Semiconductor wafer 1653 includes a silicon substrate or other proper substrate having material layers formed thereon. Semiconductor wafer 1653 further includes one or more of various doped regions, dielectric features, multi-level interconnects, and the like (formed at subsequent manufacturing steps).

Details regarding an integrated circuit (IC) manufacturing system (e.g., system 1600 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device includes: fins, extending substantially parallel to a first direction, configured to include: first active fins having a first conductivity type; and second active fins having a second conductivity type; and at least one gate structure formed over corresponding ones of the fins and extending substantially parallel to a second direction which is substantially perpendicular to the first direction; and wherein the fins and the at least one gate structure are located in at least one cell region; and each cell region, relative to the second direction, including: a first active region which includes a sequence of three or more consecutive first active fins located in a central portion of the cell region; a second active region which includes one or more second active fins located between the first active region and a first edge of the cell region; and a third active region which includes one or more second active fins located between the first active region and a second edge of the cell region.

In some embodiments, the fins include dummy fins; a first one of the dummy fins is located, relative to the second direction, between the second active region and a first edge of the cell region; and a second one of the dummy fins is located, relative to the second direction, between the third active region and a second edge of the cell region.

In some embodiments, the first edge of the cell region, relative to the first direction, is substantially collinear with a long axis of the first dummy fin; and the second edge of the cell region, relative to the first direction, is substantially collinear with a long axis of the second dummy fin.

In some embodiments, the cell region is a double height cell region.

In some embodiments, a sum of the second active fins in the second active region equals a sum of the second active fins in the third active region.

In some embodiments, a sum of the second active fins in the second active region is less than a sum of the second active fins in the third active region.

In some embodiments, the fins and the at least one gate structure are located in at least two cell regions; and each of the at least two cell regions includes: at least three gate structures, at least one of which is a dummy gate structures and at least one of which is an active gate structure; and a boundary, relative to the first direction, between first and second ones of the at least two cell regions is defined by a consecutive sequence of a first active gate structure, a first dummy gate structure, a second dummy gate structure and a second active gate structure.

In some embodiments, the fins and the at least one gate structure are located in at least two cell regions; and each of the at least two cell regions includes: at least three gate structures, at least one of which is a dummy gate structures and at least one of which is an active gate structure; and a boundary, relative to the first direction, between first and second ones of the at least two cell regions is defined by a consecutive sequence of a first active gate structure, a first dummy gate structure and a second active gate structure.

In some embodiments, a distance between immediately adjacent pairs of fins is a fin pitch, the fin pitch being substantially uniform; sizes, in the second direction, of the first active region, second active region and third active region are correspondingly based on the fin pitch; and sizes, in the second direction, of a first gap between the first active region and the second active region and a second gap between first active region and the third active region are correspondingly based on the fin pitch.

In some embodiments, a distance between immediately adjacent pairs of fins is a fin pitch, the fin pitch being substantially uniform; sizes, in the second direction, of the first active region, second active region and third active region are correspondingly based on the fin pitch; and sizes, in the second direction, of a first gap between the first active region and the second active region and a second gap between first active region and the third active region are not correspondingly based on the fin pitch.

In some embodiments, a semiconductor device includes: a first cell region including first, second and third active regions extending in a first direction, the first active region being in a central portion of the first cell region, the second active region being between the first active region and a first edge of the cell region, and the third active region being between the first active region and a second edge of the cell region; and gate structures formed over corresponding ones of the first, second and third active regions and extending substantially parallel to a second direction which is substantially perpendicular to the first direction, the gate structures being configured to include: dummy gate structures; and active gate structures; and a boundary, relative to the first direction, between the first cell region and a second cell region being defined by a consecutive sequence of a first active gate structure, a first dummy gate structure and a second active gate structure.

In some embodiments, the semiconductor device further includes fins extending substantially parallel to the first direction, and wherein: the fins are configured to include: dummy fins; first active fins having a first conductivity type; and second active fins having a second conductivity type; and the fins and the gate structures are located in corresponding ones of the cell regions; and the first active region includes a sequence of three or more consecutive first active fins located in a central portion of the cell region; the second active region includes one or more second active fins located between the first active region and a first edge of the cell region; and third active region includes one or more second active fins located between the first active region and a second edge of the cell region.

In some embodiments, a first one of the dummy fins is located, relative to the second direction, between the second active region and a first edge of the cell region; and a second one of the dummy fins is located, relative to the second direction, between the third active region and a second edge of the cell region.

In some embodiments, a distance between immediately adjacent pairs of fins is a fin pitch, the fin pitch being substantially uniform; sizes, in the second direction, of the first active region, second active region and third active region are correspondingly based on the fin pitch; and sizes, in the second direction, of a first gap between the first active region and the second active region and a second gap between first active region and the third active region are correspondingly based on the fin pitch.

In some embodiments, a distance between immediately adjacent pairs of fins is a fin pitch, the fin pitch being substantially uniform; sizes, in the second direction, of the first active region, second active region and third active region are correspondingly based on the fin pitch; and sizes, in the second direction, of a first gap between the first active region and the second active region and a second gap between first active region and the third active region are not correspondingly based on the fin pitch.

In some embodiments, the dummy gate structures are not configured for a particular conductivity.

In some embodiments, a semiconductor device includes: fins, extending substantially parallel to a first direction, configured to include: first active fins having a first conductivity type; and second active fins having a second conductivity type; and at least one gate structure formed over corresponding ones of the fins and extending substantially parallel to a second direction which is substantially perpendicular to the first direction; and wherein: the fins and the at least one gate structure are located in at least one cell region; and each cell region, relative to the second direction, including: a first active region which includes a sequence of three or more consecutive first active fins located in a central portion of the cell region; a second active region which includes one or more second active fins located between the first active region and a first edge of the cell region; and a third active region which includes one or more second active fins located between the first active region and a second edge of the cell region; and wherein: relative to the second direction, a first gap is between the second active region and a first edge of the cell region, the first gap being free of including a dummy fins therein; and relative to the second direction, between the third active region and a second edge of the cell region, the second gap being free of including a dummy fin therein.

In some embodiments, the first edge of the cell region, relative to the first direction, is substantially collinear with a long axis of the first dummy fin; and the second edge of the cell region, relative to the first direction, is substantially collinear with a long axis of the second dummy fin.

In some embodiments, the cell region is a double height cell region.

In some embodiments, a sum of the second active fins in the second active region equals a sum of the second active fins in the third active region.

In some embodiments, a sum of the second active fins in the second active region is less than a sum of the second active fins in the third active region.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
   fins, extending substantially parallel to a first direction, configured to include:
      first active fins having a first conductivity type; and
      second active fins having a second conductivity type; and
   at least one gate structure formed over corresponding ones of the fins and extending substantially parallel to a second direction which is substantially perpendicular to the first direction; and
   wherein:
      the fins and the at least one gate structure are located in at least one cell region; and
      each cell region, relative to the second direction, including:
         a first active region which includes a sequence of three or more consecutive first active fins located in a central portion of the cell region;
         a second active region which includes one or more second active fins located between the first active region and a first edge of the cell region; and
         a third active region which includes one or more second active fins located between the first active region and a second edge of the cell region.

2. The semiconductor device of claim 1, wherein:
   the fins include dummy fins;
   a first one of the dummy fins is located, relative to the second direction, between the second active region and the first edge of the cell region; and
   a second one of the dummy fins is located, relative to the second direction, between the third active region and the second edge of the cell region.

3. The semiconductor device of claim 2, wherein:
   the first edge of the cell region, relative to the first direction, is substantially collinear with a long axis of the first dummy fin; and
   the second edge of the cell region, relative to the first direction, is substantially collinear with a long axis of the second dummy fin.

4. The semiconductor device of claim 1, wherein:
   the cell region is a double height cell region.

5. The semiconductor device of claim 1, wherein:
   a sum of the second active fins in the second active region equals a sum of the second active fins in the third active region.

6. The semiconductor device of claim 1, wherein:
   a sum of the second active fins in the second active region is less than a sum of the second active fins in the third active region.

7. The semiconductor device of claim 1, wherein:
   the fins and the at least one gate structure are located in at least two cell regions; and
   each of the at least two cell regions includes:
      at least three gate structures, at least one of which is a dummy gate structures and at least one of which is an active gate structure; and
      a boundary, relative to the first direction, between first and second ones of the at least two cell regions is defined by a consecutive sequence of a first active gate structure, a first dummy gate structure, a second dummy gate structure and a second active gate structure.

8. The semiconductor device of claim 1, wherein:
the fins and the at least one gate structure are located in at least two cell regions; and
each of the at least two cell regions includes:
at least three gate structures, at least one of which is a dummy gate structures and at least one of which is an active gate structure; and
a boundary, relative to the first direction, between first and second ones of the at least two cell regions is defined by a consecutive sequence of a first active gate structure, a first dummy gate structure and a second active gate structure.

9. The semiconductor device of claim 1, wherein:
a distance between immediately adjacent pairs of fins is a fin pitch, the fin pitch being substantially uniform;
sizes, in the second direction, of the first active region, the second active region and the third active region are correspondingly based on the fin pitch; and
sizes, in the second direction, of a first gap between the first active region and the second active region and a second gap between the first active region and the third active region are correspondingly based on the fin pitch.

10. The semiconductor device of claim 1, wherein:
a distance between immediately adjacent pairs of fins is a fin pitch, the fin pitch being substantially uniform;
sizes, in the second direction, of the first active region, the second active region and the third active region are correspondingly based on the fin pitch; and
sizes, in the second direction, of a first gap between the first active region and the second active region and a second gap between the first active region and the third active region are not correspondingly based on the fin pitch.

11. A semiconductor device comprising:
a first cell region including first, second and third active regions extending in a first direction and spaced apart from each other in a second direction which is substantially perpendicular to the first direction, wherein:
relative to the second direction,
the first active region is in a central portion of the first cell region,
the second active region is between the first active region and a first edge of the first cell region,
the third active region is between the first active region and a second edge of the first cell region, and
the first edge and the second edge extend in the first direction; and
gate structures formed over corresponding ones of the first, second and third active regions and extending substantially parallel to the second direction, the gate structures being configured to include:
dummy gate structures; and
active gate structures; and
a boundary, relative to the first direction, between the first cell region and a second cell region being defined by a consecutive sequence of a first active gate structure, a first dummy gate structure and a second active gate structure, which are spaced apart from each other in the first direction.

12. The semiconductor device comprising of claim 11, further comprising:
fins extending substantially parallel to the first direction; and wherein:
the fins are configured to include:
dummy fins;
first active fins having a first conductivity type; and
second active fins having a second conductivity type; and
the fins and the gate structures are located in the first cell region; and
the first active region includes a sequence of three or more consecutive first active fins located in the central portion of the first cell region;
the second active region includes one or more second active fins located between the first active region and the first edge of the first cell region; and
the third active region includes one or more second active fins located between the first active region and the second edge of the first cell region.

13. The semiconductor device of claim 12, wherein:
a first one of the dummy fins is located, relative to the second direction, between the second active region and the first edge of the first cell region; and
a second one of the dummy fins is located, relative to the second direction, between the third active region and the second edge of the first cell region.

14. The semiconductor device of claim 11, wherein:
sizes, in the second direction, of the first active region, the second active region and the third active region are correspondingly based on a fin pitch.

15. The semiconductor device of claim 14, wherein:
the fin pitch is a distance between immediately adjacent pairs of fins is a fin pitch, the fin pitch being substantially uniform; and
one of the following is satisfied:
sizes, in the second direction, of a first gap between the first active region and the second active region and a second gap between the first active region and the third active region are correspondingly based on the fin pitch, or
sizes, in the second direction, of a first gap between the first active region and the second active region and a second gap between the first active region and the third active region are not correspondingly based on the fin pitch.

16. A semiconductor device comprising:
fins, extending substantially parallel to a first direction, configured to include:
first active fins having a first conductivity type; and
second active fins having a second conductivity type; and
at least one gate structure formed over corresponding ones of the fins and extending substantially parallel to a second direction which is substantially perpendicular to the first direction; and
wherein:
the fins and the at least one gate structure are located in at least one cell region; and
each cell region, relative to the second direction, including:
a first active region which includes a sequence of three or more consecutive first active fins located in a central portion of the cell region;
a second active region which includes one or more second active fins located between the first active region and a first edge of the cell region; and
a third active region which includes one or more second active fins located between the first active region and a second edge of the cell region; and wherein:
- relative to the second direction, a first gap is between the second active region and the first edge of the cell region, the first gap being free of including a dummy fin therein; and
- relative to the second direction, a second gap is between the third active region and the second edge of the cell region, the second gap being free of including a dummy fin therein.

17. The semiconductor device of claim 16, wherein:
the first edge of the cell region, relative to the first direction, is substantially collinear with a long axis of a first dummy fin; and
the second edge of the cell region, relative to the first direction, is substantially collinear with a long axis of a second dummy fin.

18. The semiconductor device of claim 16, wherein:
the cell region is a double height cell region.

19. The semiconductor device of claim 16, wherein:
a sum of the second active fins in the second active region equals a sum of the second active fins in the third active region.

20. The semiconductor device of claim 16, wherein:
a sum of the second active fins in the second active region is less than a sum of the second active fins in the third active region.

* * * * *